(12) United States Patent
Wang

(10) Patent No.: US 8,405,188 B2
(45) Date of Patent: Mar. 26, 2013

(54) SEMICONDUCTOR DEVICE AND METHOD OF MANUFACTURING THE SEMICONDUCTOR DEVICE

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 78 days.

(21) Appl. No.: 12/548,911

(22) Filed: Aug. 27, 2009

(65) Prior Publication Data

US 2009/0315144 A1    Dec. 24, 2009

Related U.S. Application Data

(63) Continuation of application No. PCT/JP2008/051090, filed on Jan. 25, 2008.

(51) Int. Cl.
*H01L 29/92* (2006.01)
*H01L 21/02* (2006.01)

(52) U.S. Cl. ......... 257/532; 257/E21.011; 257/E21.272; 257/E29.343; 438/3; 438/396

(58) Field of Classification Search .................. None
See application file for complete search history.

(56) References Cited

U.S. PATENT DOCUMENTS

| | | | |
|---|---|---|---|
| 6,146,906 A | 11/2000 | Inoue et al. | |
| 6,531,726 B1 | 3/2003 | Takamatsu | |
| 6,624,458 B2 * | 9/2003 | Takamatsu et al. | 257/295 |
| 6,713,808 B2 * | 3/2004 | Wang et al. | 257/310 |
| 6,740,533 B2 * | 5/2004 | Takamatsu et al. | 438/3 |
| 6,887,716 B2 | 5/2005 | Fox et al. | |
| 7,078,242 B2 | 7/2006 | Matsuura et al. | |
| 7,259,416 B2 | 8/2007 | Muira | |
| 7,407,818 B2 | 8/2008 | Hara et al. | |
| 7,465,657 B2 | 12/2008 | Muira | |
| 7,928,479 B2 | 4/2011 | Wang | |
| 2002/0074601 A1* | 6/2002 | Fox et al. | 257/350 |
| 2002/0185668 A1* | 12/2002 | Takamatsu et al. | 257/295 |
| 2003/0089938 A1 | 5/2003 | Saigoh et al. | |
| 2003/0213986 A1* | 11/2003 | Takamatsu et al. | 257/295 |
| 2005/0136556 A1 | 6/2005 | Matsuura et al. | |
| 2006/0043445 A1* | 3/2006 | Wang | 257/295 |
| 2006/0175642 A1* | 8/2006 | Dote et al. | 257/295 |

(Continued)

FOREIGN PATENT DOCUMENTS

| | | |
|---|---|---|
| JP | 10-242078 A | 9/1998 |
| JP | 2000-058525 A | 2/2000 |

(Continued)

OTHER PUBLICATIONS

C.K. Huang, On the Suppression of hydrogen degradation in PbZr0.4Ti0.6O3 ferroelectric capacitors with PtOx top electrode, J. of Applied Physics, 98 104105 (2005).*

(Continued)

*Primary Examiner* — Thomas L Dickey
*Assistant Examiner* — Joseph Schoenholtz
(74) *Attorney, Agent, or Firm* — Westerman, Hattori, Daniels & Adrian, LLP

(57) ABSTRACT

An upper electrode of a ferroelectric capacitor has a first layer formed of a first oxide expressed by a chemical formula $AO_{x1}$ (A: metal, O: oxygen) using a stoichiometric composition parameter x1, and expressed by a chemical formula $AO_{x2}$ using a actual composition parameter x2, and a second layer formed of a second oxide, formed on the first layer, expressed by a chemical formula $BO_{y1}$ (B: metal) using a stoichiometric composition parameter y1 and expressed by a chemical formula $BO_{y2}$ using a actual composition parameter y2, which includes at least one of stone-wall crystal and column crystal.

5 Claims, 37 Drawing Sheets

U.S. PATENT DOCUMENTS

| | | | |
|---|---|---|---|
| 2006/0183250 A1* | 8/2006 | Choi et al. | 438/3 |
| 2006/0199392 A1 | 9/2006 | Hara et al. | |
| 2008/0111173 A1 | 5/2008 | Wang | |
| 2011/0165702 A1 | 7/2011 | Wang | |

FOREIGN PATENT DOCUMENTS

| | | | |
|---|---|---|---|
| JP | 2000-91270 A | 3/2000 | |
| JP | 2001-127262 A | 5/2001 | |
| JP | 2002-110934 A | 4/2002 | |
| JP | 2002-203948 A | 7/2002 | |
| JP | 3299909 B2 | 7/2002 | |
| JP | 2002-246564 A | 8/2002 | |
| JP | 2002-289793 A | 10/2002 | |
| JP | 2002-324894 A | 11/2002 | |
| JP | 2003-197874 A | 7/2003 | |
| JP | 2003-204043 A | 7/2003 | |
| JP | 2003-347517 A | 12/2003 | |
| JP | 2004-273787 A | 9/2004 | |
| JP | 2004-296929 A | 10/2004 | |
| JP | 3661850 B2 | 6/2005 | |
| JP | 2005-183842 A | 7/2005 | |
| JP | 2006-073648 A | 3/2006 | |
| JP | 2006-128274 A | 5/2006 | |
| JP | 2006-222227 A | 8/2006 | |
| JP | 2006-245457 A | 9/2006 | |
| WO | 2006/134663 A1 | 12/2006 | |

OTHER PUBLICATIONS

Wessling, Borge; Besmehn, Astrid; Mokwa, Wilfried; and Schnakenberg, Uwe; "Reactively Sputtered Iridium Oxide" J. Electrochem. Soc. 154, F83 (2007).*

Naoya and Yoshihiro Hayashi, Smart Fabrication Process of an Ir-IrOx Top-Electrode on a PZT Film for Reliable FeRAM, J. Electrochem. Soc. 151, G113 (2004).*

Wessling, Börge. Sputter Deposition of Iridium and Iridium Oxide. Diss. Fakultät Für Elektrotechnik Und Informationstechnik, 2007.*

J. D. Klein, S. L. Clauson and S. F. Cogan (1989). The influence of substrate bias on the morphology and charge capacity of rf-sputtered iridium oxide films. Journal of Materials Research, 4 , pp. 1505-1510.*

International Search Report of PCT/JP2008/051090, mailing date of Mar. 25, 2008.

International Search Report of PCT/JP2007/055694, Mailing Date of Jun. 19, 2007.

US Office Action dated May 12, 2011, issued in related U.S. Appl. No. 12/547,126.

Japanese Office Action dated Jun. 12, 2012 (mailing date), issued in corresponding Japanese Patent Application No. 2009-501154.

* cited by examiner

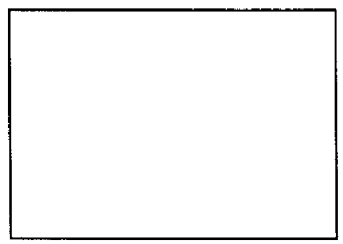
FIG. 8(a)    50 °C
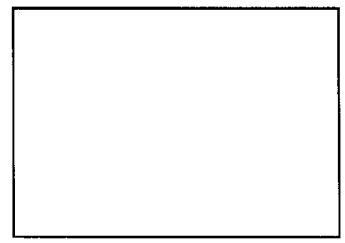
FIG. 8(b)    75 °C
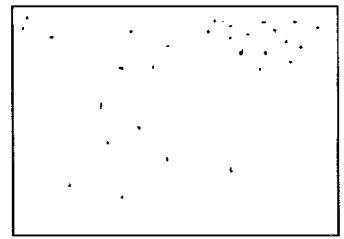
FIG. 8(c)    100 °C
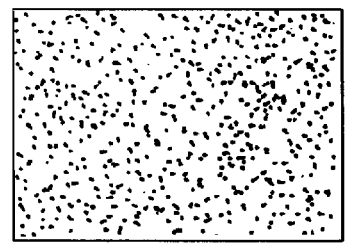
FIG. 8(d)    150 °C
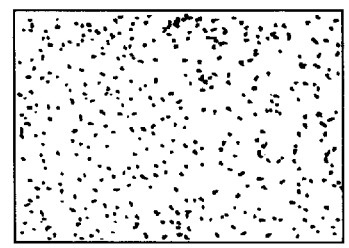
FIG. 8(e)    200 °C
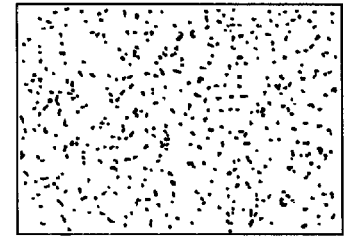
FIG. 8(f)    250 °C

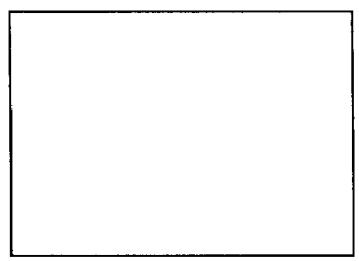
FIG. 9(a)     50°C
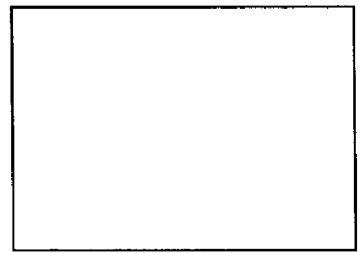
FIG. 9(b)     75°C
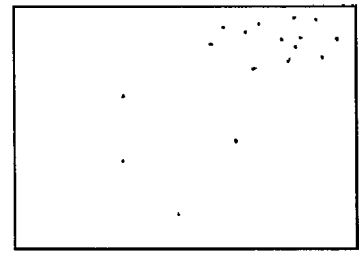
FIG. 9(c)     100°C
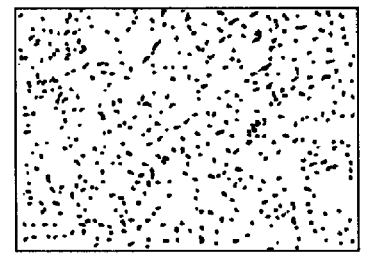
FIG. 9(d)     150°C
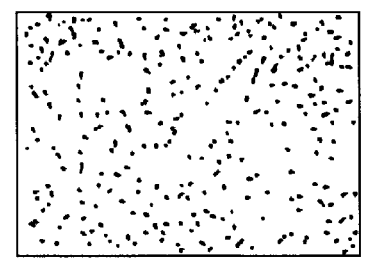
FIG. 9(e)     200°C
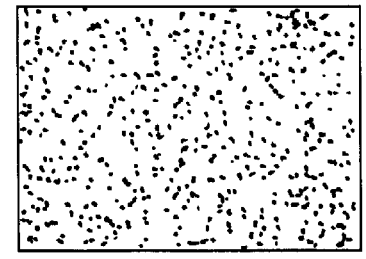
FIG. 9(f)     250°C

50 °C

75 °C

100 °C

150 °C

200 °C

250 °C

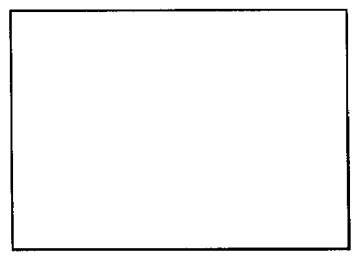
FIG. 11(a)        50 °C
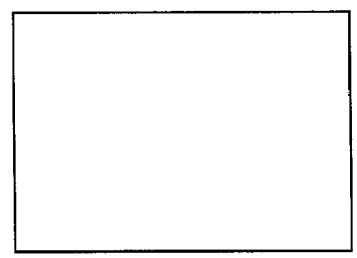
FIG. 11(b)        75 °C
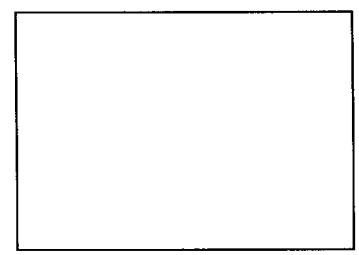
FIG. 11(c)        100 °C
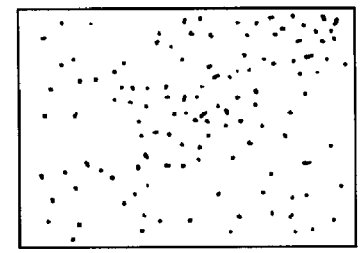
FIG. 11(d)        150 °C
FIG. 11(e)        200 °C
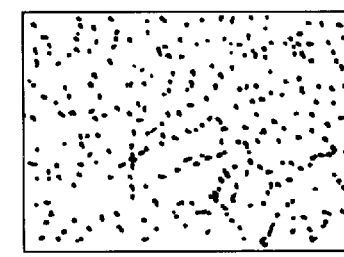
FIG. 11(f)        250 °C

GT: GROWTH TEMPERATURE (W/O ES)

GT: GROWTH TEMPERATURE

FIG. 36A

| | | | | | | | |
|---|---|---|---|---|---|---|---|
| | | 20.5 | 20.6 | 17.3 | 23.7 | | |
| | 16.6 | 25.3 | 17.1 | 18.2 | 20.3 | 17.0 | |
| | 19.8 | 21.3 | 13.5 | 13.4 | 15.0 | 19.0 | 11.8 |
| 23.3 | 25.0 | 16.9 | 8.3 | 11.2 | 6.8 | 13.9 | 19.7 |
| 14.8 | 19.5 | 14.0 | 12.0 | 13.5 | 9.7 | 14.1 | 10.3 |
| | 20.1 | 16.4 | 15.2 | 20.2 | 15.1 | 19.8 | |
| | 13.8 | 15.1 | 23.9 | 14.9 | 11.3 | 17.1 | |
| | | 12.9 | 15.3 | 19.9 | 16.6 | | |

EACH NUMBER: SWITCHING CHARGE AT SINGLE BIT
Qsw0 ($\mu C/cm^2$)

FIG. 36B

| | | | | | | | |
|---|---|---|---|---|---|---|---|
| | | | 29.5 | 29.3 | 35.1 | | |
| | | 31.1 | 30.9 | 22.0 | 25.6 | 27.7 | 24.4 |
| | 34.8 | 28.0 | 16.8 | 11.0 | 15.7 | 24.1 | 25.8 |
| 37.2 | 29.9 | 15.3 | 13.9 | 14.9 | 16.0 | 18.4 | 17.7 |
| 29.0 | 27.9 | 27.8 | 22.1 | 20.1 | 19.2 | 16.0 | 26.5 |
| 31.2 | 30.0 | 28.3 | 27.5 | 28.9 | 17.9 | 21.2 | 25.1 |
| 29.8 | 22.9 | 21.1 | 24.2 | 20.3 | 15.9 | 13.4 | |
| | 26.9 | 25.4 | 20.5 | 23.3 | 25.4 | 25.3 | |
| | | | 25.8 | 20.5 | 21.2 | | |

EACH NUMBER: SWITCHING CHARGE AT SINGLE BIT
Qsw0 ($\mu C/cm^2$)

FIG. 36C

|       |      |      |      |      |      |      |      |
|-------|------|------|------|------|------|------|------|
|       |      | 35.7 | 38.5 | 36.3 |      |      |      |
|       | 38.9 | 42.6 | 39.7 | 34.7 | 45.9 | 42.5 |      |
| 35.9  | 48.0 | 36.9 | 35.3 | 37.7 | 37.7 | 42.3 |      |
| 39.5  | 38.4 | 31.7 | 35.7 | 26.2 | 35.7 | 40.4 | 47.1 |
| 47.2  | 28.6 | 36.3 | 38.9 | 33.8 | 32.1 | 38.7 | 43.4 |
| 43.7  | 34.2 | 41.9 | 41.9 | 36.8 | 34.0 | 45.6 | 36.6 |
| 42.3  | 32.0 | 38.2 | 38.3 | 33.4 | 37.7 | 45.6 |      |
|       | 40.9 | 38.9 | 29.4 | 23.3 | 41.5 | 44.0 |      |
|       |      | 37.5 | 38.1 | 40.2 |      |      |      |

EACH NUMBER: SWITCHING CHARGE AT SINGLE BIT
Qsw0 ($\mu C/cm^2$)

FIG. 36D

|       |      |      |      |      |      |      |      |
|-------|------|------|------|------|------|------|------|
|       |      | 44.9 | 39.6 | 37.2 |      |      |      |
|       | 41.9 | 37.9 | 40.4 | 40.1 | 37.9 | 36.3 |      |
| 42.9  | 41.5 | 38.1 | 30.5 | 33.4 | 40.0 | 35.1 |      |
| 44.4  | 37.6 | 39.0 | 37.3 | 34.7 | 34.8 | 35.8 | 37.4 |
| 44.4  | 40.5 | 35.1 | 37.5 | 35.1 | 37.0 | 34.8 | 38.2 |
| 39.6  | 39.9 | 38.9 | 32.7 | 33.2 | 31.4 | 36.2 | 39.4 |
| 44.5  | 38.5 | 35.8 | 34.8 | 28.4 | 36.0 | 36.9 |      |
|       | 39.2 | 37.2 | 33.1 | 36.4 | 41.0 | 41.8 |      |
|       |      | 37.9 | 35.6 | 39.9 |      |      |      |

EACH NUMBER: SWITCHING CHARGE AT SINGLE BIT
Qsw0 ($\mu C/cm^2$)

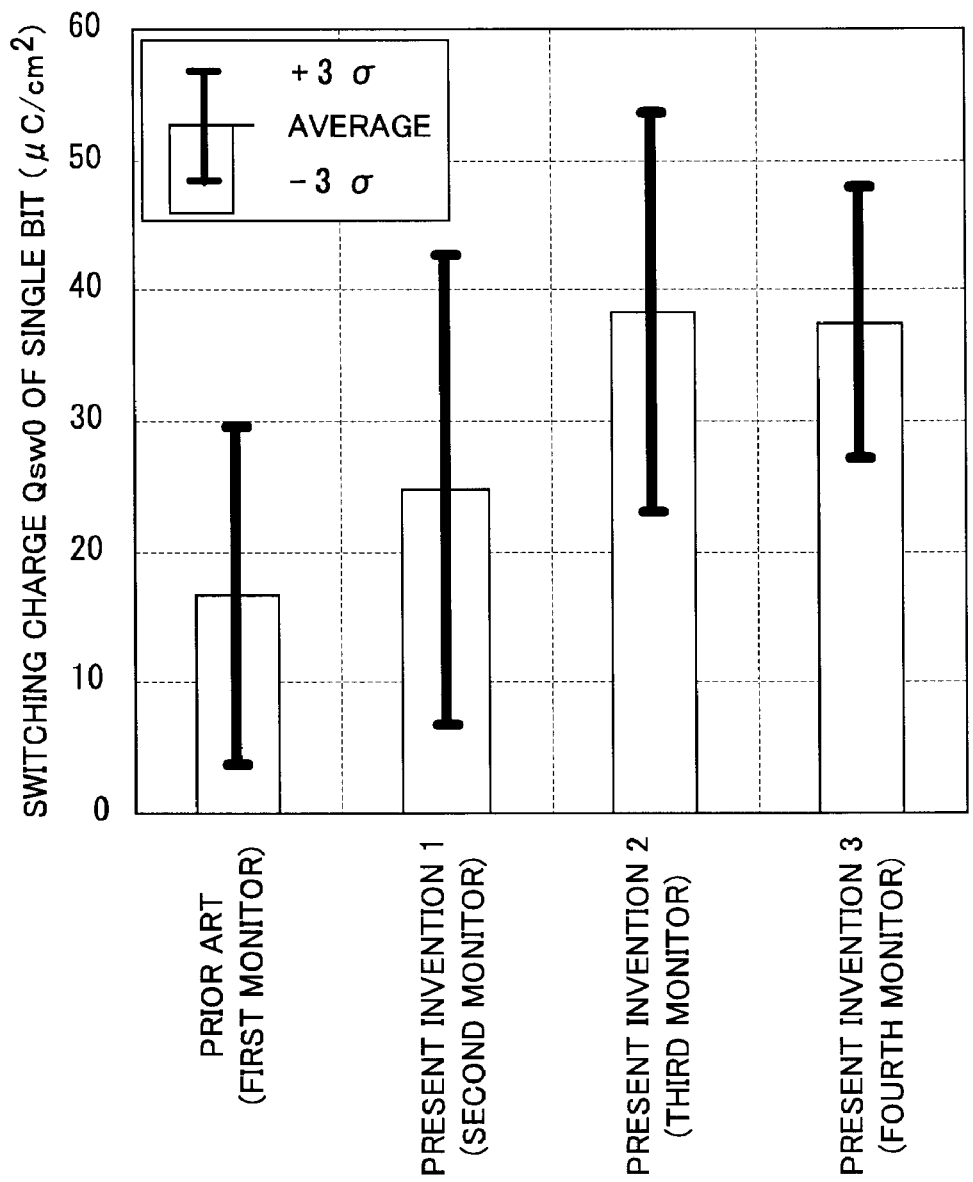

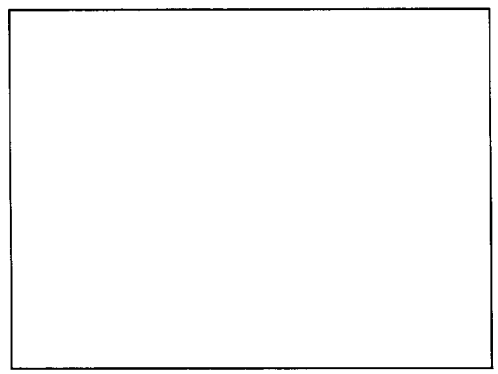
FIG. 38(a)    125nm
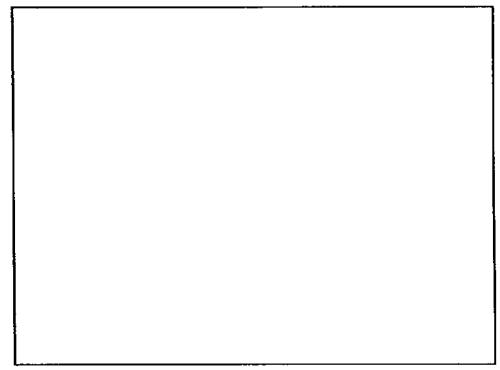
FIG. 38(b)    150nm
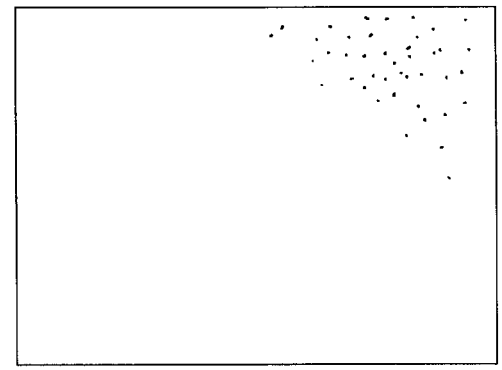
FIG. 38(c)    160nm
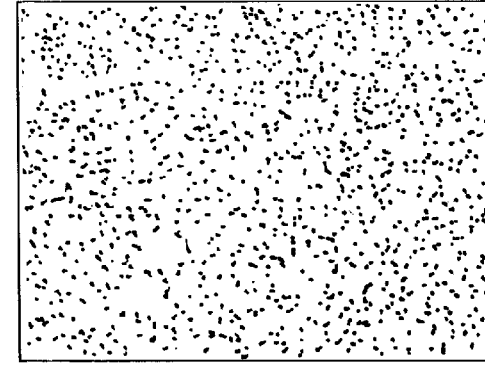
FIG. 38(d)    210nm

SEMICONDUCTOR DEVICE AND METHOD OF MANUFACTURING THE SEMICONDUCTOR DEVICE

CROSS-REFERENCE TO RELATED APPLICATIONS

This application is a continuation application of international application PCT/JP2008/051090, filed Jan. 25, 2008, and is based upon and claims the benefit of international Application PCT/JP2007/053836, filed Feb. 28, 2007, the entire content of which is incorporated herein by reference.

FIELD

A certain aspect of the embodiments discussed herein is related generally to a semiconductor device and a method of manufacturing the semiconductor device.

BACKGROUND

In recent years, there are growing trends of high-speed processing and save of a large data with the rise of the digital technology. Consequently, a higher integration density and a higher performance are demanded in the semiconductor device equipped in the electronic equipment.

As to a semiconductor memory device, for example, in order to realize a higher integration density of DRAM (Dynamic Random Access Memory), the technology to employ a ferroelectric material or high-dielectric material as a capacitor insulating film of a capacitor element constituting DRAM, instead of the conventional silicon oxide or silicon nitride, is widely researched and developed.

Also, in order to realize a nonvolatile RAM that can execute a writing operation and a reading operation quickly at a lower voltage, the technology to employ a ferroelectric film having the spontaneous polarization characteristic as a capacitor insulating film is eagerly researched and developed. The semiconductor memory device having such ferroelectric capacitor insulating film is called a ferroelectric memory (FeRAM).

The ferroelectric capacitor stores the information by utilizing the hysteresis characteristic of the ferroelectric substance. The ferroelectric capacitor is provided to the ferroelectric memory, and the ferroelectric capacitor is constructed by putting the ferroelectric film between a pair of electrodes as the capacitor ferroelectric film. The ferroelectric film produces a polarization in response to an applied voltage between the electrodes, and keeps a spontaneous polarization even after the applied voltage is removed. Also, the polarity of the spontaneous polarization is inverted when the polarity of the applied voltage is inverted. Accordingly, information can be read by sensing this spontaneous polarization. The ferroelectric memory operates at a low voltage rather than a flash memory, and can execute a speedup writing while achieving a power saving.

The ferroelectric film constituting the capacitor of FeRAM is formed of lead zirconate titanate (PZT), PLZT formed by doping La in PZT, PLZT-based material in which Ca, Sr, or Si is micro-doped, a Bi-layer structure compound such as $SrBi_2Ta_2O_9$(SBT,YI), $SrBi_2(Ta,Nb)_2O_9$(SBTN,YZ), or the like. Such ferroelectric film is formed by the sol-gel method, the sputter method, the MOCVD (Metal Organic Chemical Vapor Deposition) method, or the like.

Normally, an amorphous or microcrystalline ferroelectric film is formed on the lower electrode by the above film forming method, and then the crystal structure is changed into the perovskite structure or the bismuth layer structure by the subsequent heat treatment.

As the electrode material of the capacitor, the material that is hard to oxidize or the material that can maintain conductivity even after oxidized must be employed. Commonly, either a platinum based metal such as Pt (platinum), Ir (iridium), $IrO_x$ (iridium oxide), or the like or its oxide is widely employed. Also, it is common that, as the interconnection material, Al (aluminum) is employed like the normal semiconductor device.

Like other semiconductor devices, a higher integration density and a higher performance are also required of FeRAM. In the future, a reduction of a cell area is needed. It has already been known that it is effective that the stacked structure should be employed in place of the conventional planar structure in reducing the cell area.

Here, the "stacked structure" denotes such a structure that a capacitor is formed directly over a plug (contact plug) formed on a drain of a transistor constituting a memory cell.

In the FeRAM having the stacked structure in the prior art, the capacitor has a stacked structure, in which a barrier metal, a lower electrode, a ferroelectric film, and an upper electrode are stacked in this order, directly over the plug formed of W (tungsten).

The barrier metal has a role to prevent oxidation of the W plug, and the material that fulfills both a function of the barrier metal and a function of the lower electrode is often employed. Therefore, it is impossible to separate clearly the barrier metal and the lower electrode material. Normally, the barrier metal and the lower electrode are formed by a combination of two films or more that are selected from titanium nitride (TiN) film, titanium aluminum nitride (TiAlN) film, iridium (Ir) film, iridium oxide ($IrO_2$) film, platinum (Pt) film, and strontium ruthenium oxygen (SRO: $SrRuO_3$) film.

The ferroelectric film constituting the ferroelectric capacitor is formed of an oxide. An oxygen defect is easily caused by the process in a nonoxidative atmosphere, and accordingly the characteristics of the ferroelectric film such as a quantity of inverted charges, a leakage current value, etc. are deteriorated. In order to recover the damage caused in the ferroelectric film, the heat treatment in an oxygen atmosphere must be applied plural times in manufacturing the ferroelectric capacitor. Therefore, a metal that is hard to oxidize in an oxygen atmosphere such as platinum, or the like, or a conductive oxide such as iridium oxide, ruthenium oxide, or the like is employed as the material of the upper electrode.

Meanwhile, the severe requests for miniaturization are imposed on the FeRAM recently, and accordingly miniaturization of the ferroelectric capacitor and employment of the multilayer interconnection structure are requested. Also, a lower voltage operation is requested in connection with the application to a mobile information processing device.

In order to make it possible for the FeRAM to operate at a low voltage, such a condition is requested that the ferroelectric film constituting the ferroelectric capacitor should have a large amount of inverted charges $Q_{SW}$. However, in step of forming the multilayer interconnection structure over the ferroelectric capacitor, the characteristics of the ferroelectric capacitor are deteriorated by the process applied in a reducing atmosphere or the process applied in a nonoxidative atmosphere.

More concretely explaining, when the upper electrode ob the ferroelectric capacitor is formed of the Pt film, the Ir film, or the like, a hydrogen in the reducing atmosphere used in forming the multilayer interconnection structure thereon enters into the Pt film, the Ir film, or the like, and then is activated by a catalytic action of the metal. Thus, such a problem arises that the oxide ferroelectric film in the ferroelectric capacitor is reduced by the activated hydrogen.

When the ferroelectric film is reduced, the operation characteristics of the ferroelectric capacitor are largely degraded. Such problem of the characteristic degradation of the ferroelectric film arises particularly conspicuously as the ferroelectric capacitor is miniaturized much more and thus the capacitor insulating film is miniaturized much more.

In JP 2004-273787-A, in order to solve a reduction of a crystallinity caused due to an oxygen defect in the crystal and an excessive oxygen during a crystal growth simultaneously, such a method is set forth that an oxidizing gas of 40 vol % to 97 vol % should be employed in forming the $IrO_2$ lower electrode.

In Japanese Patent No. 3661850, it is set forth that the upper electrode formed on the ferroelectric film should be constructed by a first conductive oxide film and a second conductive oxide film, and also the second conductive oxide film should be formed to have a composition that is closer to a stoichiometric composition than the first conductive oxide film, so that the ferroelectric capacitor can be miniaturized not to cause the degradation of the electric characteristics in the multilayer interconnection constructing steps.

In JP 2006-128274-A, it is proposed that three layers of the upper electrode of the ferroelectric capacitor should be formed of platinum, iridium oxide, and iridium.

In JP 2000-91270-A, such a method is disclosed that the lower electrode or the upper electrode should be formed successively of the Ir film and the $IrO_2$ film. Also, such a method is disclosed that, in order to reduce the voids in the ferroelectric film, RTA (Rapid Thermal Annealing) should be applied after the $IrO_2$ film is formed and then the Ir film should be formed.

In Japanese Patent No. 3299909, such an electrode constructed by the stacked structure is set forth that the $IrO_2$ film of 36 nm to 83 nm thick is used as the upper layer and the Ir film of 22 nm to 66 nm thick is used as the lower layer.

In JP 2001-127262-A, such a two-step sputter method is disclosed that the $IrO_2$ film is formed at a low power and then the $IrO_2$ film is formed at a high power.

In JP 2002-246564-A, JP 2005-183842-A, etc., steps of (i) forming the film of the conductive lower electrode made of a noble metal, (ii) covering the lower electrode with the ferroelectric material layer, (iii) applying Rapid Thermal Annealing (RTA) to the ferroelectric layer for the first time, (iv) forming the film of the upper electrode layer made of a noble metal oxide, and then (v) applying the annealing to the ferroelectric layer and the upper electrode layer for the second time are set forth. It is set forth that a larger quantity of switching charges can be obtained according to such steps and also the good fatigue characteristic can be obtained preferably.

In JP 2005-183842-A, such a method is also disclosed that RTA is applied to the conductive oxide film formed on the ferroelectric film and then the furnace annealing is applied in the oxygen atmosphere.

In JP 2006-73648-A, upon forming the upper electrode film on the ferroelectric film, steps of forming the $IrO_x$ film containing the crystallized microcrystals and then forming the $IrO_x$ film containing the columnar crystals are disclosed. Accordingly, it is set forth that, even when the ferroelectric film is formed as a thin film, the characteristic of the ferroelectric film can be extracted sufficiently.

In JP 2003-204043-A, such a method is proposed that the ferroelectric film is formed, and then the $Ir_x$ film of 150 to 250 nm thick is formed thereon as the second conductive film by the sputtering method.

In JP 2006-245457-A, it is proposed that formation of the conductive film on the side wall of the capacitor in etching the stacked film is prevented by setting a film thickness of the stacked film of Ir and $IrO_2$ constituting the capacitor lower electrode below 100 nm, and thus a leakage current between the capacitor upper electrode and the capacitor lower electrode is reduced.

SUMMARY

According to an aspect of the embodiment, an upper electrode of a ferroelectric capacitor has a first layer formed of a first oxide whose composition is expressed by a chemical formula $AO_{x1}$ (A: metal element, O: oxygen) using a stoichiometric composition parameter x1 and whose composition is expressed by a chemical formula $AO_{x2}$ using an actual composition parameter x2, a second layer formed of a second oxide which is formed on the first layer, whose composition is expressed by a chemical formula $BO_{y1}$ (B: metal element, O: oxygen) using a stoichiometric composition parameter y1, whose composition is expressed by a chemical formula $BO_{y2}$ using an actual composition parameter y2. The upper electrode may has a third layer which is formed on the second layer and which is formed of a noble metal film or an alloy containing the noble metal or their oxide. Also, the second layer is formed of a large number of microcrystal grains that exist like stone walls or columns, a degree of oxidation of the second layer is set higher than the first layer, and a relation y2/y1>x2/x1 is satisfied between the composition parameters x1, x2, y1, y2. A thickness of the first layer is thinner than a thickness of the second layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 8(a) to 8(f) are surface views, illustrated on the basis of photographs of metallograph, of $IrO_y$ films formed on each center of wafers before RTA, each of the films is formed on different film forming conditions, according to the embodiment of the present invention;

FIGS. 9(a) to 9(f) are further surface views, illustrated on the basis of photographs of metallograph, of IrO$_y$ films formed on each right region of wafers before RTA, each of the films is formed on different film forming conditions, according to the embodiment of the present invention;

FIGS. 11(a) to 11(f) are further surface views, illustrated on the basis of photographs of metallograph, of IrO$_y$ films formed on each right region of wafers after RTA, each of the films is formed on different film forming conditions, according to the embodiment of the present invention;

FIG. 36A is a view illustrating a wafer in-plane distribution of a quantity of inverted charges of a single bit capacitor constructed by an upper electrode in the reference;

FIG. 36B is a view illustrating a first wafer in-plane distribution of a quantity of inverted charges of a single bit capacitor in the semiconductor device according to the sixth embodiment of the present invention;

FIG. 36C is a view illustrating a second wafer in-plane distribution of a quantity of inverted charges of a single bit capacitor in the semiconductor device according to the sixth embodiment of the present invention;

FIG. 36D is a view illustrating a third wafer in-plane distribution of a quantity of inverted charges of a single bit capacitor in the semiconductor device according to the sixth embodiment of the present invention;

FIG. 37 is a view illustrating a comparison between a quantity of inverted charges of a single bit capacitor formed by an upper electrode and 3σ in the prior art and the sixth embodiment; and FIGS. 38(a) to 38(d) are surface views of IrO$_y$ films, illustrated on the basis of photographs of metallograph, each of the films has different film thicknesses, according to the sixth embodiment of the present invention.

DESCRIPTION OF EMBODIMENTS

Figure 1A:
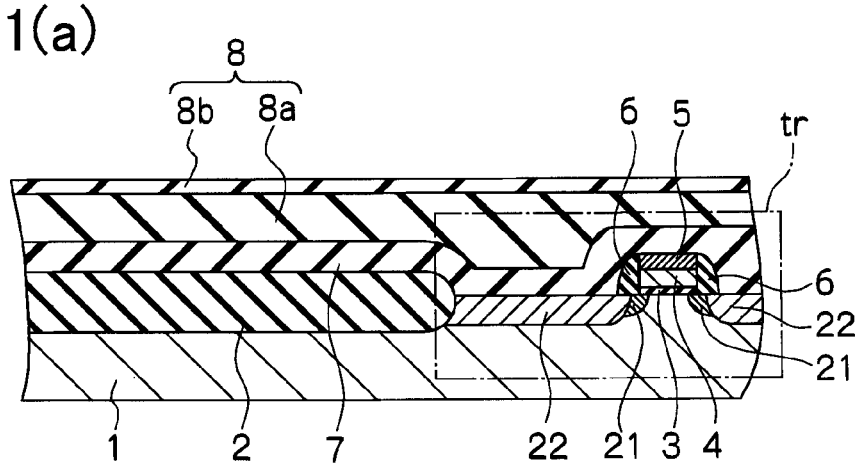
FIGS. 1(a) to 1(c) are sectional views illustrating steps of forming a semiconductor device according to a first embodiment of the present invention.

Various technologies have been developed to improve the characteristic of the ferroelectric capacitor. When the technology set forth Japanese Patent No. 3661850 is employed, in some cases the capacitor characteristics may be deteriorated depending on the forming conditions.

That is, in the capacitor upper electrode formed on the ferroelectric film, the second conductive oxide film on the upper side of the upper electrode is formed to have the composition that is closer to the stoichiometric composition than the first conductive oxide film on the lower side of the upper electrode. However, when the second conductive oxide film is formed thick, in some cases an abnormal growth may be caused in this film itself and a film quality of the ferroelectric film may be deteriorated.

It is an object of the present invention to provide a semiconductor device capable of improving a crystallinity of a capacitor upper electrode containing a plurality of conductive oxide films whose amount of oxygen composition, i.e., degree of oxidation, is different and a method of manufacturing the same.

In this application, the film forming conditions are controlled adequately in forming the second conductive oxide film such that the second conductive oxide film is formed of microcrystal assembly like at least one of stone walls and columns just after the film formation. The second conductive oxide film, for example $IrO_y$ film, is crystallized further from the microcrystal by annealing after forming the second conductive oxide film, but shrinkage of crystals is suppressed and thus the fine second conductive oxide film may be obtained. Even when the second conductive oxide film having such structure is exposed to the atmosphere including the hydrogen, a catalyst action of the metal component in the film is lowered, and the hydrogen is hard to be activated. In turn, the characteristics of the ferroelectric film may be improved in contrast to the prior art.

Also, a film thickness of the first conductive oxide film is thinned not to change a total film thickness of the capacitor upper electrode such that a larger amount of oxygen is supplied to the boundary between the upper electrode and the ferroelectric film and also a film thickness of the second conductive oxide film is thickened. As a result, the process deterioration may be eliminated, and deterioration and variation of a quantity of single bit cell inverted charges may be improved particularly.

The ferroelectric capacitor including such upper electrode may prevent the entering of the hydrogen, and the like in the multilayer interconnection forming step and eliminate the process deterioration. Therefore, the single bit failure may be eliminated, and improvement of the switching characteristics, the initial characteristic, and the retention characteristic of the device may be expected.

As the control of the film forming conditions of the second conductive oxide film, for example, when a film forming temperature is controlled to 50° C. to 75° C., the microcrystal $IrO_y$ film whose density is uniform is formed, and thus the generation of voids in the film is suppressed by annealing subsequently. Therefore, deterioration and variation of a quantity of a single bit cell inverted charge amount is suppressed by controlling a film thickness of the second conductive oxide film to 125 nm to 150 nm. Therefore, in the multilayer interconnection forming step after forming the ferroelectric capacitor, the entering of the hydrogen, and the like into the ferroelectric film may be prevented, and also the process deterioration may be eliminated. As a result, improvement of the switching characteristics, the initial characteristic, and the retention characteristic of the device may be expected.

Non-limiting preferred embodiments of the present invention will be described with reference to the accompanying drawings. Throughout the drawings, similar symbols and numerals indicate similar items and functions.

First Embodiment

FIG. 1(a) to FIG. 7(b) are sectional views illustrating steps of forming a semiconductor device according to a first embodiment of the present invention. Here, a semiconductor device in the present embodiment is a ferroelectric memory and, for convenience of explanation, its configuration will be explained along with its manufacturing method hereinafter.

First, steps required until a structure illustrated in FIG. 1(a) is formed will be explained hereunder.

An element isolation insulating film 2 for partitioning an element active region respectively is formed on a surface of a semiconductor substrate 1 made of silicon, or the like by the LOCOS (Local Oxidation of Silicon) method, for example. In this case, as the element isolation insulating film 2, a shallow trench isolation (STI) structure constructed by forming trenches on the semiconductor substrate 1 and filling a silicon oxide in the trenches may be employed.

Then, a gate electrode 4 is formed in the element active region partitioned by the element isolation insulating film 2 via a gate insulating film 3. As the gate insulating film 3, for example, a SiO2 film whose thickness is about 100 nm is formed by the thermal oxidation. Also, the gate electrode 4 is formed of a patterned polysilicon film, for example, and a silicide layer 5 is formed thereon. In this case, a dopant is doped into the polysilicon film.

The dopant is doped plural times into the semiconductor substrate 1 on both sides of the gate electrode 4, and thus a source/drain region 22 having an extension region 21 is formed. For example, the extension region 21 is formed by introducing the dopant into the semiconductor substrate 1 while using the gate electrode 4 as a mask, then an insulating sidewall 6 is formed on side surfaces of the gate electrode 4, and then the dopant is doped into the semiconductor substrate 1 while using the sidewalls 6 and the gate electrode 4 as a mask, whereby the source/drain region 22 is formed.

A transistor (MOSFET) tr is constructed by the gate insulating film 3, the gate electrode 4, the silicide layer 5, the sidewalls 6, the extension region 21, the source/drain regions 22, and the like.

Then, an oxide-nitride silicon film (SiON film) 7 is formed on a whole surface of the semiconductor substrate 1 to cover the MOSFET tr. Then, a silicon oxide film 8a is formed on the whole surface of the semiconductor substrate 1. The SiON film 7 is formed to prevent a degradation of the gate insulating film 3, etc. caused by the hydrogen that is used in forming the silicon oxide film 8a.

The silicon oxide film 8a whose thickness is about 700 nm is formed by the CVD (Chemical Vapor Deposition) method using Tetraethoxysilane (TEOS) as a reaction gas, for example. Then, an upper surface of the silicon oxide film 8a is planarized by the CMP (Chemical Mechanical Polishing) method.

Then, the silicon oxide film 8a is degassed by applying the annealing process in a nitrogen ($N_2$) atmosphere at 650° C. for 30 minute. Then, an alumina ($Al_2O_3$) film having a thickness of about 20 nm is formed as an adhesion film 8b on the silicon oxide film 8a by the sputter method, for example.

As the adhesion film 8b, a Ti film, a $TiO_x$ film, or the like whose thickness is about 20 nm may be employed, in addition to the alumina film. Alternately, as the adhesion film 8b, a stacked structure consisting of a Ti film whose thickness is 20 nm and a Pt film whose thickness is 180 nm may be employed. For example, the Ti film may be formed at 150° C., and the Pt film may be formed at 100° C. or 350° C. The adhesion film 8b and the silicon oxide film 8a constitute a first interlayer insulating film 8.

With the above, the structure illustrated in FIG. 1(a) is formed.

Figure 1B:
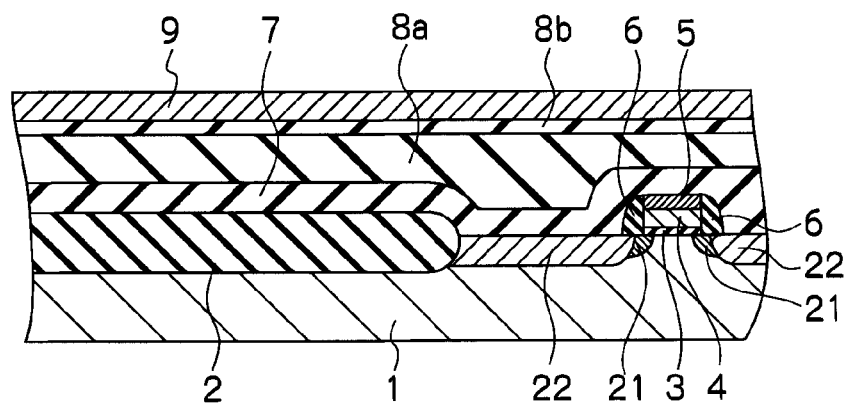

Then, as illustrated in FIG. 1(b), a lower electrode film 9 is formed on the adhesion film 8b. As the lower electrode film 9, a Pt film of about 150 nm thick is formed by the sputter method, for example.

Figure 1C:
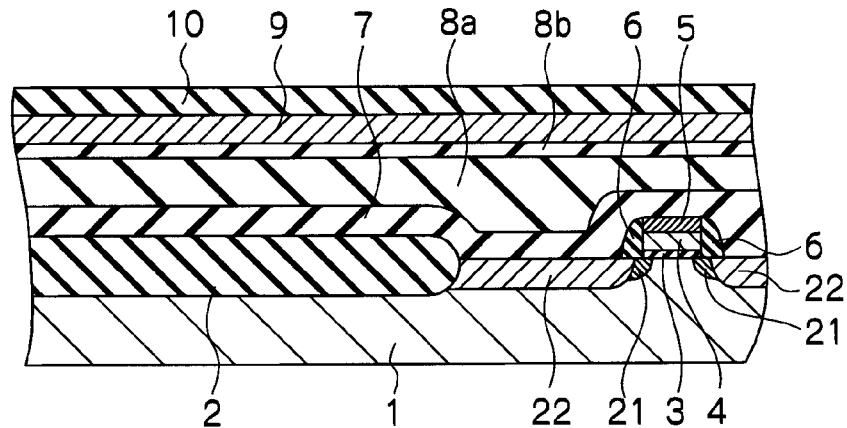

Then, as illustrated in FIG. 1(c), a ferroelectric film 10 is formed on the lower electrode film 9 in an amorphous state. As the ferroelectric film 10, a PLZT film is formed by the RF sputter method, for example, to have a thickness of about 100 nm to 200 nm. As a target of the sputter, PLZT ((Pb,La)(Zr,Ti)$O_3$), for example, is employed.

Then, RTA (Rapid Thermal Annealing) is applied to the ferroelectric film 10 and the lower electrode film 9 at 650° C. in an atmosphere containing Ar as an inert gas and $O_2$ as an oxidizing gas. Then, RTA is applied to the ferroelectric film 10 and the lower electrode film 9 at a temperature 750° C. for the second time in an oxygen atmosphere. As a result, the ferroelectric film 10 is crystallized, the Pt film constituting the lower electrode film 9 is densifyied, and mutual diffusion between Pt and O in vicinity of the boundary between the lower electrode film 9 and the ferroelectric film 10 is suppressed.

Figure 2A:
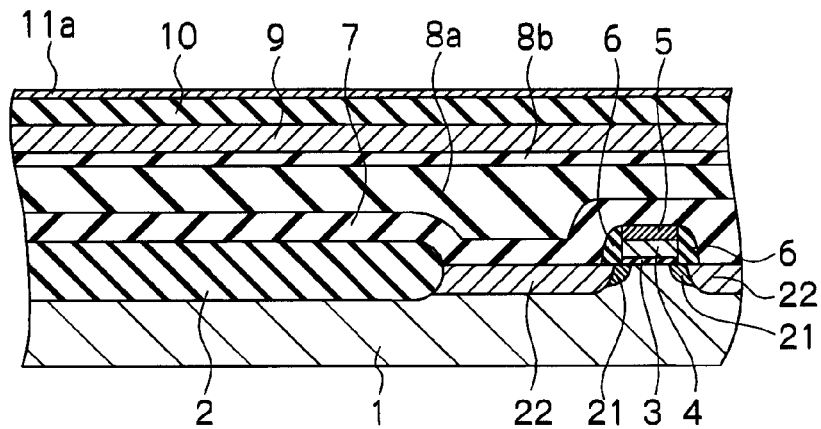
FIGS. 2(a) to 2(c) are further sectional views illustrating the steps of forming the semiconductor device according to the first embodiment of the present invention.
Figure 2B:
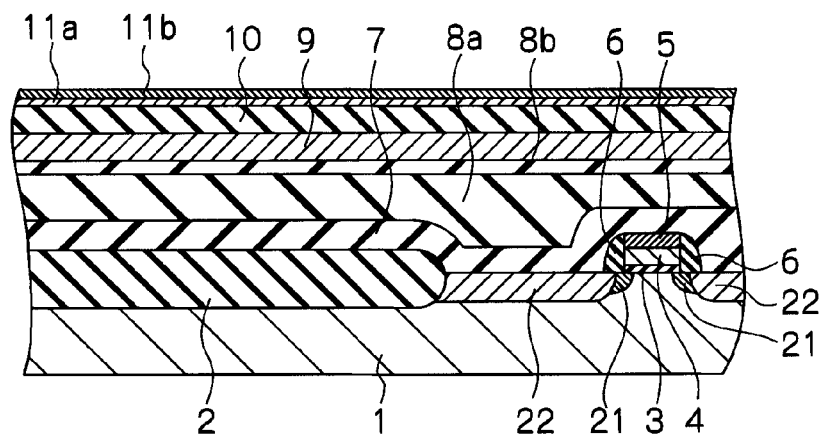
Figure 2C:
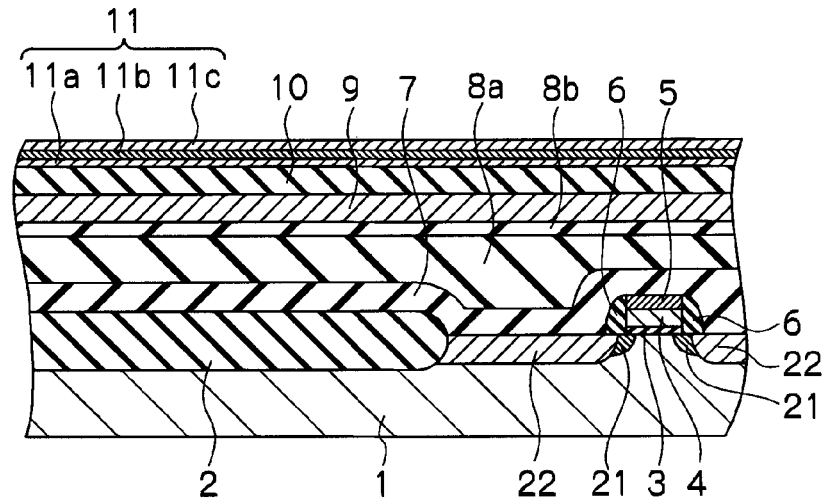

Then, as illustrated in FIGS. 2(a) to 2(c), an upper electrode film 11 is formed on the ferroelectric film 10.

Upon forming the upper electrode film 11, as illustrated in FIG. 2(a), first a first conductive oxide film 11a is formed on the ferroelectric film 10. As the first conductive oxide film 11a, a $IrO_x$ film that is crystallized at a time point of film formation is formed by the sputter method to have a thickness of 10 to 50 nm.

As the growth condition of the $IrO_x$ film, for example, a film forming temperature is set to 300° C., Ar and $O_2$ are used as a gas introduced in a film forming atmosphere, and a sputter power is set to 0.5 to 3.0 kW, e.g., about 1.0 kW. In this case, for example, a flow rate of Ar is set to 140 sccm, and a flow rate of $O_2$ is set to 60 sccm.

Then, as illustrated in FIG. 2(b), a second conductive oxide film 11b made of $IrO_y$ is formed on the first conductive oxide film 11a made of $IrO_x$ by the sputter method to have a thickness of 30 nm to 200 nm. In this case, it is desirable that a particle size of $IrO_y$ should be microcrystallized into 5 to 60 nm at a time point of film formation, while setting a film forming temperature of $IrO_y$ in a range of 30° C. or more but 100° C. or less, preferably a range of 30° C. or more but 75° C. or less.

It is assumed that Ar and $O_2$ are employed as a gas introduced into the film forming atmosphere of $IrO_y$, and also a rate $(f_1/f_2)$ of a flow rate $f_1$ of $O_2$ to a flow rate $f_2$ of Ar is set higher a rate applied in growing the first conductive oxide film 11a made of $IrO_x$. Then, in forming the $IrO_y$ film, for example, a flow rate of Ar is set to 100 sccm, and a flow rate of $O_2$ is set to 100 sccm. In this case, a sputter power is set to 0.5 to 3.0 kW, e.g., about 1.0 kW.

In order to form the first conductive oxide film 11a of substantially same film quality, there is a correlation between a sputter power and an oxygen gas ratio. For example, when a sputter power is decreased, the substantially same film quality may be obtained by decreasing an oxygen gas ratio. Also, when a sputter power is increased, the substantially same film quality may be obtained by increasing an oxygen gas ratio.

The second conductive oxide film 11b made of $IrO_y$ formed under such conditions does not cause an abnormal oxidation, and gives a fine $IrO_y$ microcrystal film.

The reason why a substrate temperature in growing $IrO_y$ should be set in a range of 30° C. or more but 100° C. or less was derived from the result of a preliminary study made as follows. In the preliminary study, the samples, in which a plurality of $IrO_y$ films are grown on a wafer while changing a growth temperature prior to RTA, and the samples, in which respective $IrO_y$ films are heated at 700° C. for 60 sec by RTA in an atmosphere containing an oxygen of 1 vol %, were prepared.

The $IrO_y$ films used in the study were formed on a plurality of silicon wafers, which are covered with an ordinary oxide film, to have a thickness of 100 nm respectively. The temperatures of respective wafers in forming the film are controlled to 50° C., 75° C., 100° C., 150° C., 200° C., and 250° C. respectively. The grown $IrO_y$ films were annealed by RTA in an atmosphere containing oxygen of 1 vol % at 700° C. for 60 sec.

The metallographs of the image in which a surface of an $IrO_y$ film before the heat treatment is applied by RTA is enlarged by 1000 times through a metallographic microscope are illustrated in FIG. 8 and FIG. 9. Also, the metallographs of the image in which a surface of an $IrO_y$ film after the heat treatment is applied by RTA is enlarged by 1000 times through a metallographic microscope are illustrated in FIG. 10 and FIG. 11.

Here, the images illustrated in FIG. 8 and FIG. 10 are a surface image of the $IrO_y$ film in the center portion of the silicon wafer respectively, and the images illustrated in FIG. 9, FIG. 11 are a surface image of the $IrO_y$ film in the right area of the silicon wafer respectively.

First, as illustrated in FIGS. 8(d) to 8(f) and FIGS. 9(d) to (f), when the film forming temperature of $IrO_x$ is increased in excess of 150° C., the $IrO_y$ is crystallized perfectly but an abnormal growth is caused in the $IrO_y$ film. Thus, a smooth surface morphology may not be obtained. When the film forming temperature of $IrO_x$ is at 100° C., the microcrystals and the large crystals are mixed together, but the surface morphology is made slightly smooth, as illustrated in FIG. 8(c) and FIG. 9(c). Also, when the film forming temperature of $IrO_x$ is 75° C. or less, the microcrystallized $IrO_x$ is obtained and thus the $IrO_y$ film has the very smooth surface morphology, as illustrated in FIGS. 8(a), 8(b), 9(a), and 9(b).

According to FIGS. 10(a) to 10(f), and FIGS. 11(a) to 11(f), a surface state prior to the RTA process was reflected as it is on a surface state of the $IrO_y$ film that was processed by RTA. Therefore, it was understood that a surface state after RTA depends on the growth temperature of the second conductive oxide film 11b made of $IrO_y$. In order to get the smooth surface morphology, the $IrO_y$ film should be grown at 100° C. or less, preferably 75° C. or less.

After the second conductive oxide film 11b was formed under the above temperature conditions, either a metal film made of a noble metal such as Ir, Ru, or the like or an alloy containing the noble metal or a conductive noble metal oxide film 11c is formed on the second conductive oxide film 11b by the sputter, as illustrated in FIG. 2(c).

The first conductive oxide film 11a made of $IrO_x$, the second conductive oxide film 11b made of $IrO_y$, and the metal film or the conductive noble metal oxide film 11c, which are formed under the above conditions, constitute together the upper electrode film 11. In this case, the upper electrode film 11 may be formed of the first conductive oxide film 11a and the second conductive oxide film 11b without the metal film or the conductive noble metal oxide film 11c.

The method of forming the ferroelectric film 10 and the upper electrode film 11 is given as the first example. The method containing steps in second to fifth examples explained as follows may be employed or other methods may be employed.

The second example provides the method containing steps of applying the RTA process at 560° C., for example, at a substrate temperature of 650° C. or less in an atmosphere containing Ar and $O_2$ after the ferroelectric film 10 is formed, and then forming $IrO_x$, whose thickness is 20 nm to 75 nm, as the first conductive oxide film 11a at a room temperature or a temperature higher than the room temperature.

When the film is formed at a room temperature, for example, a flow rate of Ar is set to 100 sccm and a flow rate of $O_2$ is set to 56 sccm, and a film forming power is set to 2 kW. Also, when the film is formed at a temperature that is higher than a room temperature, e.g., 300° C., for example, a flow rate of Ar is set to 140 sccm and a flow rate of $O_2$ is set to 60 sccm, and a film forming power is set to 1 kW. Then, the first conductive oxide film 11a and the second conductive oxide film 11b are annealed at 650° C. to 750° C. (e.g., 725° C.) by RTA. According to this annealing, the ferroelectric film 10 is crystallized perfectly, and also the boundary between the ferroelectric film 10 and the first conductive oxide film 11a is made flat. This method is very advantageous in improving a low voltage operation of the ferroelectric capacitor and its switching characteristics.

The third example provides the method containing steps of heating the ferroelectric film 10 by the same method of the first or second example after forming the ferroelectric film 10, then forming a thinner amorphous ferroelectric film on the ferroelectric film 10, then forming the first conductive oxide film 11a on the amorphous ferroelectric film under the same conditions of the first or second example, and then applying the heat treatment. A feature of the capacitor formed by this method has such an advantage that a leakage current of the capacitor may be reduced, in addition to the feature explained in the method in the first or second example.

The fourth example provides the method containing steps of forming an amorphous ferroelectric substance film (not illustrated) thereon when the ferroelectric film 10 is crystallized, and then forming the first conductive oxide film 11a.

The fifth example provides the method containing the step of applying the heat treatment again by RTA in a temperature range of 650 to 750° C., e.g., at a temperature of 700° C., after the second conductive oxide film 11b is formed. This method improves the adhesion between the upper electrode film 11 and the ferroelectric film 10 and also improves the crystals of upper electrode film 12.

Figure 3A:
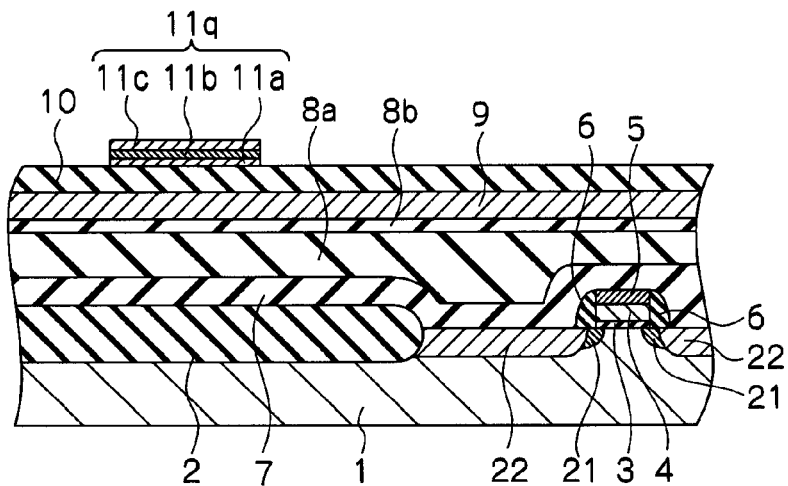
FIGS. 3(a) to 3(c) are still further sectional views illustrating the steps of forming the semiconductor device according to the first embodiment of the present invention.

After the upper electrode film 11 is formed by the method mentioned above, a back surface of the semiconductor substrate 1 is cleaned. Then, as illustrated in FIG. 3(a), a capacitor upper electrode 11q is formed by patterning the upper electrode film 11 while using a mask pattern for the upper electrode (not illustrated). The capacitor upper electrode 11q is positioned over the element isolation insulating film 2, for example.

Then, the annealing process for recovering a film quality of the ferroelectric film 10 is applied in an $O_2$ atmosphere, at a temperature of 650° C. for 60 min. This annealing is applied to recover the physical damages caused in the ferroelectric film 10 when the capacitor upper electrode 11q is formed, and the like.

Figure 3B:
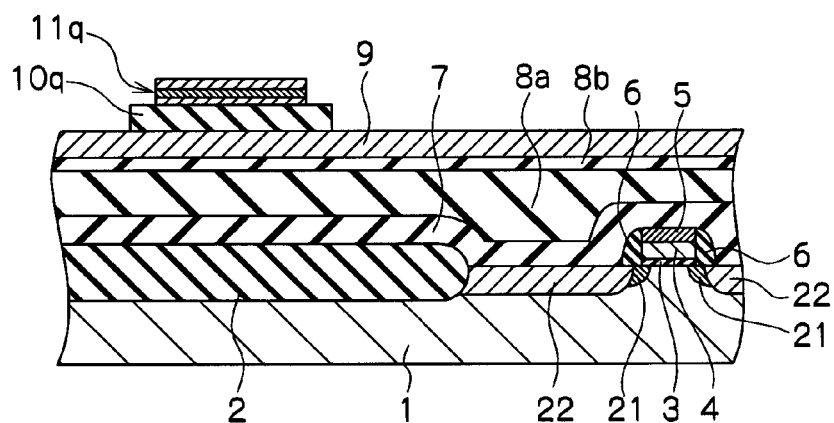

Then, as illustrated in FIG. 3(b), a capacitor ferroelectric film 10q is formed by patterning the ferroelectric film 10 using a mask (not illustrated). The capacitor ferroelectric film 10q is formed in the area that overlaps with the capacitor upper electrode 11q and the area that is extended from this area.

Then, an oxygen annealing for preventing the peeling of the first protection film 12 formed later is applied.

Figure 3C:
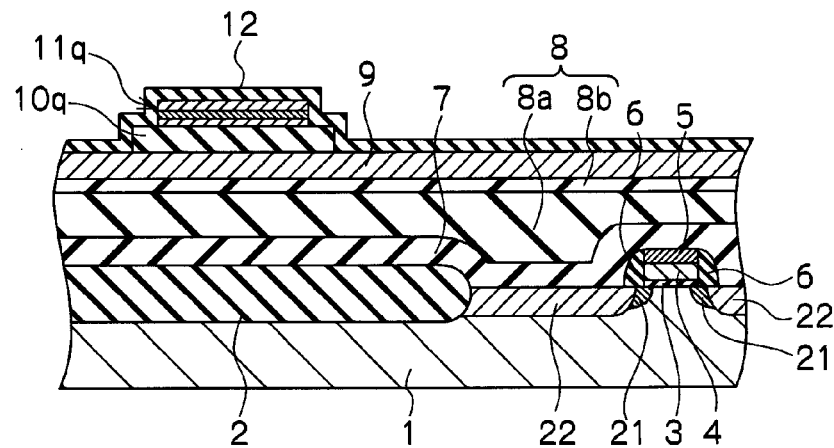

Then, as illustrated in FIG. 3(c), an $Al_2O_3$ film is formed as the first protection film 12 on a whole surface of the capacitor upper electrode 11q, the capacitor ferroelectric film 10q, and the adhesion film 8b by the sputter method. The first protection film 12 prevents the entering of hydrogen into the capacitor ferroelectric film 10q from the outside. Then, the oxygen annealing is applied to relieve the damage of the capacitor ferroelectric film 10q caused by the sputtering.

Figure 4A:
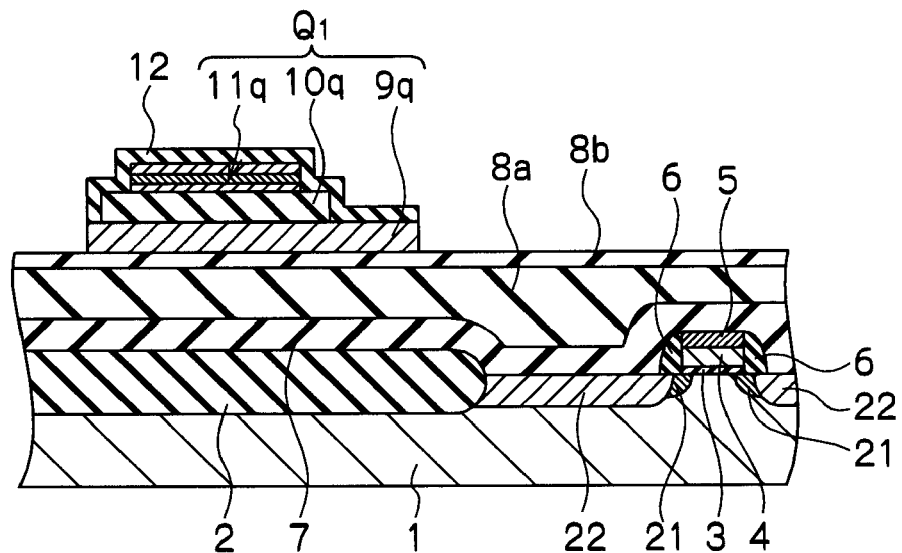
FIGS. 4(a) and 4(b) are still further sectional views illustrating the steps of forming the semiconductor device according to the first embodiment of the present invention.

Then, as illustrated in FIG. 4(a), a capacitor lower electrode 9q formed of the lower electrode film 9 is formed by patterning successively the first protection film 12 and the lower electrode film 9 while using a mask (not illustrated). The capacitor lower electrode 9q has a size containing the area that overlaps with the capacitor ferroelectric film 10q and the capacitor upper electrode 11q and the area that is extended from this area.

A ferroelectric capacitor $Q_1$ is constructed by the capacitor lower electrode 9q, the capacitor ferroelectric film 10q, and the capacitor upper electrode 11q, which are formed by the above patterning.

Figure 4B:
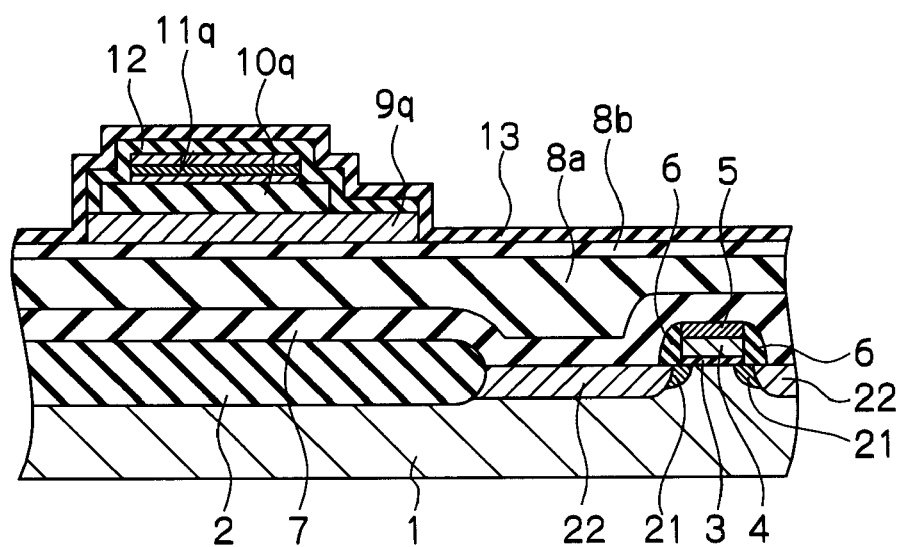

Then, as illustrated in FIG. 4(b), an oxygen annealing for preventing the peeling of a second protection film 13 formed next is applied.

As the second protection film 13, an $Al_2O_3$ film is formed on the first protection film 12 and the adhesion film 8b by the sputtering method. Then, an oxygen annealing is applied to reduce a leakage current of the ferroelectric capacitor $Q_1$.

Figure 5A:
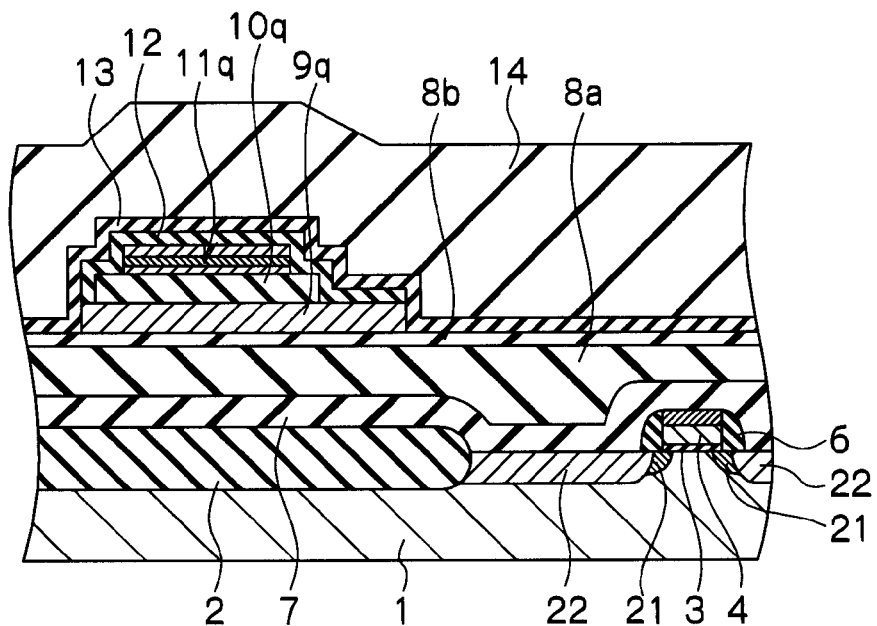
FIGS. 5(a) and 5(b) are still further sectional views illustrating the steps of forming the semiconductor device according to the first embodiment of the present invention.

Then, as illustrated in FIG. 5(a), a second interlayer insulating film 14 is formed on a whole surface by a high-density plasma method. The second interlayer insulating film 14 is a silicon oxide film formed by using TEOS, and a thickness is set to about 1.5 μm, for example.

Then, an upper surface of the second interlayer insulating film 14 is planarized by the CMP method. Then, the plasma process using a $N_2O$ gas is applied to the second interlayer insulating film 14. As a result, a surface layer of the second interlayer insulating film 14 is slightly nitrided, and a moisture is hard to enter into the inside. In this case, this plasma process is effective if a gas in which at least one of N or O is contained is employed.

Figure 5B:
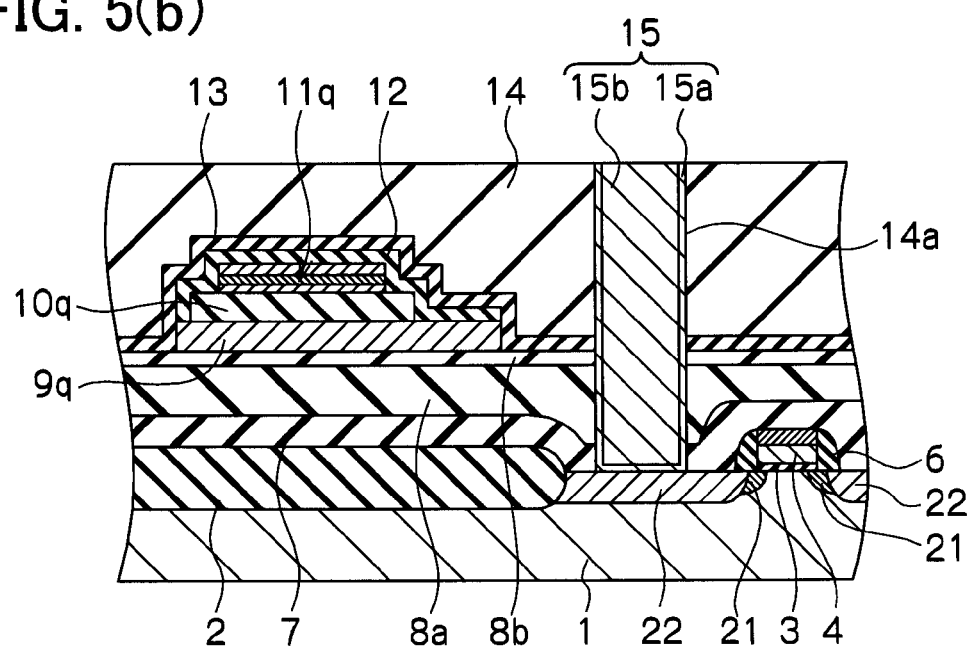

Then, as illustrated in FIG. 5(b), a contact hole 14a whose depth reaches the source/drain region 22 of the MOSFETtr is formed in the second interlayer insulating film 14, the second protection film 13, the adhesion film 8b, the silicon oxide film 8a, and the SiON 7.

Then, a Ti film and a TiN film are formed successively in the contact hole 14a as a barrier metal film 15a by the sputtering method. Then, a tungsten (W) film 15b is filled in the contact hole 14a by the CVD method using a gas containing tungsten hexafluoride. Then, the W film 15b and the barrier metal film 15a are removed from an upper surface of the second interlayer insulating film 14 by the CMP method. Thus, the W film 15b and the barrier metal film 15a being left in the contact hole 14a constitute a conductive plug 15.

Figure 6A:
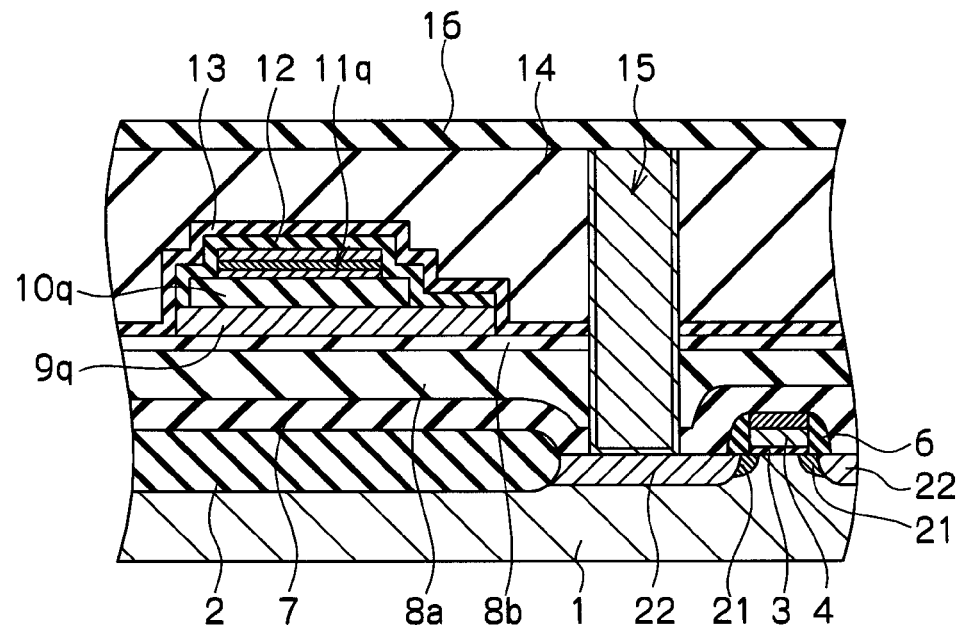
FIGS. 6(a) and 6(b) are still further sectional views illustrating the steps of forming the semiconductor device according to the first embodiment of the present invention.

Then, as illustrated in FIG. 6(a), an SiON film is formed as an oxidation preventing film 16 of the plug 15 by the plasma-enhanced CVD method, for example.

Figure 6B:
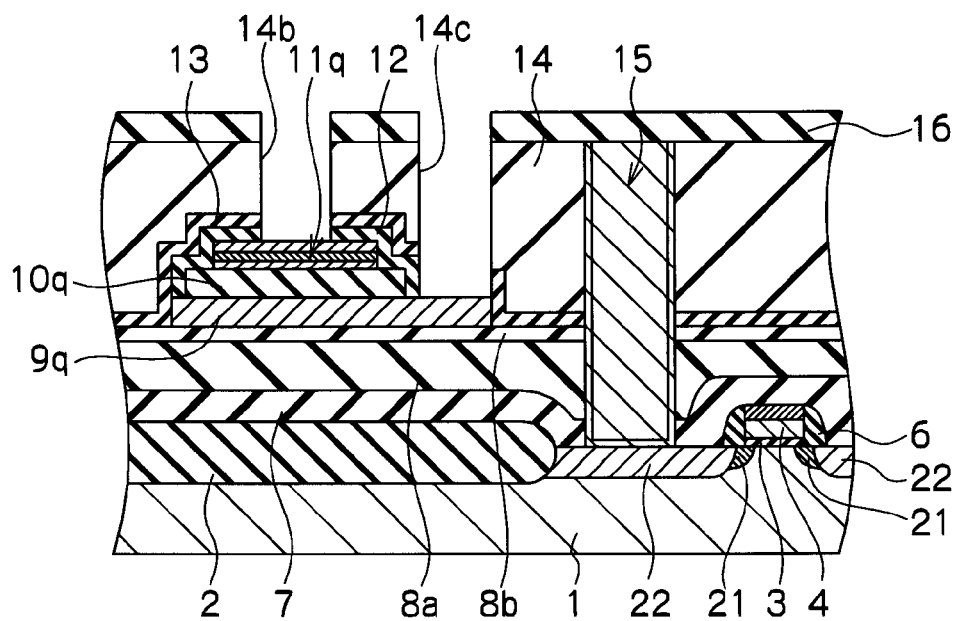

Then, as illustrated in FIG. 6(b), a predetermined area of the SiON film 16, the second interlayer insulating film 14, and the first and second protection films 12, 13 is etched. Accordingly, a contact hole 14b reaching the capacitor upper electrode 11q and a contact hole 14c reaching a contact area of the capacitor lower electrode 9q are formed respectively.

Then, an oxygen annealing is applied to recover the damage of the capacitor ferroelectric film 10q.

Figure 7A:
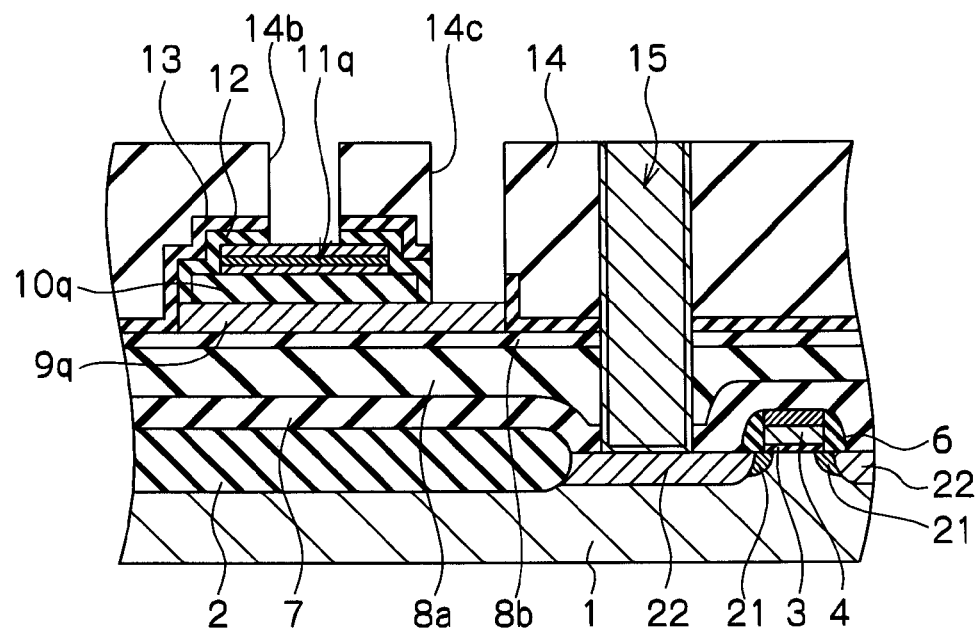
FIGS. 7(a) and 7(b) are still further sectional views illustrating the steps of forming the semiconductor device according to the first embodiment of the present invention.

Then, as illustrated in FIG. 7(a), the oxidation preventing film 16 is removed over a whole surface by the etching-back. Thus, a surface of the W plug 15 is exposed.

Figure 7B:
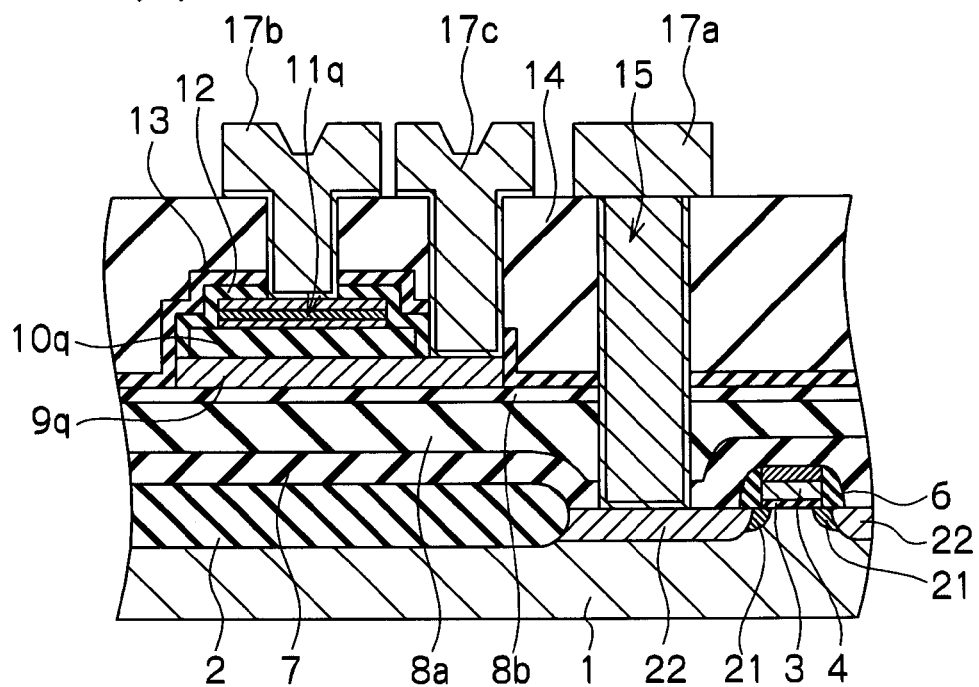
Figure 10A:
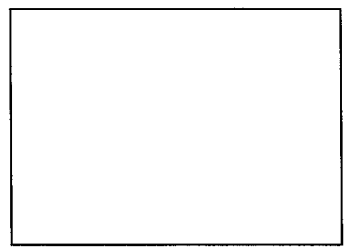
FIGS. 10(a) to 10(f) are surface views, illustrated on the basis of photographs of metallograph, of IrO$_y$ films formed on each center of wafers after RTA, each of the films is formed on different film forming conditions, according to the embodiment of the present invention.
Figure 10B:
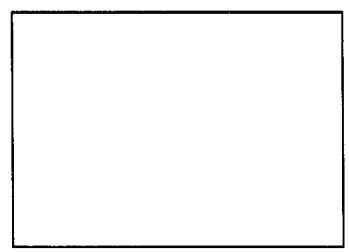
Figure 10C:
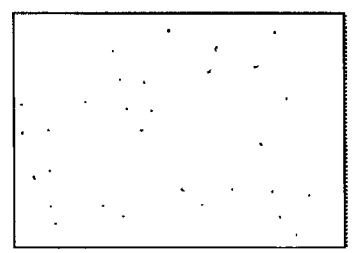
Figure 10D:
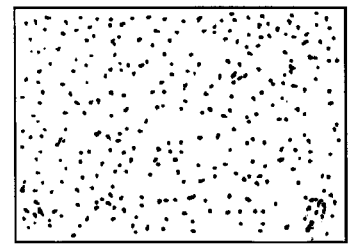
Figure 10E:
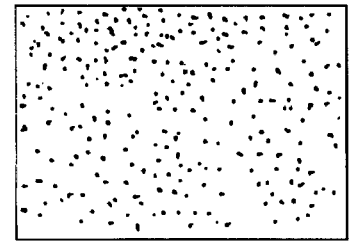
Figure 10F:
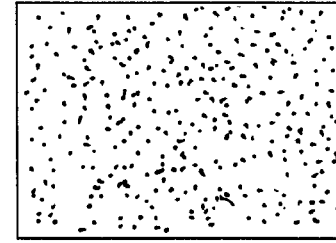

Then, as illustrated in FIG. 7(b), Al interconnections 17a to 17c are formed by an Al film on the second interlayer insulating film 14 in a state that a part of the surface of the capacitor upper electrode 11q, a part of the surface of the capacitor lower electrode 9q, and a surface of the plug 15 are exposed, and then patterning this Al film. In this case, the first Al interconnection 17a is connected to the W plug 15, the second Al interconnection 17b is connected to the capacitor upper electrode 11q via the contact hole 14b, and the third Al interconnection 17c is connected to the capacitor lower electrode 9q via the contact hole 14c.

Then, although not particularly illustrated, formation of the interlayer insulating film, formation of the contact plug, formation of respective interconnections subsequent to the second layer from the bottom, and the like are executed. Then, a cover film formed of a TEOS oxide film and a SiN film, for example, is formed and thus the ferroelectric memory having the ferroelectric capacitor is completed.

Table 1 illustrates the results in which an extent of oxidation of $IrO_x$, $IrO_y$ constituting the first and second conductive oxide films 11a, 11b was examined on a basis of the stoichiometric composition $IrO_2$ by the high-resolution RBS (Rutherford Back-scattering Spectrometry) analysis equipment HRBSV500. Here, $IrO_2$ corresponds to the case where a composition parameter y of $IrO_y$ is 2.

TABLE 1

| Conductive Oxide Film | Film Forming Temperature (° C.) | Film Forming Gas Flow Rate (sccm) Ar:$O_2$ | HRBS Result$_x$ ($IrO_x$) |
| --- | --- | --- | --- |
| $IrO_x$ | 20  | 100:52  | 1.20 |
| $IrO_x$ | 20  | 100:59  | 1.50 |
| $IrO_x$ | 300 | 140:62  | 1.92 |
| $IrO_y$ | 20  | 100:100 | 2.10 |
| $IrO_y$ | 60  | 100:100 | 2.10 |
| $IrO_y$ | 300 | 120:80  | 2.02 |

As appreciated from Table 1, it is understood that, in the ferroelectric capacitor $Q_1$ formed in this manner, an extent of oxidation of the $IrO_y$ film constituting the second conductive oxide film 11b is higher than the $IrO_x$ film constituting the first conductive oxide film 11a of the capacitor upper electrode 11q (y>x), and the $IrO_y$ film as the second conductive oxide film 11b has a substantially ideal stoichiometric composition. Here, it is preferable that a composition y should be set to 2 or more.

In the present embodiment, as described above, the second conductive oxide film 11b made of $IrO_y$ whose degree of oxidation is higher than that of the first conductive oxide film 11a is formed on the first conductive oxide film 11a, and then the noble metal or the metal film containing the noble metal or conductive noble metal oxide film 11c is formed thereon. The capacitor upper electrode 11q constructed by these films 11a to 11c may avoid the abnormal $IrO_x$ crystal growth. More details will be explained in a second embodiment hereinafter.

Also, in the ferroelectric capacitor $Q_1$ formed by the above method, the upper layer of the ferroelectric film 10 is hard to react with the upper electrode film 11 and thus a creation of layer at the boundary is suppressed, and growth of the giant crystal in the second conductive oxide film 11b is suppressed. Therefore, diffusion of the hydrogen is hard to occur during the later heat treatment in the reducing atmosphere, and the ferroelectric film is hard to be reduced. As a result, the good capacitor characteristics may be attained.

Normally, it is well known that Ir or Pt in a metal state acts as a hydrogen catalyst. That is, the hydrogen is activated when it comes in touch with Ir or Pt in a metal state. When the capacitor upper electrode is formed of a single film Ir or Pt, the ferroelectric capacitor is deteriorated easily in manufacturing steps of the semiconductor device and therefore such single film Ir or Pt may not be used.

Also, even when the upper electrode film 11 is constructed by forming the metal film made of Ir or Pt in a metal state directly on the first conductive oxide film 11a, similarly the process deterioration is caused easily.

That is, after the interconnections are formed as a three-layered structure over the second interlayer insulating film 14, a quantity of switching charges of the ferroelectric capacitor is reduced below 50% in contrast to the charges obtained before the interconnections are formed. This is because, in the $IrO_x$ film (x=1.3 to 1.9) constituting the first conductive oxide film 11a, a value of the composition parameter x is smaller than the stoichiometric composition x=2 and thus oxygen defects are produced, and the oxide component and the metal component are present mixedly.

The not-oxidized metal component activates the hydrogen produced in the step of forming the interlayer insulating film or the step of forming the interconnection pattern after the ferroelectric capacitor is formed. Such activated hydrogen deteriorates the capacitor characteristics.

In contrast, since the number of oxygen defects is small in the $IrO_y$ (y=2) constituting the second conductive oxide film 11b that is close to the stoichiometric composition and the metal Ir component is seldom contained, the hydrogen is hard to be activated. In addition, since the second conductive oxide film 11b constituting the upper electrode film 11 is grown at 100° C., preferably in a temperature range of 30° C. or more but 75° C. or less, the $IrO_y$ having a particle diameter 5 nm to 60 nm constituting the second conductive oxide film 11b is composed of the stone wall-like or columnar microcrystals. Accordingly, the second conductive oxide film 11b is formed as the dense film rather than the conventional film, generation of the large void (crumbliness) in the film is eliminated, and the passing of the hydrogen is suppressed. As a result, it may be considered that, even after the multilayer interconnection structure is formed on the ferroelectric capacitor $Q_1$, the capacitor characteristics are maintained without deterioration.

That is, according to the present embodiment, the boundary between the capacitor upper electrode 11q and the capacitor ferroelectric film 10q may be improved and the process deterioration may be improved. As a result, a quantity of inverted charges may be increased, a coercive voltage may be reduced, and the fatigue resistance and the imprint resistance may be improved. Also, such ferroelectric capacitor is extremely suitable for the next-generation ferroelectric memory that operates at a low voltage.

By the way, if respective constitutive metals of the first and second conductive oxide films 11a, 11b are assumed as A, B and the oxygen is assumed as O, the first conductive oxide film 11a is expressed by a chemical formula $AO_{x1}$ using a composition parameter x1 just after the film formation. Also, the first conductive oxide film 11a is expressed by a chemical formula $AO_{x2}$ using an actual composition parameter x2 in an actual state through the subsequent processes, e.g., in a state of the heating process after the film formation or a state after the recovery heating process of the capacitor. Here, A and B may denote either the same constitutive metal or different constitutive metals. As an example in which the different constitutive metals are used, one of A and B is Ir and the other is Ru.

Also, the second conductive oxide film 11b formed on the first conductive oxide film 11a is expressed by a chemical formula $BO_{y1}$ using a composition parameter y1 just after the film formation. Also, the second conductive oxide film 11b is expressed by a chemical formula $BO_{y2}$ using an actual composition parameter y2 in an actual state through the subsequent processes, e.g., in a state of the heating process after the film formation or a state after the recovery heating process of the capacitor.

The second conductive oxide film 11b is composed of very fine microcrystals like the stone wall at first. A large number of microcrystals are joined like the column by the subsequent heat treatment, and a degree of oxidation of the second conductive oxide film 11b becomes higher than that of the first conductive oxide film 11a. Also, the relation (y2/y1)>(x2/x1) is held among the composition parameters x1, x2, y1, and y2. That is, even though an amount of oxygen in the capacitor upper electrode 11q is changed from an initial state in the steps of forming the semiconductor device, an oxidation composition of the second conductive oxide film 11b is larger than an oxidation composition of the first conductive oxide film 11a. Also, it is preferable that the composition y1 should be set to 2 or more. The relation among x1, x2, y1, and y2 is similar in second to sixth embodiments described hereunder.

Second Embodiment

A second embodiment of the present invention will be explained hereunder. Here, for convenience of explanation, a sectional structure of respective memory cells of a ferroelectric memory will be explained along with its manufacturing method hereinafter FIG. 12(a) to FIG. 21 are sectional views illustrating a method of manufacturing a ferroelectric memory (semiconductor device) according to a second embodiment of the present invention in order of steps.

Figure 12A:
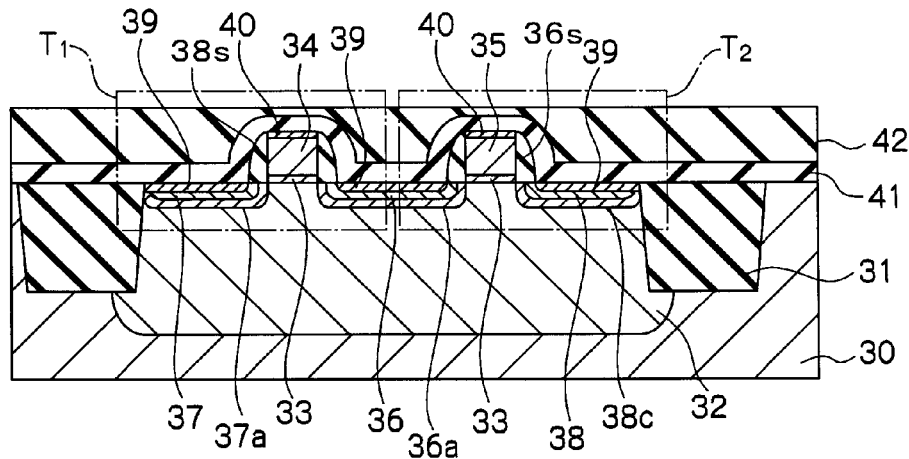
FIGS. 12(a) to 12(c) are sectional views illustrating steps of forming a semiconductor device according to a second embodiment of the present invention.

First, steps required until a structure illustrated in FIG. 12(a) is formed are explained hereunder.

The STI (Shallow Trench Isolation) trenches for defining the active regions of the transistors are formed on a surface of an n-type or p-type silicon (semiconductor) substrate 30, and then an element isolation insulating film 31 is formed by filling an insulating film such as a silicon oxide, or the like in the trenches. In this case, the structure of the element isolation insulating film 31 is not limited to STI, and may be formed by the LOCOS method.

Then, a p-well 32 is formed by introducing a p-type impurity into the active region of the silicon substrate 30. Then, a thermal oxidation film is formed as a gate insulating film 33 by thermally oxidizing a surface of the active region.

Then, an amorphous or polysilicon is formed on the whole upper surface of the element isolation insulating film 31. Then, two gate electrodes 34, 35 are formed by patterning these films by virtue of the photolithography method.

Two gate electrodes 34, 35 are arranged in parallel at an interval on the p-well 32. These gate electrodes 34, 35 constitute a part of word lines.

Then, an n-type impurity is introduced into the silicon substrate 30 beside the gate electrodes 34, 35 by the ion implantation using the gate electrodes 34, 35 as a mask. Thus, first and second source/drain extension regions 36a, 37a are formed.

Then, an insulating film is formed on the whole upper surface of the silicon substrate 30, and then an insulating sidewall 36s, 38s is left on side surfaces of the gate electrodes 34, 35 by etching back the insulating film. As the insulating film, a silicon oxide film is formed by the CVD method, for example.

Then, an n-type impurity is ion-implanted again into the silicon substrate 30 while using the insulating sidewalls 36s, 38s and the gate electrodes 34, 35 as a mask. Thus, source/drain regions (impurity diffusion regions) 36, 37, 38 are formed on a surface layer of the silicon substrate 30 on both sides of two gate electrodes 34, 35.

In this manner, first and second MOS transistor $T_1$, $T_2$ are constructed by the gate insulating film, the gate electrodes 34, 35, the source/drain regions 36, 37, 38, which are formed in the active region of the silicon substrate 30.

Then, a refractory metal layer such as a cobalt layer, or the like is formed on the whole upper surface of the silicon substrate 30 by the sputter method. Then, a refractory metal silicide layer 39 is formed on a surface layer of the source/drain regions 36, 37, 38 by heating the refractory metal layer to react with the silicon. In this step, a refractory metal silicide layer 40 is also formed on a surface layer portion of the gate electrodes 34, 35, whereby a resistance of the gate electrodes 34, 35 is lowered. The refractory metal layer that has not been reacted on the element isolation insulating film 31 and the like is removed by wet-etching.

Then, a SiON film of about 200 nm thickness is formed as a cover insulating film 41 by the plasma CVD method. Then, a silicon oxide film of about 1000 nm thickness is formed as a first interlayer insulating film 42 on the cover insulating film 41. The silicon oxide film is formed by the plasma CVD method using a TEOS gas.

Then, an upper surface of the first interlayer insulating film 42 is polished by the CMP method and is planarized. As the result of this CMP, a thickness of the first interlayer insulating film 42 is set to about 700 nm on the flat surface of the silicon substrate 30.

Figure 12B:
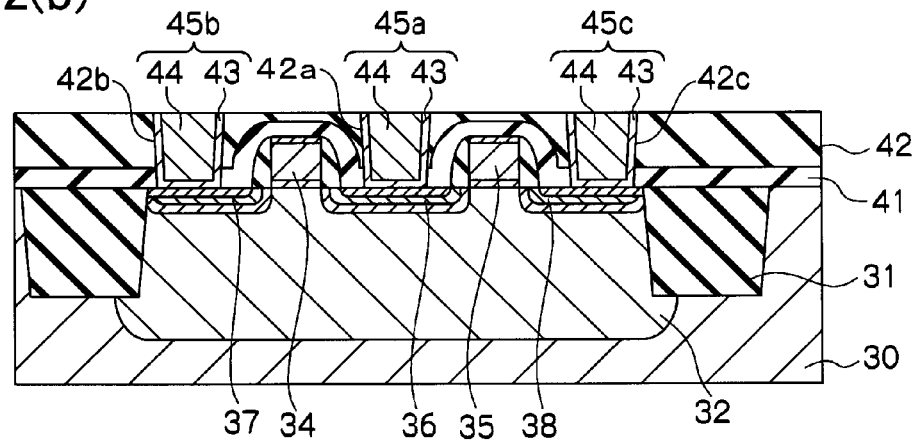

Then, as illustrated in FIG. 12(b), the cover insulating film 41 and the first interlayer insulating film 42 are patterned by the photolithography method. Thus, first to third contact holes 42a to 42c, whose diameter is 0.25 μm and from which the first to third source/drain regions 36 to 38 are exposed respectively, are formed. Then, the conductive plugs 45a to 45c are formed in theses contact holes.

In the steps of forming the conductive plugs 45a to 45c, a Ti film of 30 nm thickness and a TiN film of 20 nm thickness are stacked in order in the first to third contact holes 42a to 42c respectively to constitute a first adhesion film (glue film) 43. Then, a first W film 44 is grown on the first adhesion film 43 by the CVD method, and thus the first W film 44 is filled in the first to third contact holes 42a to 42c. The first W film 44 is grown on the flat surface of the first interlayer insulating film 42 to have a thickness of about 300 nm.

Then, the extra first adhesion film 43 and the extra first W film 44 left on the upper surface of the first interlayer insulating film 42 are removed by the CMP method. Accordingly, the first adhesion film 43 and the first W film 44 left in the first to third contact holes 42a to 42c respectively constitute the first to third conductive plugs 45a to 45c.

Figure 12C:
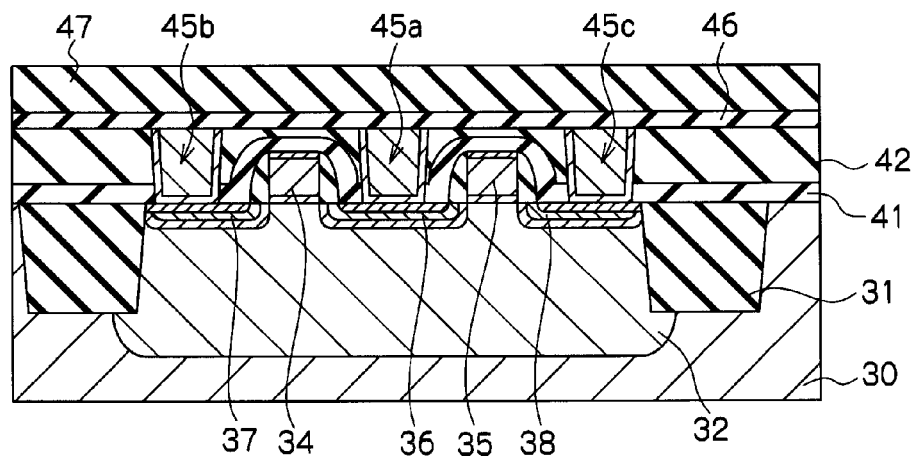

Then, as illustrated in FIG. 12(c), an oxidation preventing film 46 made of SiON is formed on the first to third conductive plugs 45a to 45c and the first interlayer insulating film 42 by the plasma CVD method to have a film thickness of 130 nm, for example. Then, a silicon oxide film is formed as a second interlayer insulating film 47 on the oxidation preventing film 46 to have a film thickness of 300 nm, for example. The silicon oxide film is formed by the plasma CVD method using TEOS as the material to have a film thickness of 300 nm, for example.

In this case, as the oxidation preventing film 46, a SiN film or an aluminum oxide ($Al_2O_3$) film may be formed instead of the SiON film.

Figure 13A:
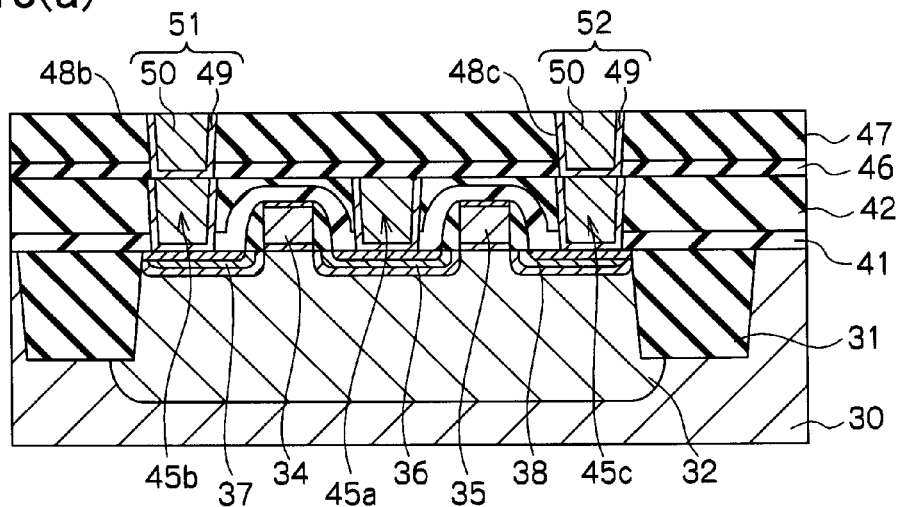
FIGS. 13(a) to 13(c) are further sectional views illustrating the steps of forming the semiconductor device according to the second embodiment of the present invention.

Then, as illustrated in FIG. 13(a), the second interlayer insulating film 47 and the oxidation preventing film 46 are patterned. Thus, fourth and fifth contact holes 48b, 48c are formed on the second and third conductive plugs 45b, 45c near both sides of the p-well 32.

Then, a second adhesion film 49 and a second W film 50 are formed in order in the fourth and fifth contact holes 48b, 48c under the same conditions as those applied to the first adhesion film 43 and the first W film 44. Then, the second W film 50 and the second adhesion film 49 are removed from an upper surface of the second interlayer insulating film 47 by the CMP.

In this CMP, the slurry that renders a polishing speed of the second adhesion film 49 and the second W film 50 as the polished object faster than a polishing speed of the underlying second interlayer insulating film 47, e.g., the product SSW2000 manufactured by Cabot Microelectronics Corporation, is employed. Then, a polishing depth in this CMP is set thicker than a total film thickness of the second adhesion film 49 and the second W film 50 not to leave the polishing residue on the second interlayer insulating film 47. That is, this CMP is done as an over-polishing.

Accordingly, the second W film 50 and the second adhesion film 49 left in the forth and fifth contact holes 48b, 48c provide fourth and fifth conductive plugs 51, 52 respectively. The fourth and fifth conductive plugs 51, 52 are connected to the second and third source/drain regions 37, 38 via the underlying conductive plugs 45b, 45c respectively.

Then, a NH group produced by the ammonia ($NH_3$) plasma is bonded to the oxygen atoms on the surface of the second interlayer insulating film 47.

Hence, even when a Ti atom produced thereafter is further stacked on the second interlayer insulating film 47, the stacked Ti atom is never captured by the oxygen atom. Accordingly, the Ti atom may move freely on the surface of the second interlayer insulating film 47. As a result, the Ti film (not illustrated) that is self-organized in the (002) orientation is formed on the second interlayer insulating film 47.

In this ammonia plasma process, the parallel-plate plasma processing equipment in which the opposing electrodes are provided in positions that is separated from the semiconductor substrate 30 by about 9 mm (350 mils), for example, is employed. As the process conditions, for example, an ammonia gas is supplied at a flow rate of 350 sccm to the processing vessel that is held at a substrate temperature of 400° C. at a pressure of 266 Pa (2 Torr), a high-frequency power of 100 W is applied to the processed substrate side at 13.56 MHz, and a high-frequency power of 55 W is applied to the opposing electrodes at 350 kHz.

Then, for example, an interior of the chamber of the sputter equipment, in which a distance between the semiconductor substrate 30 and a target (not illustrated) is set to 60 mm, is set to an Ar atmosphere at 0.15 Pa, and a DC sputter power of 2.6 kW is supplied for 35 sec at a substrate temperature of 20° C. Accordingly, the Ti film aligned in the strong (002) orientation is formed to have a thickness of 100 nm, for example.

Figure 13B:
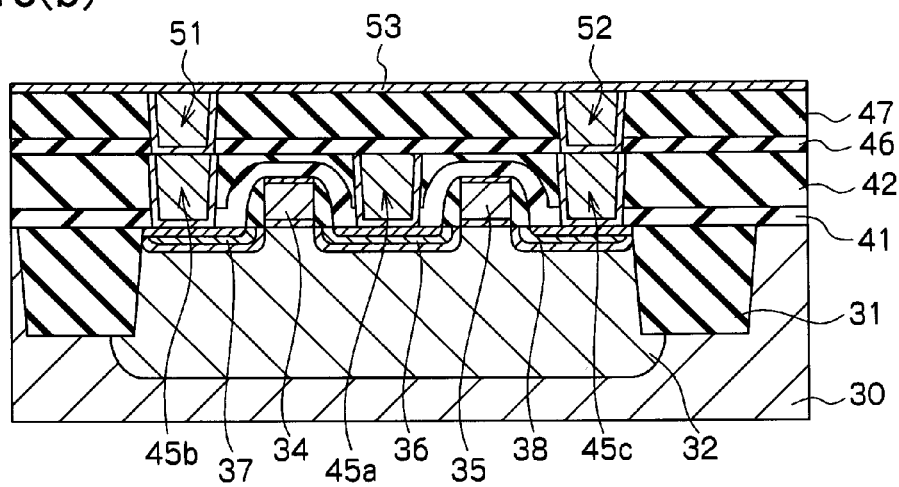

Then, the Ti film is thermally treated at 650° C. for 60 sec in a nitrogen atmosphere by the RTA. As illustrated in FIG. 13(b), the Ti film is changed into a conductive adhesion film (underlying conductive film) 53 made of TiN having the (111) orientation. It is preferable that a thickness of this conductive adhesion film 53 should be set to 100 nm to 300 nm. In the present embodiment, this thickness is set to about 100 nm.

In this case, the conductive adhesion film 53 is not limited to the titanium nitride film. Any one of a tungsten film, a silicon film, and a copper film may be formed.

Figure 13C:
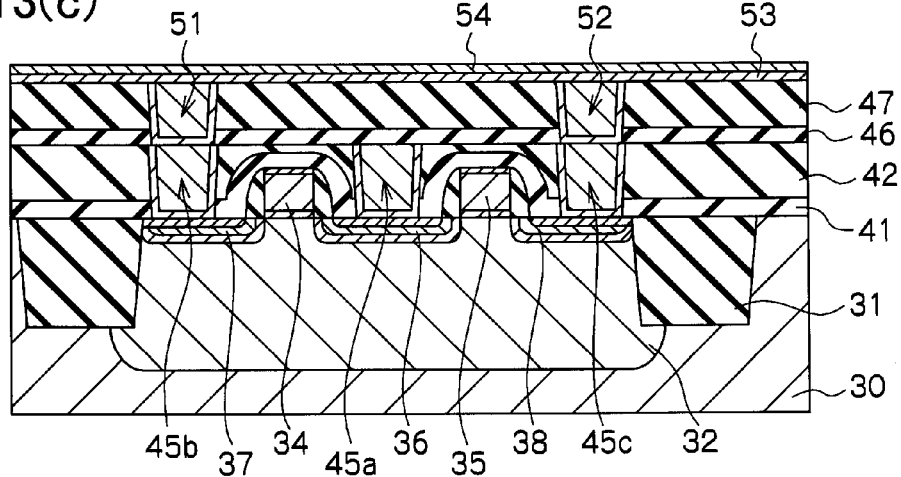

Then, as illustrated in FIG. 13(c), a TiAlN film of 100 nm thickness, for example, is formed as an oxygen diffused barrier film 54 on the conductive adhesion film 53 by the reactive sputter. As the sputter conditions applied to form the conductive adhesion film 53, a target in which Ti and Al are alloyed is employed, Ar and nitrogen are introduced into the sputter atmosphere by 40 sccm and 10 sccm respectively, an interior of the sputter atmosphere is set to a pressure of 253.3 Pa, a substrate temperature is set to 400° C., and a sputter power is set to 1.0 kW.

Figure 14A:
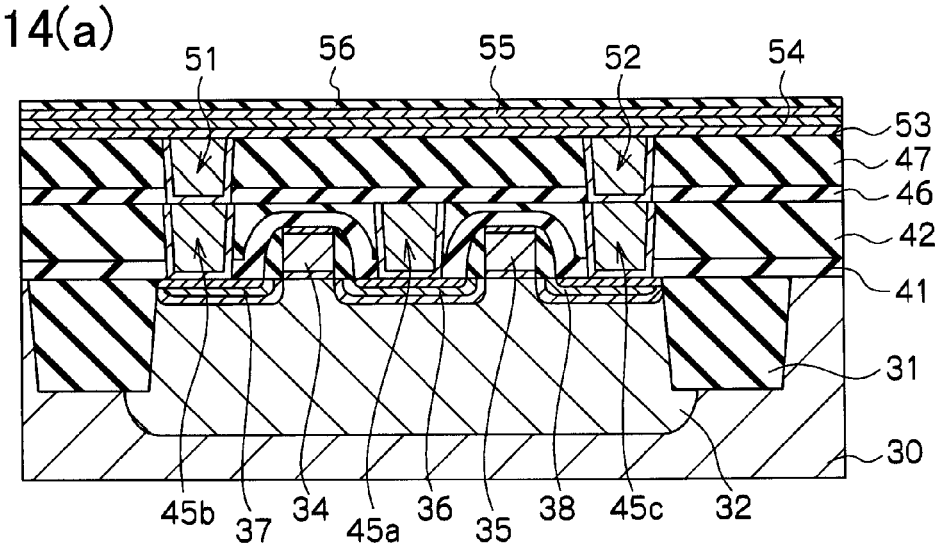
FIGS. 14(a) to 14(c) are still further sectional views illustrating the steps of forming the semiconductor device according to the second embodiment of the present invention.

Then, as illustrated in FIG. 14(a), a lower electrode film 55 and a ferroelectric film 56 are formed in sequence on the oxygen diffused barrier film 54.

As the lower electrode film 55, an Ir film of 100 nm thickness is formed by the sputter. As the sputter conditions for forming the lower electrode film 55, a Ir target is set in an Ar atmosphere, an interior of the sputter atmosphere is set to a pressure of 0.11 Pa, a substrate temperature is set to 500° C., and a sputter power is set to 0.5 kW.

After the lower electrode film 55 is formed, the silicon substrate 30 is annealed at 650° C. for 60 sec in an Ar atmosphere by RTA. Since the temperature in this annealing is set higher than a temperature used to form the lower electrode film 55 and renders a temperature uniform on the whole surface of the silicon substrate 30, the crystallinity of the lower electrode film 55 may be improved from the center to the periphery of the silicon substrate 30. Accordingly, the crystallinity of the lower electrode film 55 may be improved considerably with respect to an in-plane distribution of the silicon substrate 30. An atmosphere of the annealing process is not limited to Ar, and an inert gas, e.g., $N_2$, He, or the like may be employed.

Here, as the lower electrode film 55, a platinum-group metal such as a Pt, or the like, or a conductive oxide such as PtO, $IrO_x$, $SrRuO_3$, or the like may be employed instead of the Ir film. Also, the lower electrode film 55 may be formed of a stacked film containing the above metal or metallic oxide. In this case, $PtAl_x$ or $RuAl_x$ is formed as an alloy of the lower electrode film 55 and the oxygen diffused barrier film 54.

As the ferroelectric film 56, for example, a PZT film is formed on the lower electrode film 55 by the MOCVD method. More concretely, the PZT film is formed in steps described as follows.

First, $Pb(DPM)_2$, $Zr(DMHD)_4$, and $Ti(O-iPr)_2(DPM)_2$ are dissolved in a tetrahydrofuran (THF) solvent up to a concentration of 0.3 mol/l respectively to prepare respective liquid materials of Pb, Zr, and Ti. Then, these three liquid materials are fed to a vaporizer of the MOCVD equipment at a flow rate of 0.326 ml/min, 0.200 ml/min, and 0.200 ml/min respectively together with the THF solvent whose flow rate is set to 0.474 ml/min, and are vaporized in the vaporizer. Thus, material gases of Pb, Zr, and Ti are produced.

Then, a pressure in a chamber of the MOCVD equipment is set to 665 Pa (5 Torr), and a substrate temperature is held at 620° C. Then, the material gases of Pb, Zr, and Ti are introduced into the chamber of the MOCVD equipment for 620 sec. Thus, a desired PZT film of about 100 nm thickness is formed on the lower electrode film 55.

In this case, it is desirable that the annealing should be applied to the PZT film at a temperature of 600° C. to 620° C. for 60 sec in an atmosphere containing oxygen. This annealing evaporates impurities that are adsorbed on the surface of the PZT film, and improves the characteristic of the capacitor. Here, an inert gas may be added to the oxygen. Also, the PZT film may be crystallized.

Then, an amorphous ferroelectric film is formed on the whole surface of the PZT film by the sputter method, for example. As the amorphous ferroelectric film, a ferroelectric film of 1 nm to 30 nm (e.g., 20 nm) thickness, for example, is formed.

When the ferroelectric film is formed by the MOCVD equipment, for example, the material obtained by dissolving $Pb(DPM)_2(Pb(C_{11}H_{19}O_2)_2)$ in the THF liquid is employed as an organic source for supplying a lead (Pb). Also, the material obtained by dissolving $Zr(DMHD)_4(Zr(C_9H_{15}O_2)_4)$ in the THF liquid is employed as an organic source for supplying a zirconium (Zr). Also, the material obtained by dissolving $Ti(O-iPr)_2(DPM)_2(Ti(C_3H_7O)_2(C_{11}H_{19}O_2)_2)$ in the THF liquid is employed as an organic source for supplying a titanium (Ti).

Figure 14B:
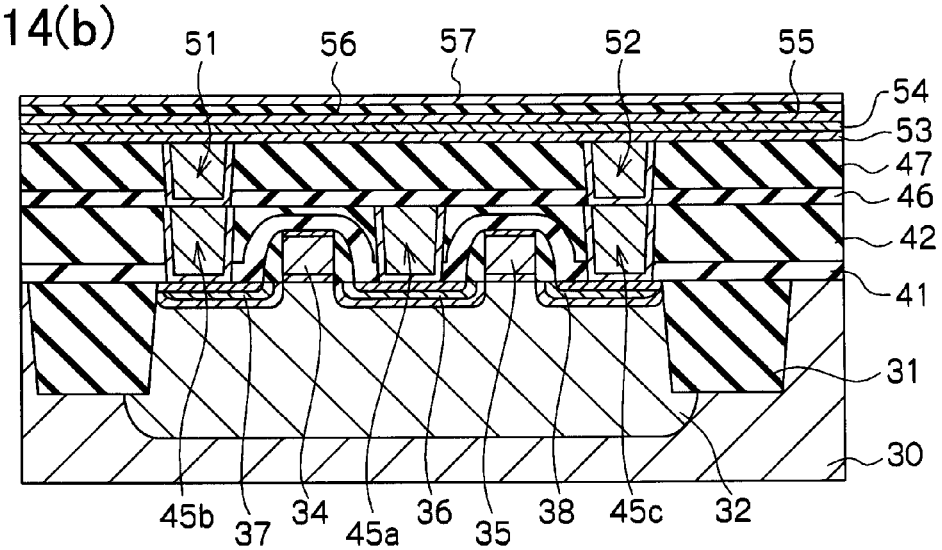

Then, as illustrated in FIG. 14(b), a first conductive oxide film 57 is formed on the ferroelectric film 56. Upon forming the first conductive oxide film 57, at first a IrO$_x$ film whose thickness is 20 nm to 70 nm, e.g., 25 nm and which is crystallized at a time point of film formation is formed on the ferroelectric film 56 by the sputter method. As the film forming conditions, for example, a film forming temperature is set to 300° C., Ar and O$_2$ are employed as a film forming gas, a flow rate of Ar is set to 140 sccm, a flow rate of O$_2$ is set to 60 sccm, and a sputter power is set to about 1.0 kW.

Then, the silicon substrate 30 is annealed by the RTA method. This annealing may crystallize completely the ferroelectric film 56, compensate the oxygen defect in the PZT film constituting the ferroelectric film 56, and also recover a film quality of the ferroelectric film 56 that was subjected to the plasma damage. As the conditions for the RTA method, a temperature of the substrate put in a heating atmosphere is set to 725° C., oxygen and Ar are introduced into the heating atmosphere at a flow rate of 200 sccm and 1800 sccm respectively, and an annealing time is set to 60 sec.

Figure 14C:
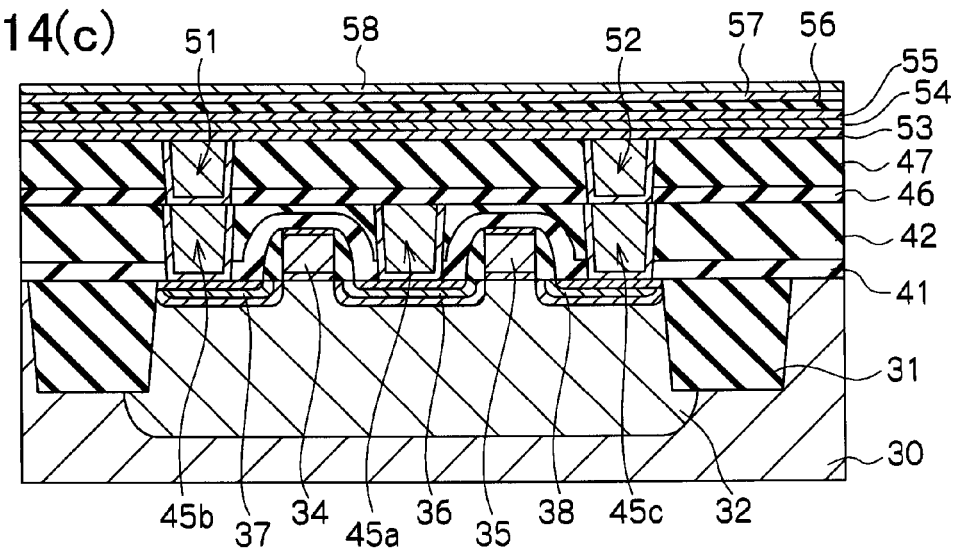

Then, as illustrated in FIG. 14(c), a second conductive oxide film 58 made of IrO$_y$ and having a thickness of 50 nm to 200 nm is formed on the first conductive oxide film 57 by the sputter method. At this time, a film forming temperature is set to a temperature range of 30° C. or more but 100° C. or less, preferably a temperature range of 50° C. or more but 75° C. or less. It is desirable that, in the second conductive oxide film 58, the IrO$_y$ should be microcrystallized at a time point of film formation and a large number of microcrystals should be bonded like a stone wall or a column. Here, details of a temperature range have already been explained in the first embodiment, and will be omitted herein.

The Ir target and the Ar and O$_2$ gases are employed in forming the second conductive oxide film 58. It is assumed that a rate of O$_2$ to Ar at that time is set higher than a rate in forming the first conductive oxide film 57. As the flow rate of the gases in forming the IrO$_y$ film, for example, a flow rate of Ar is set to 100 sccm and a flow rate of O$_2$ is set to 100 sccm. Also, a sputter power is set to about 1 kW, for example.

The second conductive oxide film 58 made of IrO$_y$ and formed under the above conditions contains no abnormal oxidation and, thus the fine crystal film could be obtained. At this time, like the first embodiment, the IrO$_y$ film has a composition close to a stoichiometric composition of IrO$_2$ to suppress the process deterioration. As a result, a function of catalyst for the hydrogen is hard to occur, such a problem is suppressed that the ferroelectric film is reduced by hydrogen radical, and a hydrogen resistance of the capacitor is improved.

In this case, as the material of the first and second conductive oxide films 57, 58, a stacked structure formed of materials selected from platinum (Pt), iridium (Ir), ruthenium (Ru), rhodium (Rh), rhenium (Re), osmium (Os), palladium (Pd) or its oxide, and a conductive oxide such as SrRuO$_3$, or the like or any material selected from the above, instead of IrO$_x$, IrO$_y$ or IrO$_2$, may be employed.

In forming the ferroelectric film 56 and the first and second conductive oxide films 57, 58, the method containing steps in the second example to the fifth example illustrated in the first embodiment may be employed.

Then, the silicon substrate 30 is annealed by the RTA method. As the conditions, for example, a substrate temperature is set to 700° C., O$_2$ and Ar are introduced into the atmosphere at a flow rate of 20 sccm and 2000 sccm respectively, and an annealing time of the substrate is set to 60 sec. According to this annealing, the adhesion of the ferroelectric film 56 and the first and second conductive oxide films 57, 58 may be improved, the crystallinity of the second conductive oxide film 58 may be stabilized, and also the defect such as the oxygen defect, or the like may be eliminated.

Figure 15A:
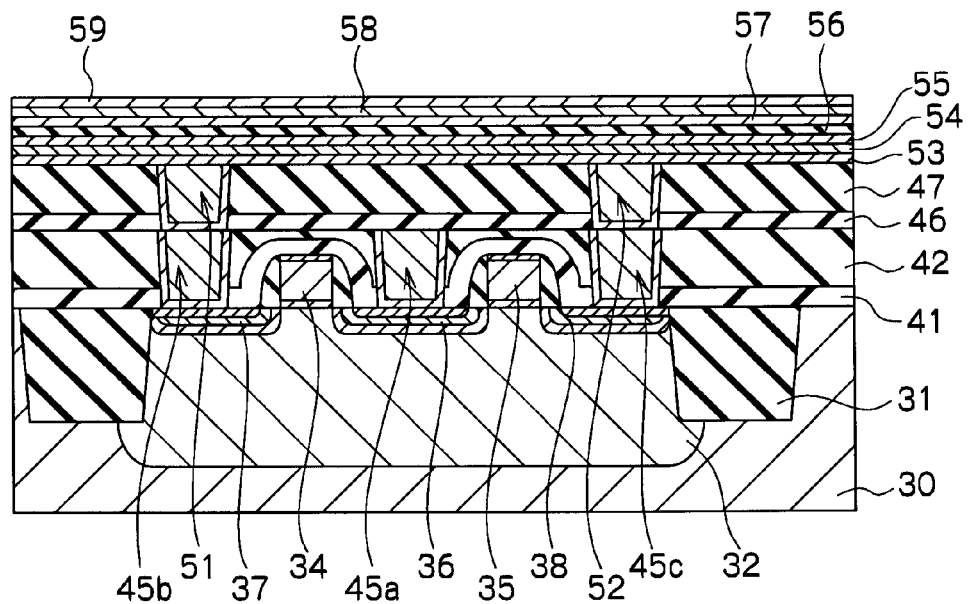
FIGS. 15(a) and 15(b) are still further sectional views illustrating the steps of forming the semiconductor device according to the second embodiment of the present invention.

Then, as illustrated in FIG. 15(a), a metal film 59 made of Ir or Ru whose thickness is 50 nm to 150 nm is formed on the second conductive oxide film 58 made of IrO$_y$. In the case of Ir, a substrate temperature is set to 400° C., Ar is introduced into the film forming atmosphere at a flow rate of 199 sccm, and the metal film 59 is formed by the sputter method.

Accordingly, when the first conductive oxide film 57 and the second conductive oxide film 58 are assumed as a first layer and a second layer respectively, the metal film 59 constitutes a third layer. The constitutive metal of the metal film 59 is formed of a noble metal same as or different from the constitutive metal of the first layer and the second layer or an alloy containing the noble metal or a conductive noble metal oxide.

The first conductive oxide film 57 made of IrO$_x$, the second conductive oxide film 58 made of IrO$_y$, and the metal film 59 made of Ir or Ru constitute together a capacitor upper electrode film.

Figure 15B:
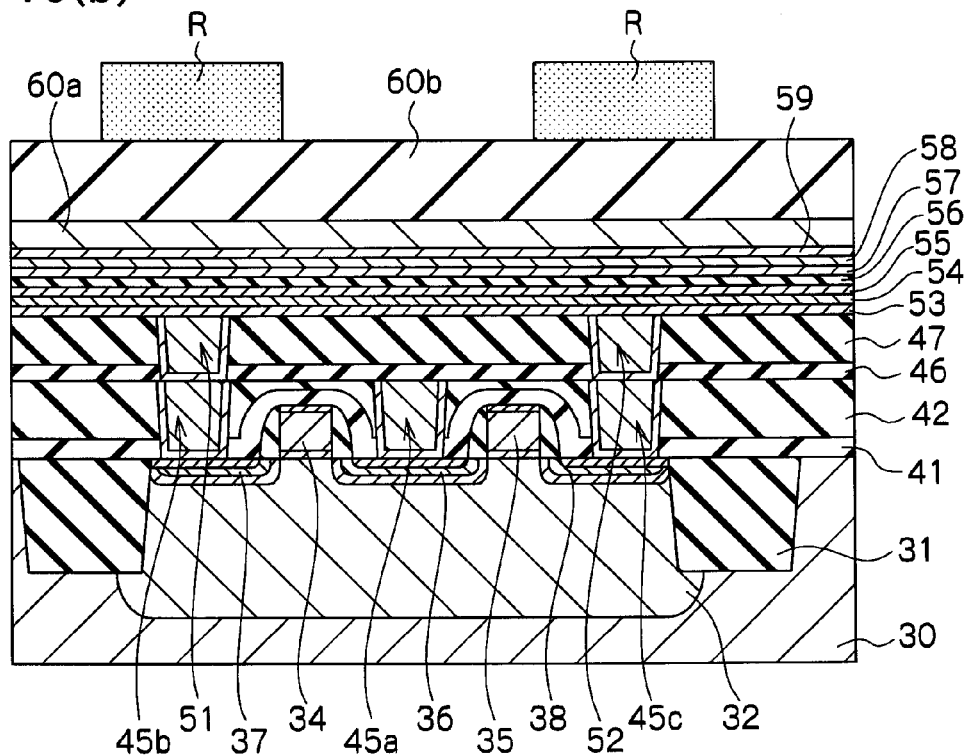

After the back surface of the silicon substrate 30 is rinsed, as illustrated in FIG. 15(b), an alumina film and a titanium nitride film are formed as a first mask material layer 60a on the metal film 59 constituting the upper electrode by the sputter method. Then, a silicon oxide film is formed as a second mask material layer 60b on the first mask material layer 60a by the CVD method using a TEOS gas.

Then, a photo resist is coated on the second mask material layer 60b, and then exposed/developed. Thus, an island-like resist pattern R having a capacitor planar shape is formed on the fourth and fifth conductive plugs 51, 52. Then, the second mask material layer 60b is patterned while using the resist pattern R as a mask. Then, the first mask material layer 60a is etched while using the patterned second mask material layer 60b as a mask.

Figure 16A:
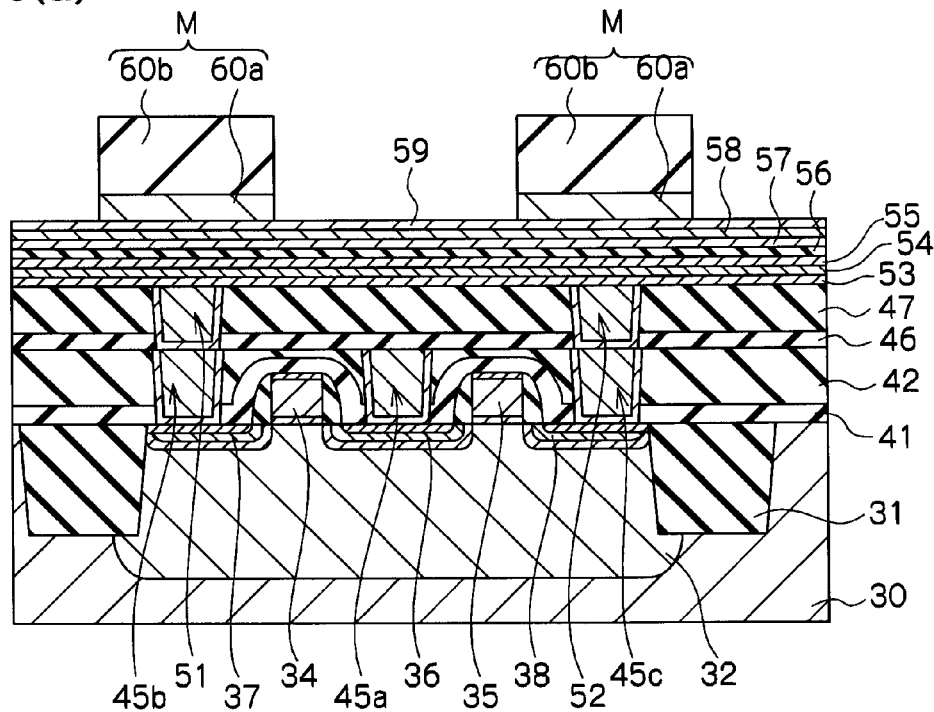
FIGS. 16(a) and 16(b) are still further sectional views illustrating the steps of forming the semiconductor device according to the second embodiment of the present invention.

As illustrated in FIG. 16(a), the first and second mask material layers 60a, 60b that are patterned are used as a hard mask M. The resist pattern R is removed after the first mask material layer 60a is etched.

Figure 16B:
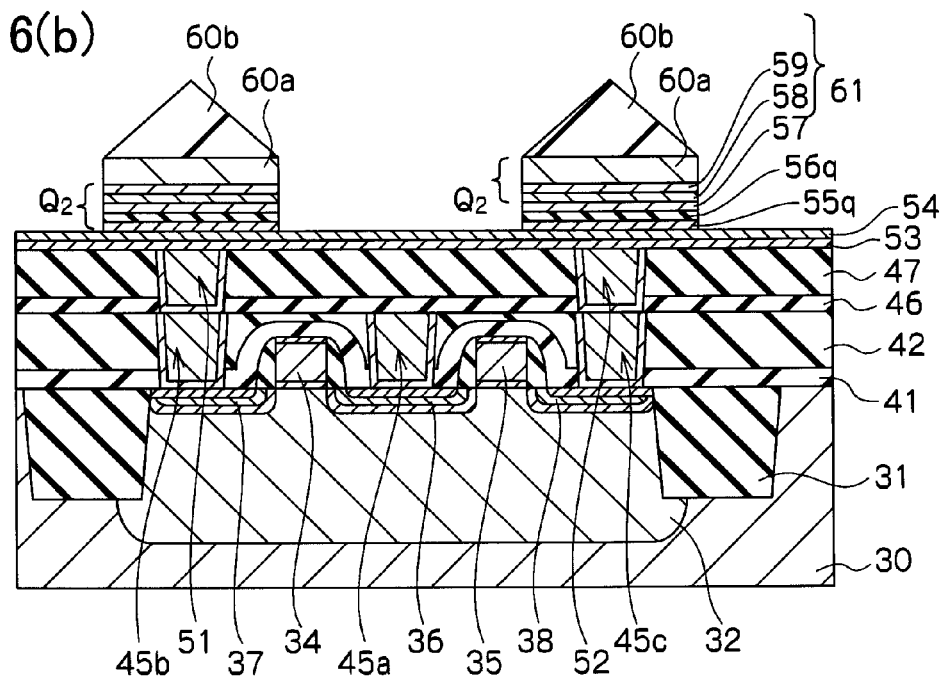

Then, as illustrated in FIG. 16(b), respective portions, which are not covered with the hard mask M, of the upper electrode films 57 to 59, the PZT film, and the lower electrode film 55 are dry-etched by the plasma etching using a mixed gas consisting of HBr, O$_2$, Ar, and C$_4$F$_8$ as an etching gas.

Accordingly, the patterned upper electrode films 57 to 59 constitute a capacitor upper electrode 61, the patterned ferroelectric film 56 constitutes a capacitor dielectric film 56q, and the patterned lower electrode film 55 constitutes a capacitor lower electrode 55q. A ferroelectric capacitor Q$_2$ is constructed by the capacitor upper electrode 61, the capacitor dielectric film 56q, and the capacitor lower electrode 55q.

Figure 17A:
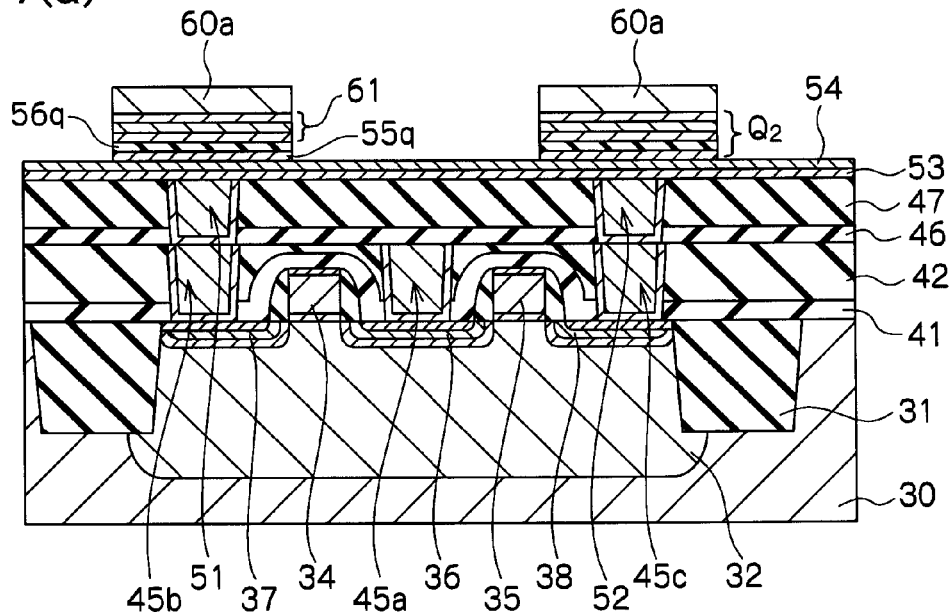
FIGS. 17(a) and 17(b) are still further sectional views illustrating the steps of forming the semiconductor device according to the second embodiment of the present invention.

Then, as illustrated in FIG. 17(a), the second mask material layer 60b is removed by the dry etching or the wet etching. For example, a hydrofluoric acid is used as the wet etching.

Figure 17B:
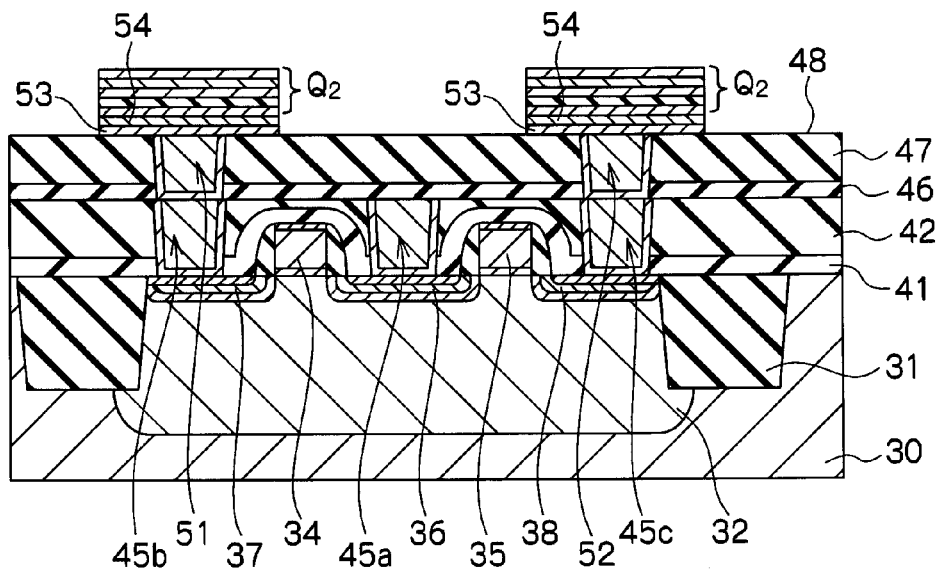

Then, as illustrated in FIG. 17(b), respective portions, which are not covered with the ferroelectric capacitor Q$_2$, of the oxygen diffused barrier film 54, the conductive adhesion film 53, and the first mask material layer 60a are removed by the dry etching.

Figure 18A:
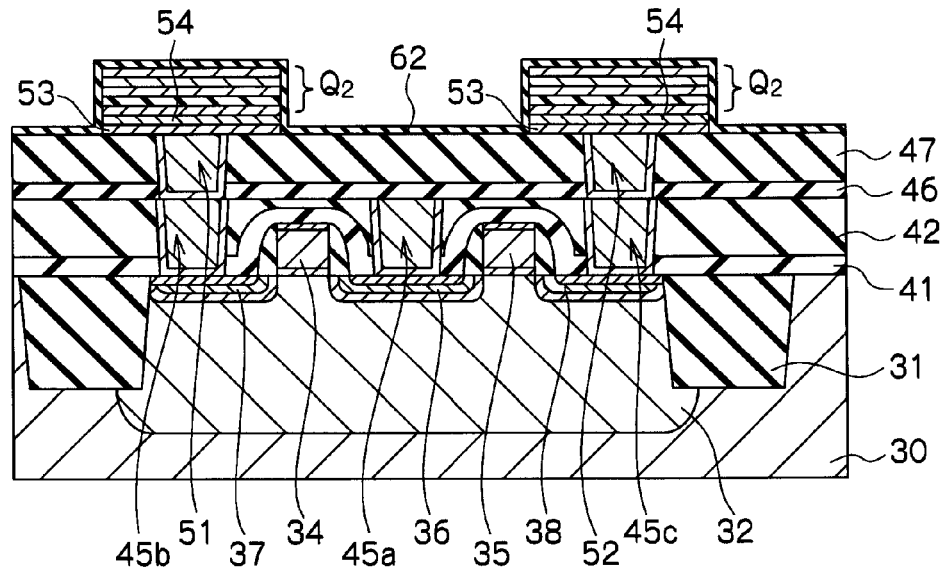
FIGS. 18(a) and 18(b) are still further sectional views illustrating the steps of forming the semiconductor device according to the second embodiment of the present invention.

Then, as illustrated in FIG. 18(a), a first protection insulating film 62 made of Al$_2$O$_3$ and having a thickness of 20 nm is formed by the sputter method to cover the ferroelectric capacitor Q$_2$. In this case, as the first protection insulating film 62, an alumina film of 2 nm thickness may be formed by the ALD (Atomic Layer Deposition) method or a PZT film or a TiO$_x$ film may be formed by the sputter method.

Figure 18B:
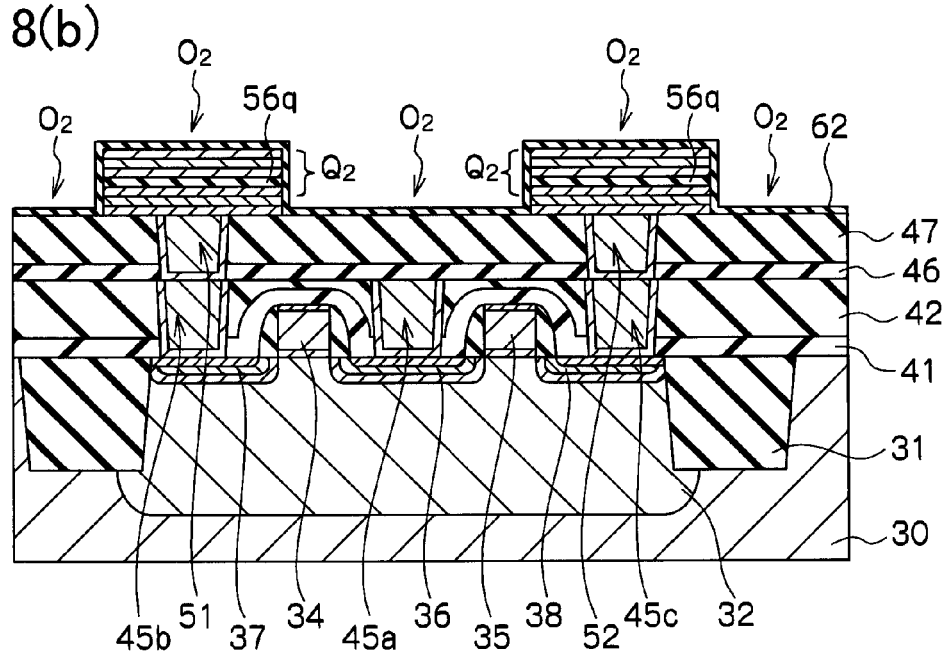

Then, as illustrated in FIG. 18(b), for the purpose of recovering a film quality of the capacitor dielectric film 56q that was damaged, a recovery annealing is applied to the capacitor dielectric film 56q in an oxygen-containing atmosphere. The conditions of this recovery annealing are not particularly limited. In the present embodiment, this annealing is performed at a substrate temperature of 550° C. to 700° C. in a heating furnace. Also, in case the capacitor dielectric film 56q is formed of PZT, it is desirable that the annealing should be applied at a substrate temperature of 600° C. for 60 min in an oxygen atmosphere.

Figure 19A:
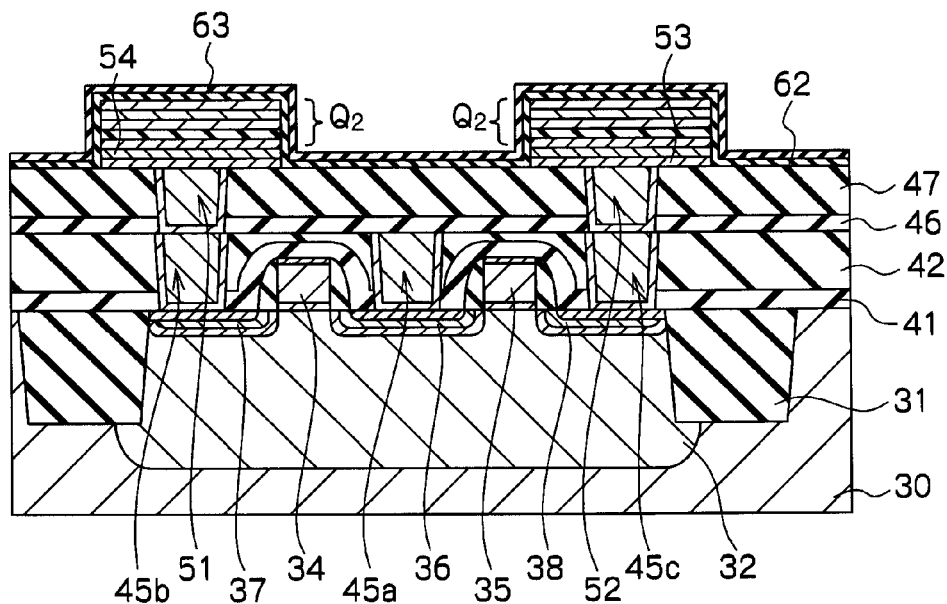
FIGS. 19(a) and 19(b) are still further sectional views illustrating the steps of forming the semiconductor device according to the second embodiment of the present invention.

Then, as illustrated in FIG. 19(a), a second protection insulating film 63 for covering the first protection insulating film 62 and the ferroelectric capacitors $Q_2$ is formed. The second protection insulating film 63 functions as a hydrogen barrier film. In this case, as the second protection insulating film 63, $Al_2O_3$ in about 40 nm thick may be formed by the CVD method.

Figure 19B:
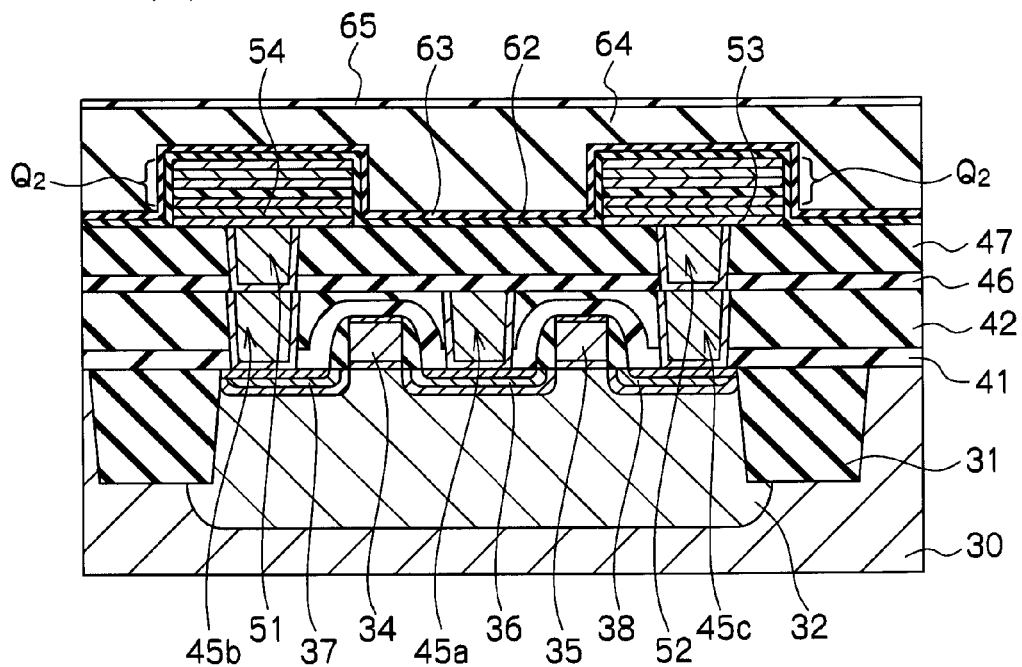

Then, as illustrated in FIG. 19(b), a third interlayer insulating layer 64 formed of a silicon oxide whose film thickness is 1500 nm, for example, is formed on the second protection insulating film 63. The silicon oxide is formed on the whole surface of the substrate by the plasma CVD method, for example. As a material gas, a mixed gas of a TEOS gas, an oxygen gas, and a helium gas, for example, is employed. In this case, as the third interlayer insulating layer 64, an inorganic film having an insulating property, or the like, for example, may be formed.

Then, a surface of the third interlayer insulating layer 64 is planarized by the CMP method, for example. Then, the heat treatment is applied to the third interlayer insulating layer 64 in a plasma atmosphere that is produced by using a $N_2O$ gas, a $N_2$ gas, or the like. As the result of the heat treatment, a moisture in the third interlayer insulating layer 64 is removed, and a film quality of the third interlayer insulating layer 64 is reformed and it is difficult for a moisture to enter into the film.

Then, a barrier film (third protection insulating film) 65 is formed on the whole surface of the third interlayer insulating layer 64 by the sputter method or the CVD method, for example. As the barrier film 65, an aluminum oxide film whose film thickness is 20 nm to 100 nm, for example, is formed. The barrier film 65 formed on the planarized third interlayer insulating layer 64 is formed flat.

Figure 20A:
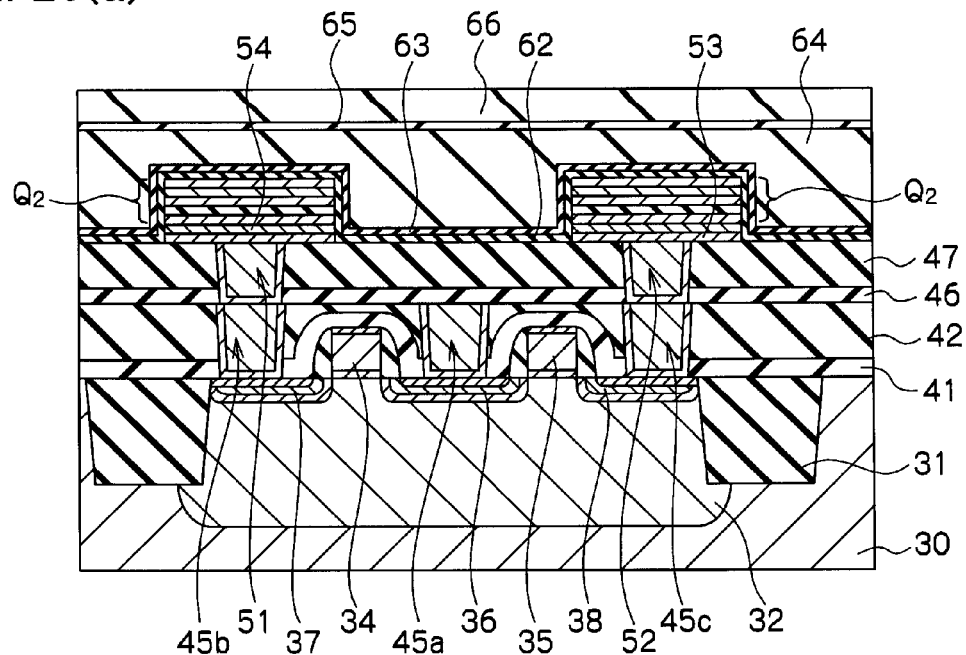
FIGS. 20(a) and 20(b) are still further sectional views illustrating the steps of forming the semiconductor device according to the second embodiment of the present invention.

Then, as illustrated in FIG. 20(a), a fourth interlayer insulating film 66 is formed on the whole surface of the barrier film 65. As the fourth interlayer insulating film 66, a silicon oxide film having a film thickness of 800 nm to 1000 nm is formed by the plasma CVD method using a TEOS gas, for example. In this case, as the fourth interlayer insulating film 66, a SiON film, a silicon nitride film, or the like may be formed. After this, a surface of the fourth interlayer insulating film 66 is planarized by the CMP method, for example.

Figure 20B:
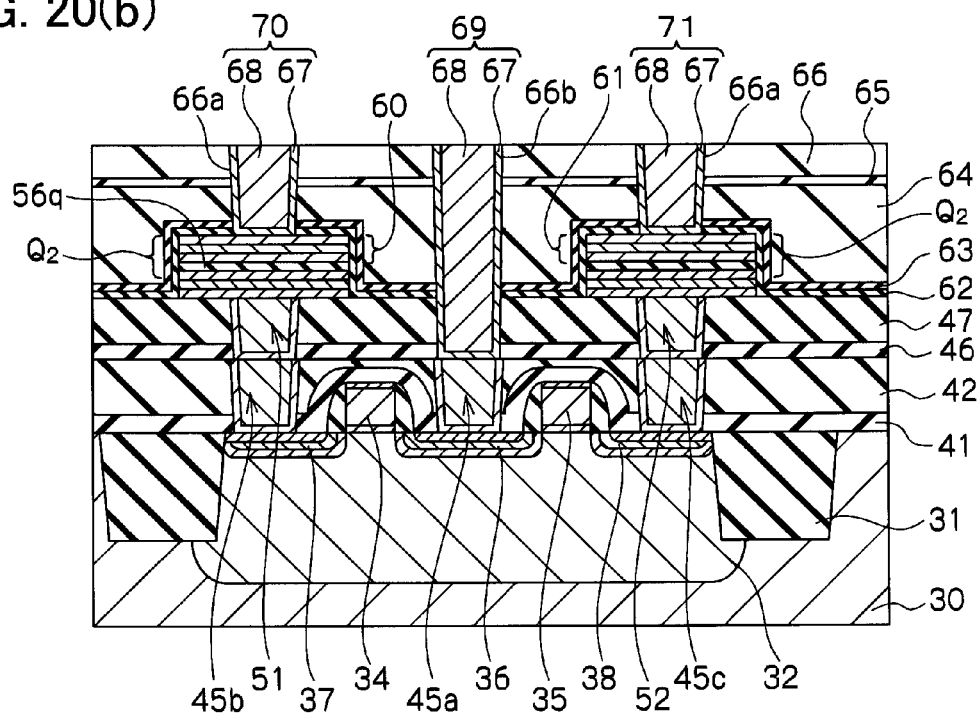

Then, as illustrated in FIG. 20(b), sixth to eighth conductive plugs 69 to 71 are formed on the ferroelectric capacitor $Q_2$. The sixth to eighth conductive plugs 69 to 71 are formed by following steps.

First, a resist pattern (not illustrated) in which an opening portion is provided over the ferroelectric capacitors $Q_2$ respectively is formed on the fourth interlayer insulating film 66. Then, respective films from the fourth interlayer insulating film 66 to the third interlayer insulating layer 64 are etched while using the resist pattern as a mask. Thus, a via hole 66a is formed on capacitor upper electrodes 60 of the ferroelectric capacitors $Q_2$ respectively. Accordingly, the second protection insulating film 63 is exposed from the first via hole 66a.

After the resist pattern is removed, the silicon substrate 30 is put in the oxygen atmosphere and is annealed at 450° C. Therefore, the oxygen defect caused due to the formation of the via hole 66a in the capacitor dielectric film 56q is recovered.

After this, respective films from the fourth interlayer insulating film 66 to the first interlayer insulating film 42 are etched by the same method as the formation of the via hole 66a. Thus, a contact hole 66b is formed over the first conductive plug 45a formed in the center area of the p-well 32. Accordingly, the oxidation preventing film 46 is exposed from the contact hole 66b.

Then, the oxidation preventing film 46 is wet-etched through the via holes 66a, and thus an upper surface of the capacitor upper electrode 60 is exposed. Also, the first and second protection insulating films 62, 63 are etched partially through the contact hole 66b, and thus an upper surface of the first conductive plug 45a is exposed.

Then, a TiN film is formed as an adhesive layer 67 on surfaces of the via holes 66a and the contact hole 66b as a single layer. The adhesive layer 67 may be constructed by the double-layered structure obtained when a Ti film is formed by the sputter and a TiN film is formed thereon by the MOCVD method.

In this case, in order to remove a carbon from the TiN film, the TiN film must be processed in the mixed gas plasma consisting of nitrogen and hydrogen. However, in the present embodiment, since the metal film 59 as an uppermost layer of the capacitor upper electrode 60 is formed of the Ir film that has a hydrogen barrier function, such a problem does not arise that the capacitor upper electrode 60 is reduced.

Then, a W film 68 is grown on the adhesive layer 67 by the CVD method, and thus the W film 68 is filled in the via holes 66a and the contact hole 66b. Then, the W film 68 and the adhesive layer 67 formed on the fourth interlayer insulating film 66 are removed by the CMP method.

Accordingly, the W film left in the contact hole 66b constitutes the sixth conductive plug 69, and the W film left in the via holes 66a constitutes the seventh and eighth conductive plugs 70, 71 respectively.

Then, a Ti film whose thickness is 60 nm, a TiN film whose thickness is 30 nm, an AlCu alloy film whose thickness is 360 nm, a Ti film whose thickness is 5 nm, and a TiN film whose thickness is 70 nm are formed sequentially on the fourth interlayer insulating film 66 by the sputter method, for example. As a result, a stacked film consisting of the Ti film, the TiN film, the AlCu alloy film, the Ti film, and the TiN film is formed.

Figure 21:
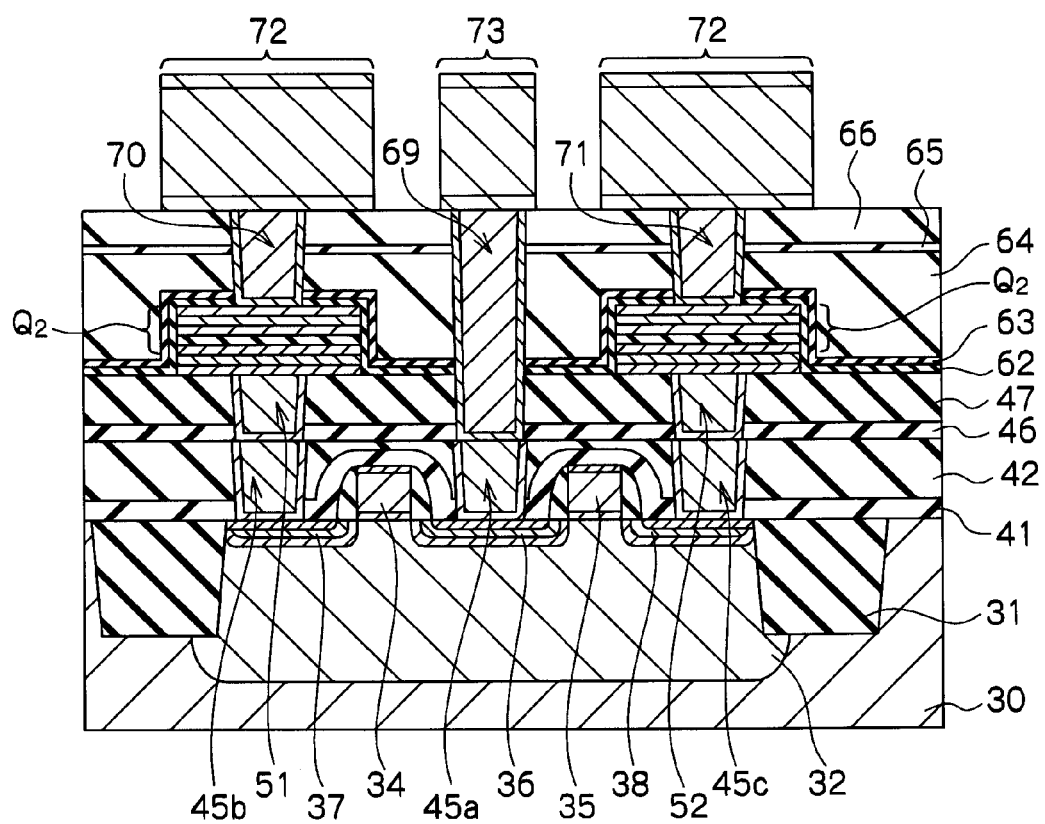
FIG. 21 is a still further sectional view illustrating the steps of forming the semiconductor device according to the second embodiment of the present invention.

Then, as illustrated in FIG. 21, the stacked film is patterned by the photolithography technology. Thus, an interconnection (first metal interconnection layer) made of the stacked film is formed. That is, an interconnection 72 connected to the seventh conductive plug (via plug) 70, and a conductive pad 73 connected to the sixth conductive plug 69, and the like are formed. The interconnection 72 is connected to the upper electrode 61 via the contact hole 66a, and is connected to the first and second conductive oxide films 57, 58. This connection contains the electrical connection.

Then, formation of the interlayer insulating film, formation of the contact plug, formation of interconnections in the second to fifth layers from the bottom, and the like are performed. Then, the cover film consisting of the TEOS oxide film and the SiN film, for example, is formed, and thus the ferroelectric memory having the ferroelectric capacitor is completed. Detailed explanation will be omitted herein.

The electric characteristics of the ferroelectric capacitor $Q_2$ having the above structure according to the present embodiment will be explained hereunder.

Here, the composition y=2 of $IrO_y$ is assumed, and the second conductive oxide film 58 is formed of $IrO_2$. Then, $IrO_2$ film was manufactured by setting the film forming temperature to two conditions I, II described as follows.

I. In an initial state, the $IrO_2$ film was formed at a room temperature without a temperature control the wafer (silicon substrate). That is, the temperature control of the electrostatic chuck is turned OFF. In this case, a temperature of the wafer is increased gradually in the course of growth of the $IrO_2$ film (W/OES).

II. A plurality of samples were prepared by setting a temperature of a plurality of wafers to 25° C., 50° C., 60° C., 75° C., and 100° C. respectively in growing the $IrO_2$ film.

The electric characteristics of a plurality of ferroelectric capacitors $Q_2$ formed under these conditions were measured in a state after the first layer interconnection 72 illustrated in FIG. 21 was formed, and then the electric characteristics were measured in a state of the process out after the fifth layer interconnection (not illustrated) was formed.

Figure 22:
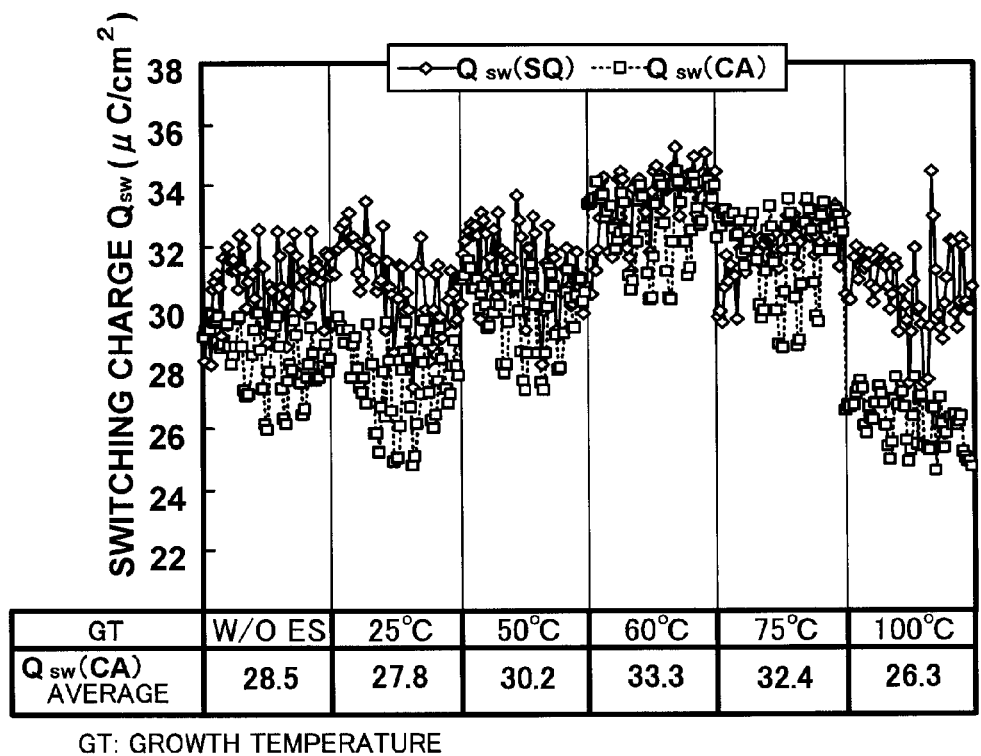
FIG. 22 is a graph illustrating respective quantities of switching charges of samples that are formed while changing forming conditions of an upper electrode of a capacitor constituting the semiconductor device according to the second embodiment of the present invention.

FIG. 22 illustrates quantities of switching charges (quantities of inverted charges) $Q_{SW}$ of samples when a plurality of ferroelectric capacitors $Q_2$ formed while changing the growth temperature condition of the second conductive oxide film 58 constituting the capacitor upper electrode 61, i.e., the $IrO_2$ film, were measured respectively. In FIG. 22, W/OES denotes the case where the second conductive oxide film 58 was formed under the above (I) condition. Here, the applied voltage in measuring a quantity of inverted charges was set to ±1.8 V.

As the sample of the ferroelectric capacitor $Q_2$, two types whose size is different were prepared. The first type sample was 56 same discrete capacitors, an each planar shape of which is a square of 50 µm×50 µm and which are formed mutually discretely on the silicon substrate 1. A quantity of switching charges is indicated as $Q_{SW}$(SQ).

The second type sample was such a cell array that a cell area in which 5156 same capacitors, an each planar shape of which is a square of 0.7 µm×0.7 µm, are formed densely is formed at 56 locations. A quantity of switching charges is indicated as $Q_{SW}$(CA).

According to FIG. 22, when a film forming temperature of the $IrO_2$ film constituting the second conductive oxide film 58 was not controlled or the film was formed at 25° C., a quantity of switching charges of $Q_{SW}$(CA) became small. The reason why a quantity of switching charges became small is that, when a film forming temperature of the $IrO_2$ film constituting the second conductive oxide film 58 was not controlled or the film was formed at 25° C., the $IrO_2$ film goes to an amorphous state and thus the void is readily caused in the film by the subsequent annealing.

Figure 23:
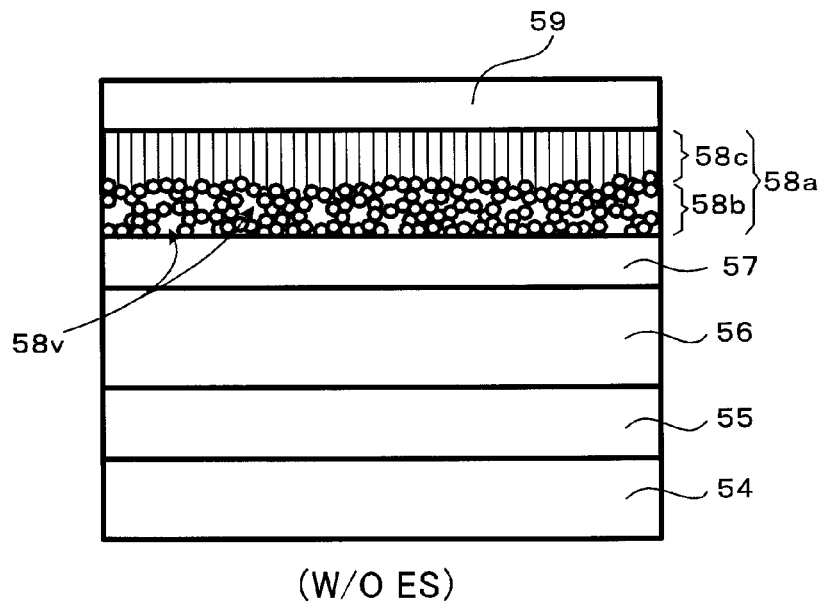
FIG. 23 is a sectional view illustrating a capacitor constituting a semiconductor device used for reference purposes.

For example, as illustrated in the ferroelectric capacitor for reference purposes in FIG. 23, upon growing a second conductive oxide film 58a, a film forming power is changed without temperature control such that an amorphous film is formed as a lower layer portion 58b and a crystal film is formed as an upper layer portion 58c. An event that the upper layer portion is crystallized is caused due to an increase of a substrate temperature during the film formation. In this case, an abnormal growth did not appear in the second conductive oxide film 58a. In addition, the symbol BD shows a void in FIG. 23.

When the Ir metal film 59 is formed on the second conductive oxide film 58a having such layer structure and then a hard mask having a stacked structure consisting of a TiN film and a silicon oxide TEOS film is formed on the Ir metal film 59, the amorphous lower layer portion 58b of the second conductive oxide film 58a is crystallized by the annealing in growing the hard mask. That is, the crystals in the amorphous portion of the $IrO_2$ film as the lower layer portion 58b is grown gradually and also voids 58v such as the oxygen defects, or the like are caused between the crystals.

These voids 58v act as the entering path of the hydrogen or the moisture. Therefore, in the step of forming the multilayer interconnection over the ferroelectric capacitor, the hydrogen, or the like enters into the second conductive oxide film 58a and the first conductive oxide film, so that the ferroelectric film 57 is deteriorated and finally the electric characteristics are deteriorated. In addition, in the step of forming the multilayer interconnection, a peeled-off film of the ferroelectric capacitor is easily caused.

Also, as illustrated in FIG. 20(b), in forming the W plug 70 on the capacitor upper electrode 61, the W film must be formed at a high temperature in a reducing atmosphere. Most of the hydrogen generated in forming the film is blocked by the TiN film as a glue film of the W plug. When the hydrogen is supplied excessively, such hydrogen passes through the block of the TiN film, and the hydrogen enters into the capacitor upper electrode 61. Thus, the $IrO_x$ in the capacitor upper electrode is reduced and a volume shrinkage is caused, so that the voids are produced between the adhesive layer 67 of the W plug 70 and the capacitor upper electrode 61. Therefore, a contact resistance of the capacitor upper electrode 61 becomes unstable.

Figure 24:
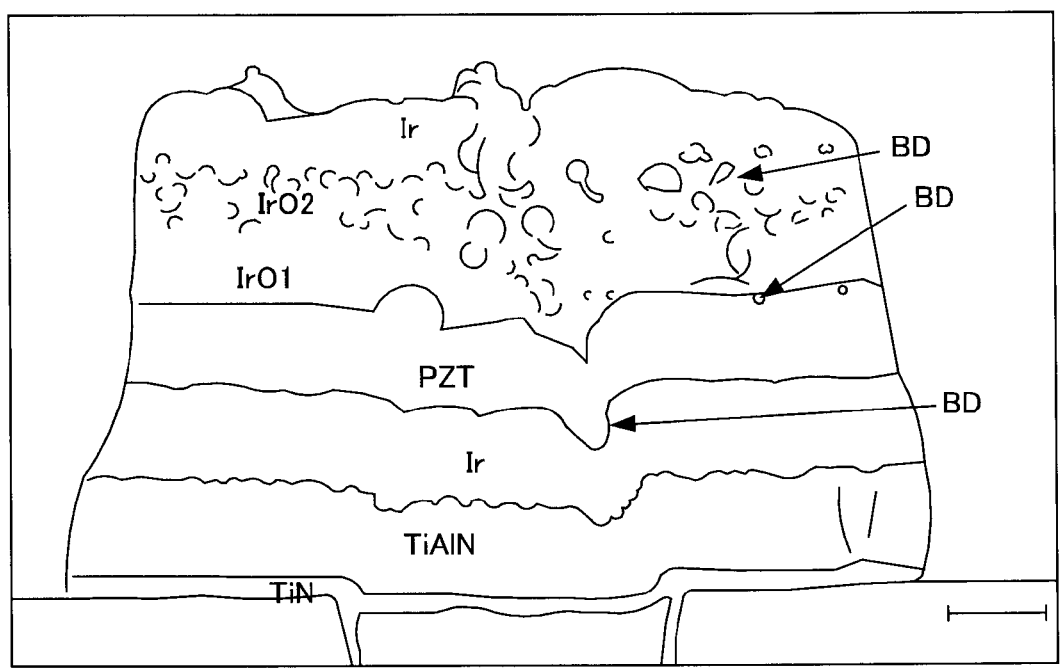
FIG. 24 is a sectional view based on TEM microphotograph illustrating a section of a capacitor constituting the semiconductor device used for reference purposes.

A TEM microphotograph of the ferroelectric capacitor used for reference purposes after the fifth layer interconnection is formed is illustrated in FIG. 24. A large number of voids appeared in the second layer $IrO_2$ of the capacitor upper electrode. These voids have the hydrogen or moisture resistance capability, and cause the deterioration of the ferroelectric film in the subsequent steps.

Figure 25A:
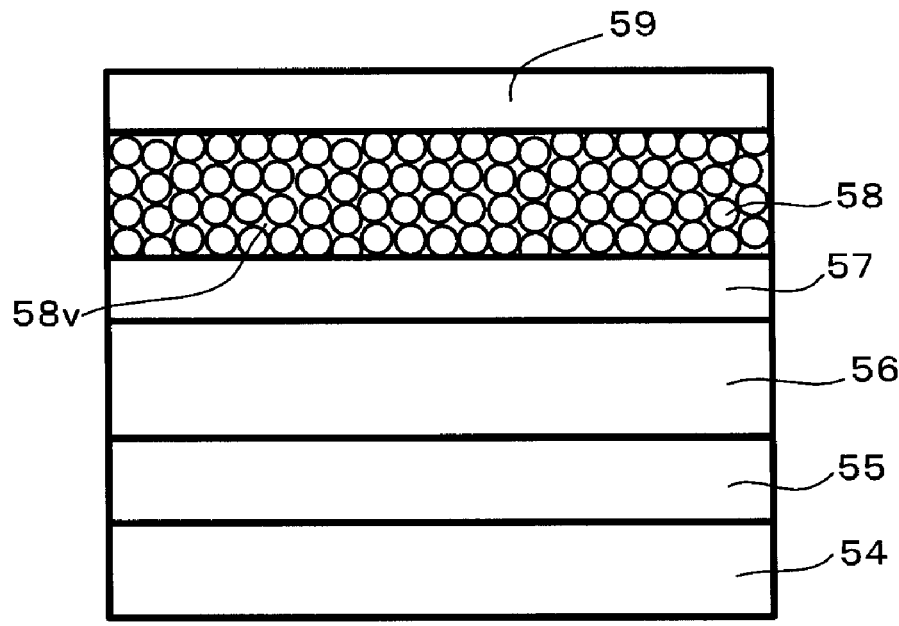
FIGS. 25(a) and 25(b) are sectional views illustrating an example of a crystal state of a second conductive oxide film in a capacitor constituting the semiconductor device according to the second embodiment of the present invention.

In contrast, in the second embodiment of the present invention, as illustrated in FIG. 25(a), the second conductive oxide film 58 is formed as the stable microcrystal $IrO_2$ when a film forming temperature is controlled at 50° C. to 75° C. The small crystal grains whose grain diameter is about 20 nm to 50 nm are uniformly bonded like the stone wall or the column in the microcrystal $IrO_2$, and the number the void 58v as the oxygen defect is small. Therefore, the entering path of the hydrogen or the moisture becomes very fine or hardly exists in the second conductive oxide film 58.

Figure 25B:
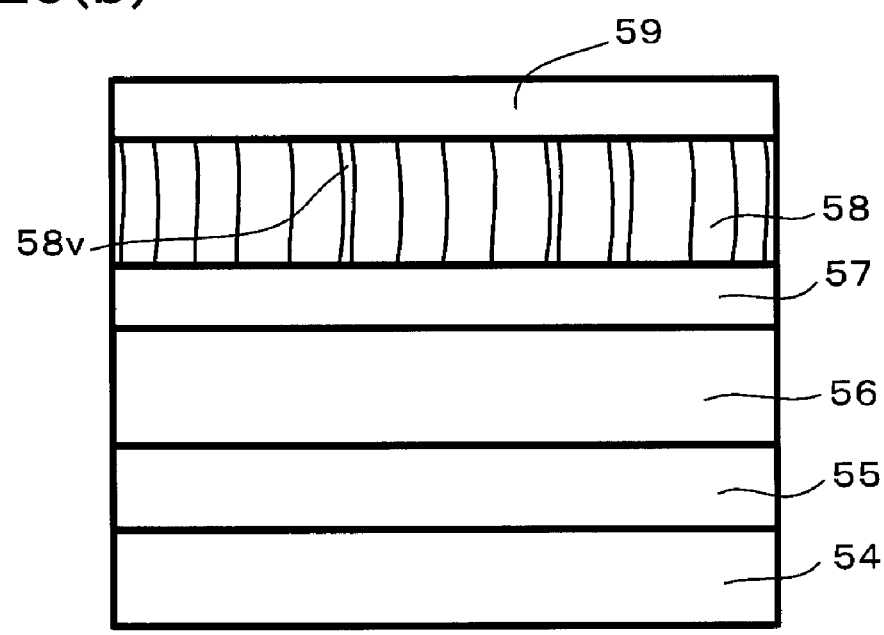

Therefore, even though the hydrogen enters into the second conductive oxide film 58 through the metal film 59, the hydrogen or moisture does not smoothly pass through the first conductive oxide film 57, and thus the deterioration of the ferroelectric film 56 is suppressed. The microcrystals in the second conductive oxide film 58 are crystallized by the subsequent heat treatment, and are shaped like the column as illustrated in FIG. 25(b).

As illustrated in FIG. 8 to FIG. 11 in the first embodiment, when a film forming temperature exceeds 100° C., the crystals or the crystals and the microcrystals exist in the $IrO_2$ film at a time of growth. Therefore, the $IrO_2$ film constituting the second conductive oxide film 58 according to the present embodiment easily causes the abnormal growth. When the voids or the abnormal growths are present in the $IrO_2$ film, the process-deterioration resistant capability of the capacitor is weakened.

In contrast, when a film forming temperature of $IrO_2$ is set around 60° C., the $IrO_2$ film is made of uniform microcrystals whose grain diameter is 35 nm to 45 nm. The $IrO_2$ film contains the uniform stone wall-like or the columnar crystals even when the heat treatment is applied thereafter, and the process-deterioration resistant capability is enhanced.

For the reasons mentioned above, in FIG. 22, a quantity of the capacitor switching charges in the second conductive oxide film 58 that is formed at a temperature near 60° C. is increased largest. Also, the electric characteristics of the capacitor whose films are formed under the same conditions could show the unchanged results in the process out.

Figure 26:
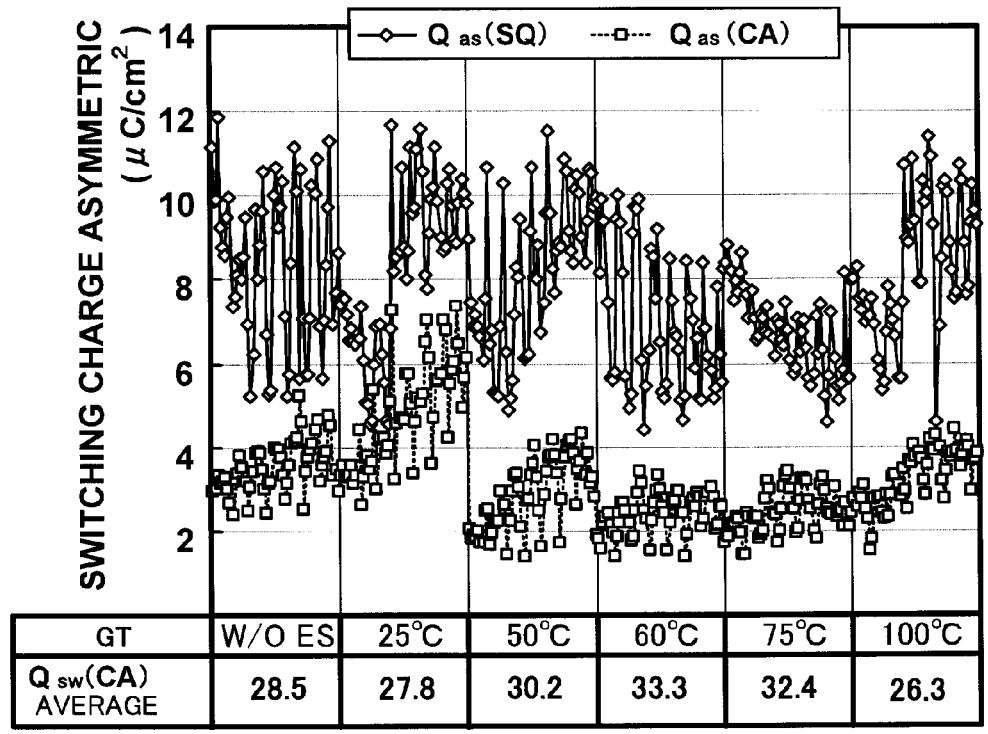
FIG. 26 is a graph illustrating respective asymmetries of samples that are formed while changing forming conditions of an upper electrode constituting the semiconductor device according to the second embodiment of the present invention.

Also, asymmetry of a quantity of the switching charges is illustrated in FIG. 26. It is appreciated from FIG. 26 that asymmetry of the capacitor whose films are formed at 50° C. or more is reduced. That is, a shift of the hysteresis curve is small, and the Imprint-resistant characteristic of the capacitor may be improved.

Figure 27:
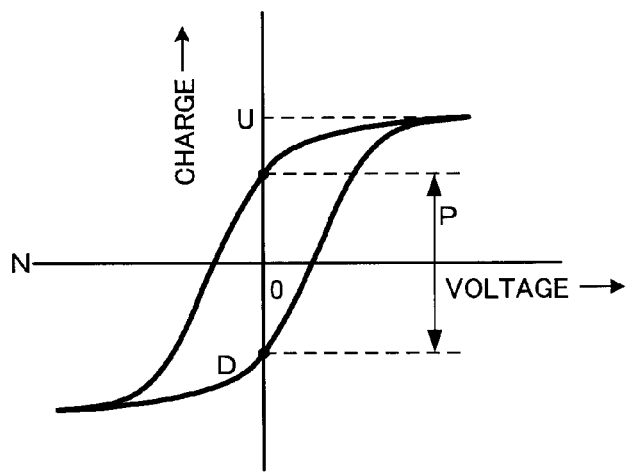
FIG. 27 is a view illustrating the voltage-charge hysteresis characteristic of a ferroelectric capacitor.

By reference to FIG. 27, a quantity of switching charges $Q_{SW}$ is expressed by $Q_{SW}=((N-U)+(P-D))/2$, and asymmetry $A_{ssy}$ is expressed by $A_{ssy}=((N-U)-(P-D))/2$.

Figure 28A:
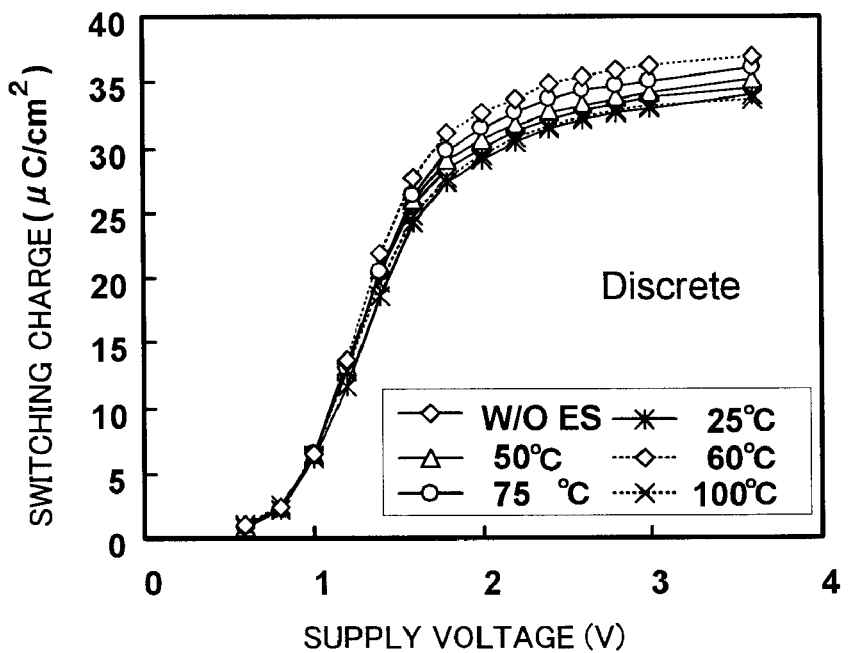
FIGS. 28(a) and 28(b) are views illustrating the supply voltage-switching charge quantity characteristics of a ferroelectric capacitor when forming conditions of the semiconductor device according to the second embodiment of the present invention are changed.

When the correlation between an applied voltage and a quantity of switching charges $Q_{SW}$ of the ferroelectric capacitor in the ferroelectric memory was measured, the results of the characteristics illustrating FIG. 26 were obtained. FIG. 28(a) is the characteristic view of the ferroelectric capacitor having the above discrete structure, and FIG. 28(b) are the characteristic view of the ferroelectric capacitor having the above cell array structure.

Figure 28B:
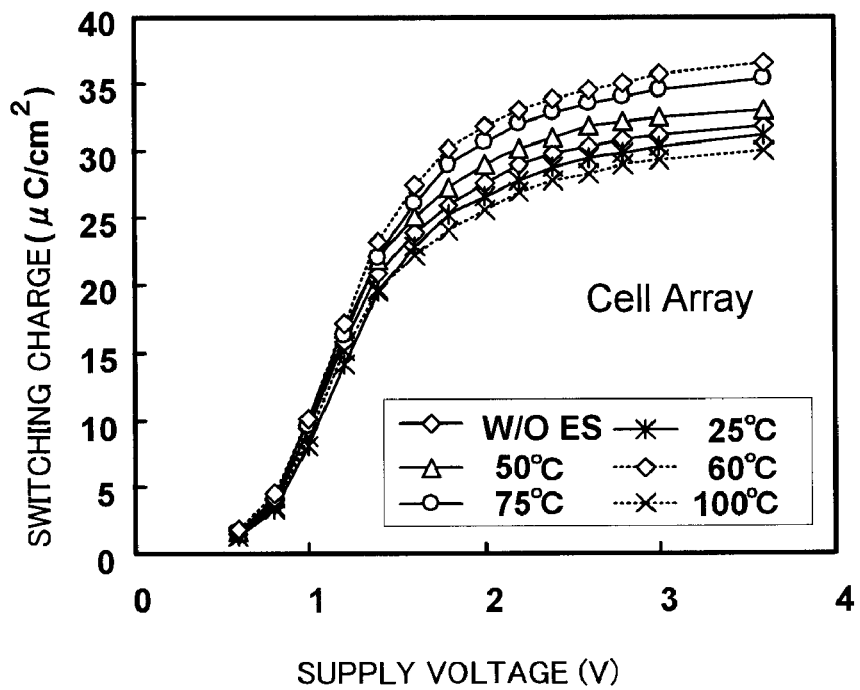

It is appreciated from FIGS. 28(a) and 28(b) that, in the capacitor in which the second conductive oxide film 58 is formed at 50° C. to 75° C., a large quantity of switching charges $Q_{SW}$ may be obtained from a low voltage to a saturation voltage of the applied voltage and also a gradient is increased. This indicates the fact that the ferroelectric capacitor having the second conductive oxide film 58 is formed at 50° C. to 75° C. is highly resistant to the process deterioration and is extremely suitable for the ferroelectric memory that is operated at a low voltage.

From the above result, in the present embodiment, the first conductive oxide film 57 made of $IrO_x$ formed on the ferroelectric film 56 improves the boundary between the capacitor upper electrode 61 and the ferroelectric film 56. Also, the voids are hard to occur in the second conductive oxide film 58 that is formed on the first conductive oxide film 57 and is made of microcrystalline $IrO_y$ whose degree of oxidation is high, and occurrence of the crumbliness (voids) phenomenon of $IrO_y$ in the capacitor upper electrode 61 is prevented.

Accordingly, deterioration of a film quality of the second conductive oxide film 58 caused by the subsequent steps may be suppressed, the abnormal growth of the iridium oxide may be eliminated, and the finely crystallized capacitor upper electrode may be obtained. As a result, such ferroelectric capacitor is extremely suitable for the next-generation ferroelectric memory that is operated at a low voltage.

Third Embodiment

FIGS. 29(a), 29(b), 30(a), and 30(b) are sectional views illustrating a ferroelectric memory (semiconductor device) according to a third embodiment of the present invention and a method of manufacturing the same. In FIG. 29 and FIG. 30, the same reference symbols as those in FIG. 12 to FIG. 21 denote the same elements.

First, as illustrated in FIG. 13(a), the similar processes to those in the second embodiment are applied until the fourth and fifth conductive plugs 51, 52 are formed on the second interlayer insulating film 47. According to the CMP to form the fourth and fifth conductive plugs 51, 52, normally a height of the upper surfaces of the fourth and fifth conductive plugs 51, 52 becomes lower than an upper surface of the second interlayer insulating film 47, and a recess is ready to be formed in the second interlayer insulating film 47 around the fourth and fifth conductive plugs 51, 52. A depth of the recess is 20 nm to 50 nm, typically about 50 nm.

The recess has an influence on respective face orientations of a plurality of films from the underlying conductive film 53 to the ferroelectric film 56, which are formed sequentially on the second interlayer insulating film 47. But such influence may be reduced by steps described as follows.

Figure 29A:
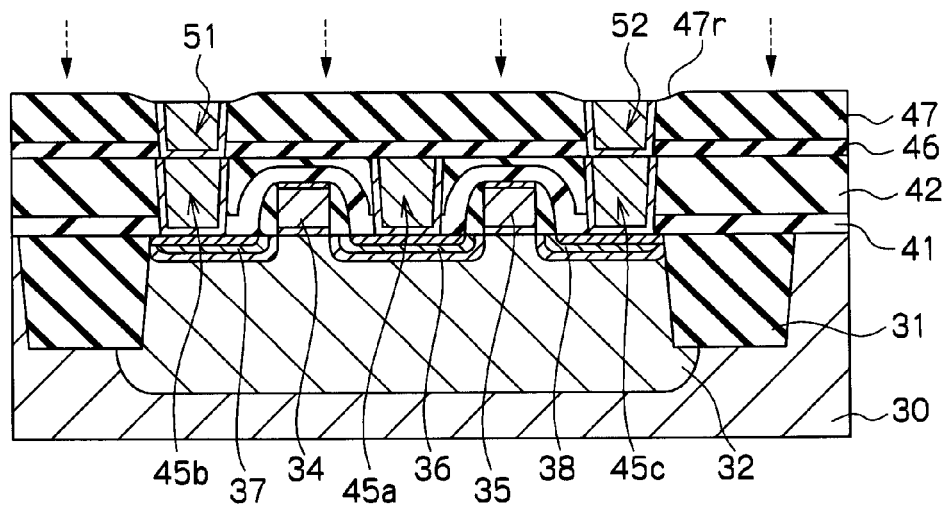
FIGS. 29(a) and 29(b) are sectional views illustrating steps of forming a semiconductor device according to a third embodiment of the present invention.

Then, as illustrated in FIG. 29(a), the surface of the second interlayer insulating film 47 is processed by the ammonia ($NH_3$) plasma. Thus, the NH group is bonded to the oxygen atoms on the surface of the second interlayer insulating film 47.

Figure 29B:
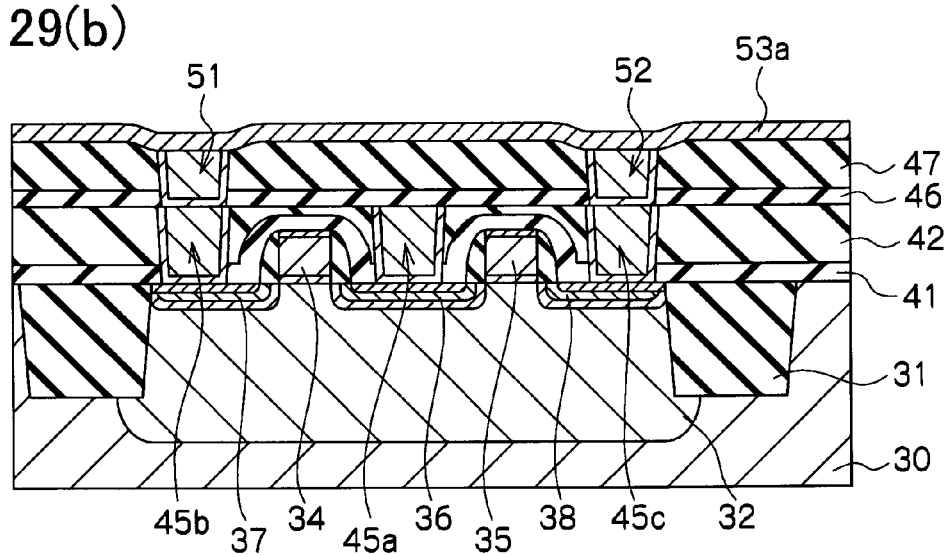

Upon stacking the Ti atoms constituting the underlying conductive film 53 on the second interlayer insulating film 47, the Ti atom is hard to be captured by the oxygen atom of the second interlayer insulating film 47 on the surface of the second interlayer insulating film 47 to which the NH group is bonded. Thus, the Ti atom may move freely on the surface of the second interlayer insulating film 47. As a result, as illustrated in FIG. 29(b), a Ti film 53a that is self-organized in the (002) orientation is formed on the second interlayer insulating film 47.

In this ammonia plasma process, the parallel-plate plasma processing equipment in which the opposing electrodes are provided in positions that is separated from the semiconductor substrate 30 by about 9 mm (350 mils), for example, is employed. Also, an ammonia gas is supplied at a flow rate of 350 sccm to the processing vessel that is held at a substrate temperature of 400° C. at a pressure of 266 Pa (2 Torr), a high-frequency power of 100 W is applied to the silicon substrate 30 side at 13.56 MHz, and a high-frequency power of 55 W is applied to the opposing electrodes at 350 kHz.

Also, as the conditions of forming the Ti film, for example, an Ar atmosphere of 0.15 Pa and a substrate temperature of 20° C. are set in the sputter equipment in which a distance between the silicon substrate 30 and the Ti target is set to 60 mm, and a DC sputter power of 2.6 kW is supplied between the target and the substrate for 35 sec. Accordingly, the Ti film 53a having the strong (002) orientation is formed on the second interlayer insulating film 47. The Ti film 53a is formed to have a thickness of 100 nm, for example.

Figure 30A:
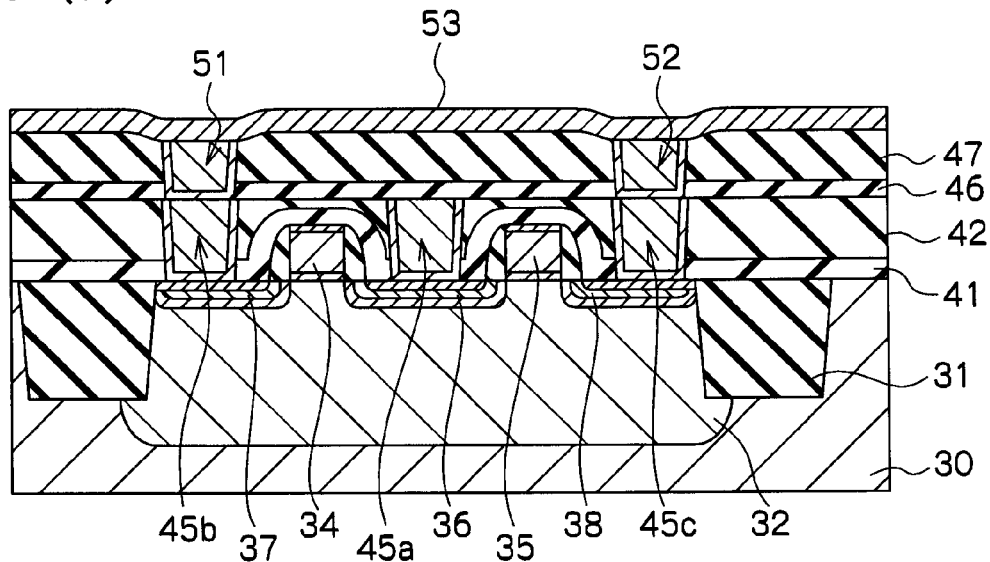
FIGS. 30(a) and 30(b) are further sectional views illustrating the steps of forming the semiconductor device according to the third embodiment of the present invention.

Then, the silicon substrate 30 is put in the nitrogen atmosphere, then the heat treatment is applied at a substrate temperature of 650° C. for 60 sec by the RTA, and thus the Ti film 53a is nitrided. Accordingly, as illustrated in FIG. 30(a), the underlying conductive film 53 made of TiN having the (111) orientation is formed on the second interlayer insulating film 47. It is preferable that a thickness of the underlying conductive film 53 should be set to 100 to 300 nm. In the present embodiment, a thickness is set to about 100 nm.

In this case, the underlying conductive film 53 is not limited to the titanium nitride film. Any one of a tungsten film, a silicon film, and a copper film may be formed as the underlying conductive film 53.

Figure 30B:
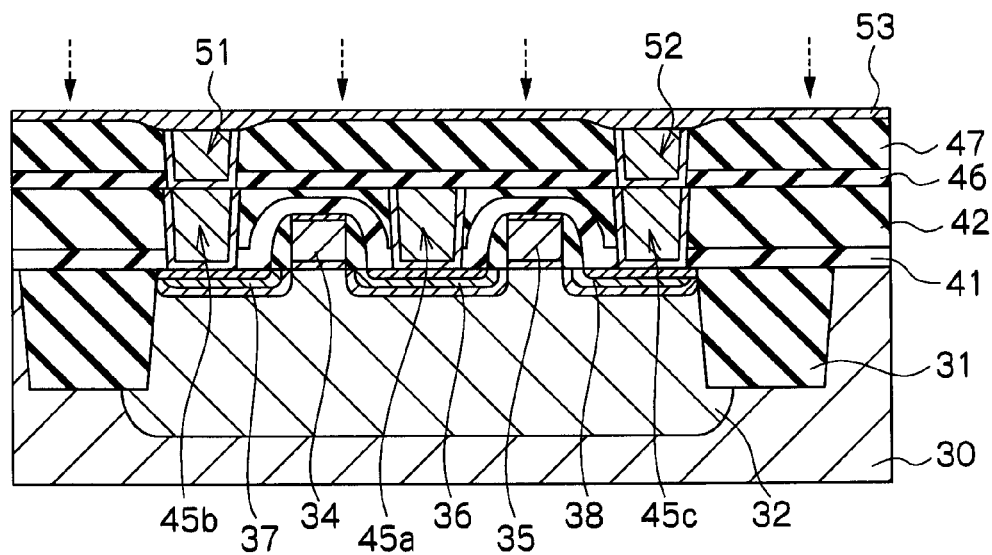

By the way, a concave portion is formed on an upper surface of the underlying conductive film 53 made of TiN depending on a depth of a recess 47r and the forming conditions of the Ti film 53a. In FIG. 30(b), such concave portion is depicted. Such concave portion may deteriorate the crystallinity of the ferroelectric film 56 formed over the underlying conductive film 53.

Therefore, in the present embodiment, as illustrated in FIG. 30(b), an upper surface of the underlying conductive film 53 is polished by the CMP method such that the upper surface is planarized and the concave portion is removed. The slurry employed by this CMP method is not particularly limited. In the present embodiment, SSW 2000 (product name) manufactured by Cabot Miroelectronics Corporation is employed.

A thickness of the underlying conductive film 53 is processed by the CMP method and is varied due to a polishing error in a plane of the silicon substrate 30 or every silicon substrate 30. In the present embodiment, with regard to such variation, a target value of a thickness of the underlying conductive film 53 after the CMP is set to 50 nm to 100 nm, more preferably 50 nm, by controlling a polishing time.

An upper surface of the underlying conductive film 53 that is in an as-polished state yet is easily distorted by the polishing. Then, when the lower electrode film 55 of the capacitor is formed over the underlying conductive film 53 in which crystal distortion is caused, the lower electrode film 55 picks up such crystal distortion and its crystallinity is deteriorated. In turn, the ferroelectric characteristic of the overlying ferroelectric film 56 is deteriorated.

Therefore, as illustrated in FIG. 30(b), the polished surface of the underlying conductive film 53 is exposed to the $NH_3$ plasma such that the crystal distortion of the underlying conductive film 53 is not transferred to the film formed over the underlying conductive film 53.

Accordingly, the elements constituting the oxygen diffused barrier film 54 formed subsequently are ready to move on the upper surface of the underlying conductive film 53, and the crystal orientation of the oxygen diffused barrier film 54 is improved. As a result, the ferroelectric characteristics of the lower electrode film 55 and the ferroelectric film 56 formed on the oxygen diffused barrier film 54 are improved.

As described above, the processes applied after the polished surface of the underlying conductive film 53 is exposed to the $NH_3$ plasma are similar to those in the second embodiment.

As a result, according to the present embodiment, not only the crystal orientation of the lower electrode film 55 and the ferroelectric film 56 is improved but also the same advantages as those in the second embodiment may be achieved.

Fourth Embodiment

FIGS. 31(a), 31(b), 32(a), and 32(b) are sectional views illustrating steps of forming a semiconductor device according to a fourth embodiment of the present invention. In FIG. 31 and FIG. 32, the same reference symbols as those in FIG. 12 to FIG. 21 denote the same elements.

First, as illustrated in FIG. 30(a), the steps required until the underlying conductive film 53 is formed on the second interlayer insulating film 47 are similar to those in the third embodiment.

Figure 31A:
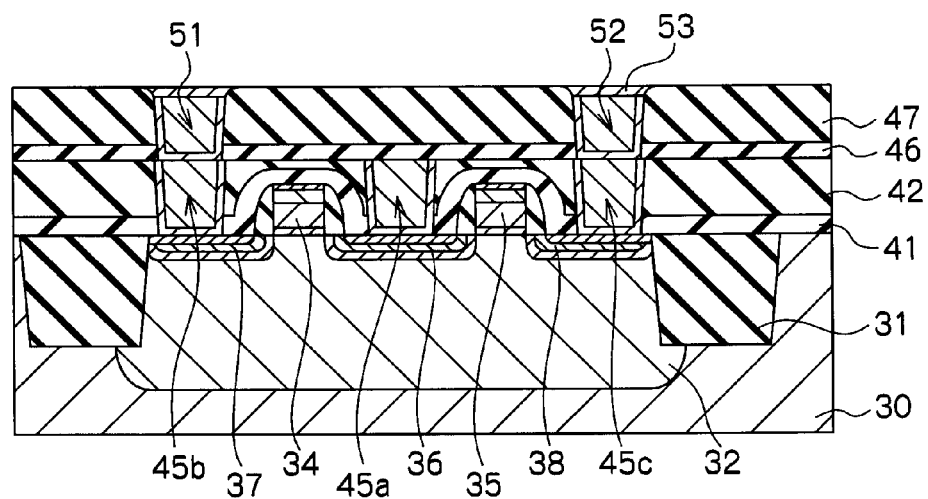
FIGS. 31(a) and 31(b) are still further sectional views illustrating the steps of forming a semiconductor device according to a fourth embodiment of the present invention.

Then, as illustrated in FIG. 31(a), the underlying conductive film 53 is polished by the CMP method such that the underlying conductive film 53 is left only on the fourth and fifth conductive plugs 51, 52 and the peripheral recesses 47r.

Figure 31B:
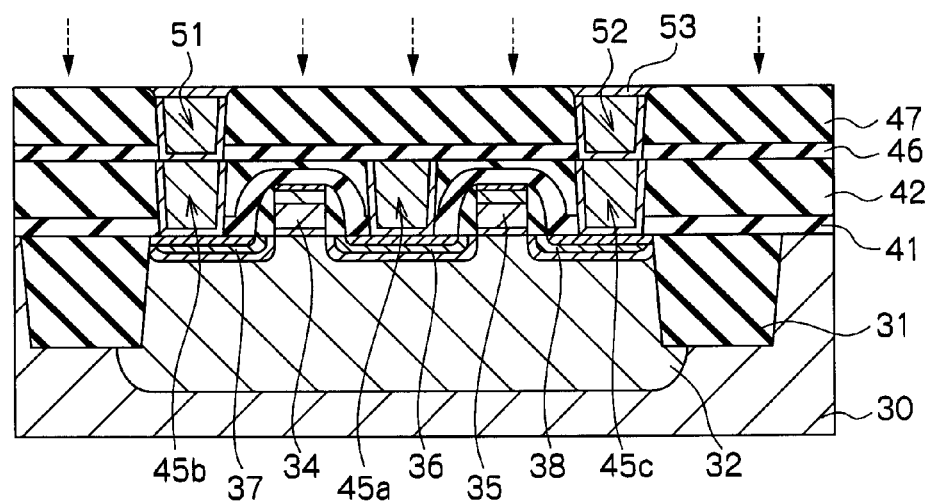

Then, as illustrated in FIG. 31(b), the ammonia plasma is applied to the underlying conductive film 53 and the second interlayer insulating film 47 on the fourth and fifth conductive plugs 51, 52.

Figure 32A:
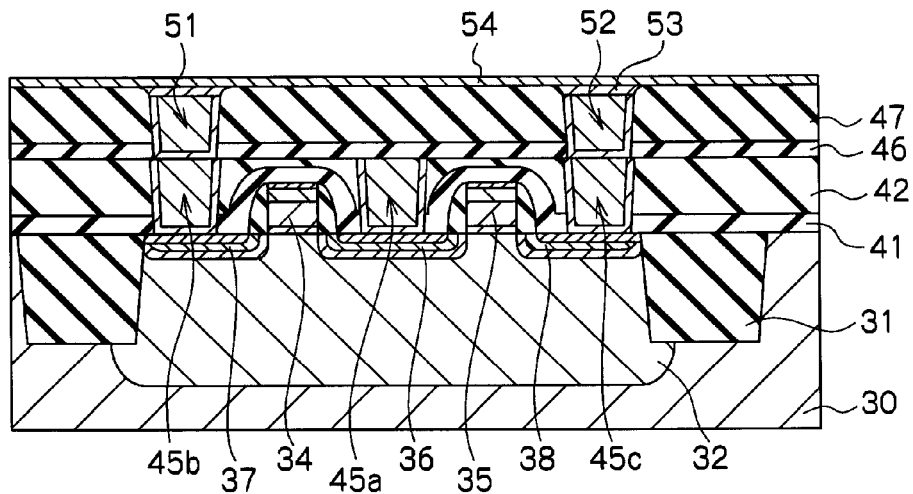
FIGS. 32(a) and 32(b) are still further sectional views illustrating the steps of forming the semiconductor device according to the fourth embodiment of the present invention.

Accordingly, as illustrated in FIG. 32(a), the crystal orientation of the oxygen diffused barrier film 54 formed on the underlying conductive film 53 and the second interlayer insulating film 47 is improved. Like the third embodiment, the crystal orientation of the lower electrode film 55 and the ferroelectric film 56 formed thereon is also improved.

Figure 32B:
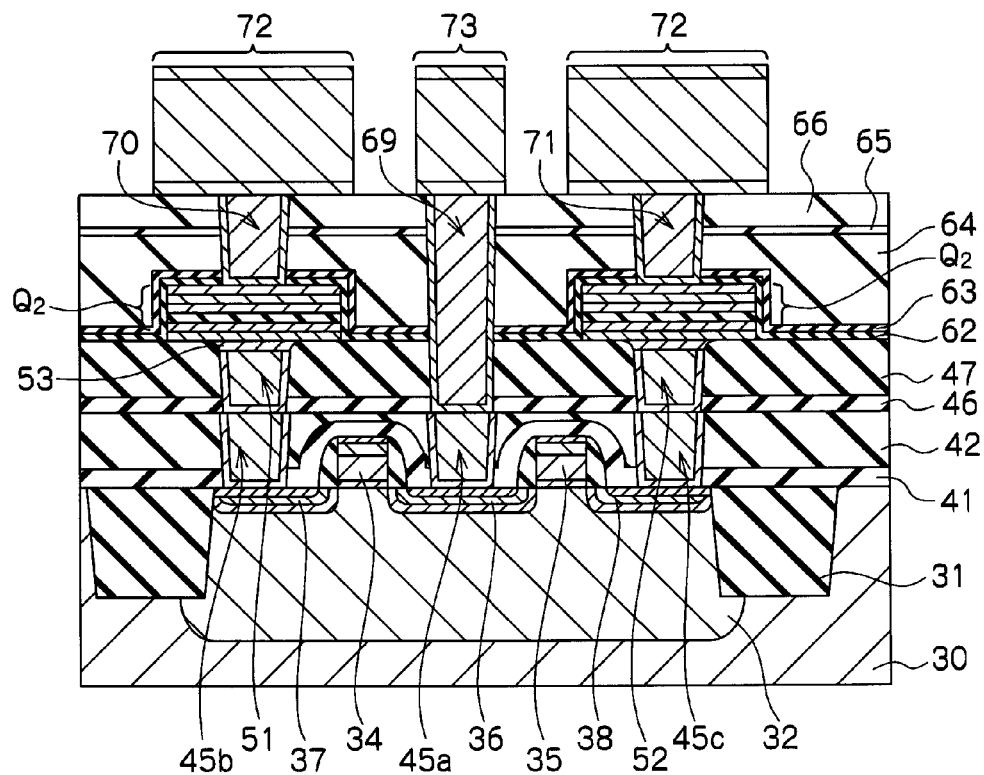

As described above, the processes applied after the polished surfaces of the underlying conductive film 53 and the second interlayer insulating film 47 are exposed to the $NH_3$ plasma follow up the same steps as those in the third embodiment. As a result, the semiconductor device having the structure illustrated in FIG. 32(b) is formed.

Fifth Embodiment

FIGS. 33(a), 33(b), 34(a), and 34(b) are sectional views illustrating steps of forming a semiconductor device according to a fifth embodiment of the present invention. In FIG. 33 and FIG. 34, the same reference symbols as those in FIG. 12 to FIG. 21 denote the same elements.

First, as illustrated in FIG. 12(a), the steps required until the first interlayer insulating film 42 is formed after the STI 31 and the p well 32 are formed on the silicon substrate 30 are similar to those in the first embodiment.

Figure 33A:
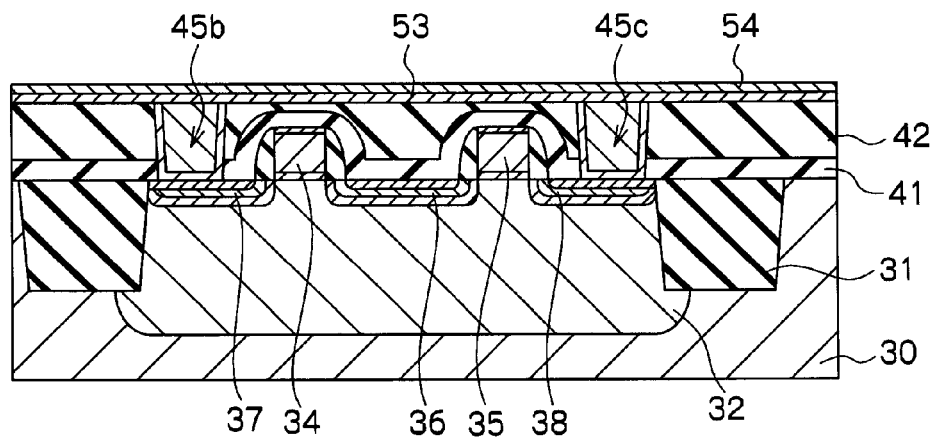
FIGS. 33(a) and 33(b) are sectional views illustrating steps of forming a semiconductor device according to a fifth embodiment of the present invention.

Then, as illustrated in FIG. 33(a), the cover insulating film 41 and the first interlayer insulating film 42 are patterned by the photolithography method. Thus, the second and third contact holes 42b, 42c from which the second and third source/drain regions 37, 38 located near both sides of the p well 32 are exposed respectively are formed. Then, the second and third conductive plugs 45b, 45c are formed in the second and third contact holes 42b, 42c respectively.

The method of forming the second and third conductive plugs 45b, 45c is similar to that in the first embodiment. Then, the underlying conductive film 53 is formed directly on the first interlayer insulating film 42, and then the oxygen diffused barrier film 54 is formed thereon.

The same method as that applied to the third embodiment and the fourth embodiment may be employed to form the underlying conductive film 53.

Figure 33B:
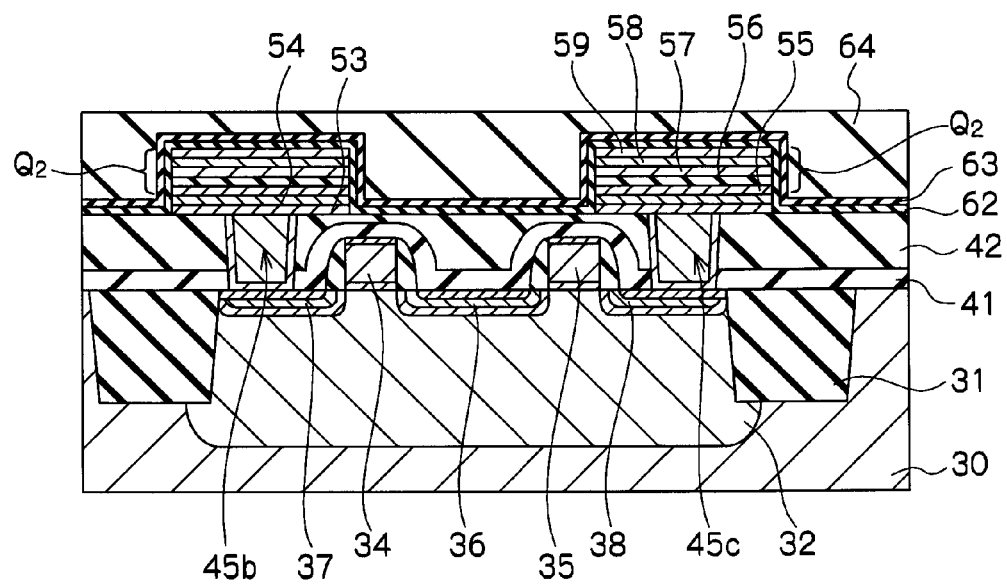

Then, as illustrated in FIG. 33(b), the structure from the formation of the underlying conductive film 53 to the third interlayer insulating layer 64 are formed by the same processes as those applied in the second embodiment.

Figure 34A:
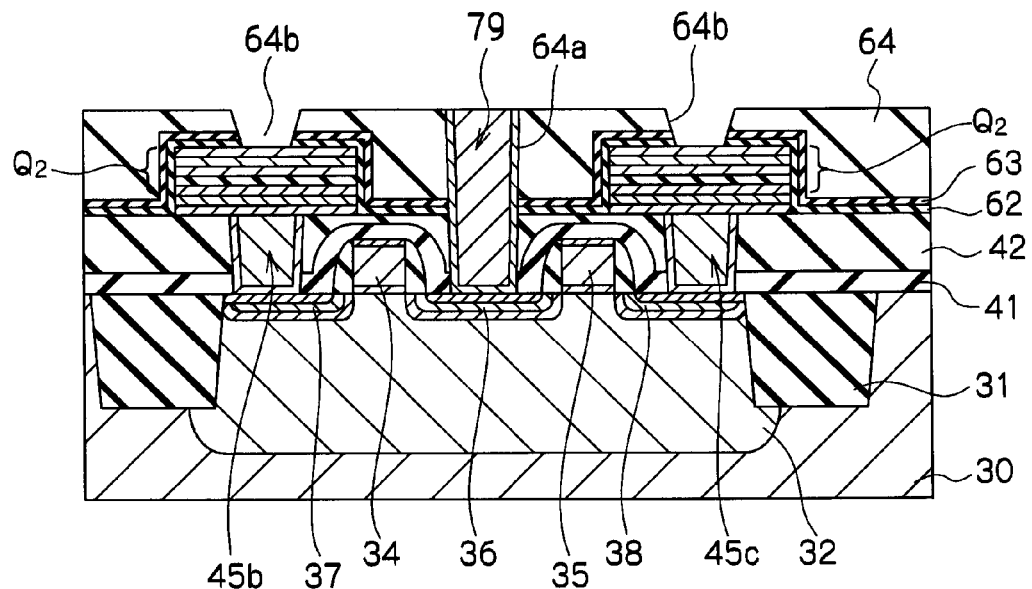
FIGS. 34(a) and 34(b) are further sectional views illustrating the steps of forming the semiconductor device according to the fifth embodiment of the present invention.

Then, as illustrated in FIG. 34(a), respective films from the third interlayer insulating layer 64 to the cover insulating film 41 on the first source/drain region 36 located at the center of the p-well 32 are etched partially by the photolithography method. Thus, a contact hole 64a is formed. Then, a conductive plug 79 is buried in the contact hole 64a. The conductive plug 79 is formed by the same method as that applied to form the sixth conductive plug 69 in the second embodiment.

Then, a via hole 64b is formed on the ferroelectric capacitors $Q_2$ respectively by the similar method to that in the second embodiment.

Figure 34B:
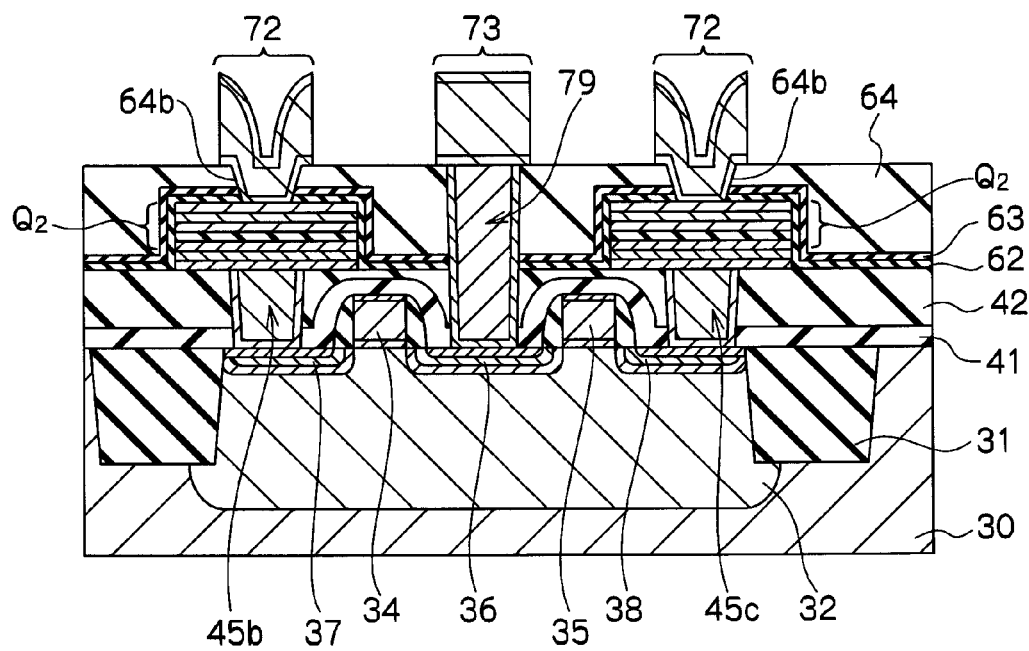

Then, as illustrated in FIG. 34(b), the interconnections 72 connected to the capacitor upper electrode 61 through the via hole 64b respectively are formed on the third interlayer insulating layer 64.

According to the above embodiment, only the step of forming the conductive plug 79 is applied once to the third interlayer insulating layer 64. Thus, the number of steps is reduced in contrast to the second embodiment.

In the above embodiment, the PZT is employed as the ferroelectric film. In this case, the film whose crystal structure has a Bi-layer structure or a perovskite-type structure by the heat treatment, for example, may be formed. As such film, a film that is expressed by a general formula $XYO_3$ (X, Y is an element) such as PZT, SBT, BLT, in which La, Ca, Sr, Si, and/or the like is microdoped, Bi-based layer compound, or the like may be listed in addition to the PZT film. Also, the ferroelectric film may be formed of any one of the sol-gel method, the organic metal decomposing method, the CSD (Chemical Solution Deposition) method, the chemical vapor deposition method, the epitaxial growth method, the sputter method, or the MOCVD method.

Sixth Embodiment

As steps of forming a semiconductor device according to a sixth embodiment of the present invention, substantially similar steps to those in the second embodiment will be employed except the upper electrode of the ferroelectric capacitor. Therefore, steps of forming the upper electrode will be explained hereunder.

First, steps required until the ferroelectric film 56 is formed over the silicon substrate 30, as illustrated in FIG. 14(a), follow the second embodiment.

Figure 35A:
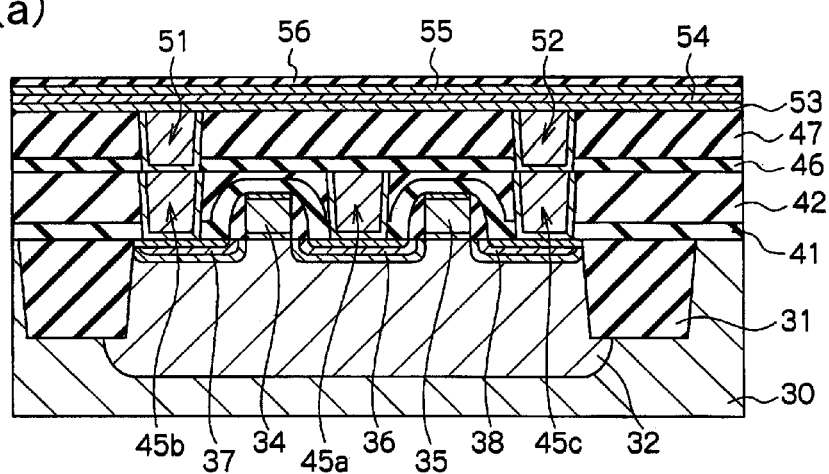
FIGS. 35(a) to 35(c) are sectional views illustrating steps of forming a semiconductor device according to a sixth embodiment of the present invention.

Then, as illustrated in FIG. 35(a), the first conductive oxide film 57 is formed on the ferroelectric film 56. In forming the first conductive oxide film 57, first the $IrO_x$ film whose thickness is 20 nm to 70 nm, e.g., 25 nm or 50 nm, and which is crystallized at a time point of film formation is formed on the ferroelectric film 56. As the film forming conditions, for example, a film forming temperature is set to 300° C., Ar and $O_2$ are employed as a film forming gas, a flow rate of Ar is set to 140 sccm, a flow rate of $O_2$ is set to 60 sccm, and a sputter power is set to about 1 kW.

In forming the first conductive oxide film 57, the silicon substrate 30 is not electrostatic-chucked onto a wafer stage.

Then, the silicon substrate 30 is annealed by the RTA method. This annealing may crystallize perfectly the ferroelectric film 56 to compensate the oxygen defect in the PZT film constituting the ferroelectric film 56, and also may recover a film quality of the first conductive oxide film 57 that is damaged by the plasma. As the conditions of the RTA method, a substrate temperature being put in the annealing atmosphere is set to 725° C., $O_2$ is introduced into the annealing atmosphere at a flow rate of 200 sccm, Ar is introduced into the annealing atmosphere at a flow rate of 1800 sccm, and an annealing time is set to 60 sec.

Figure 35B:
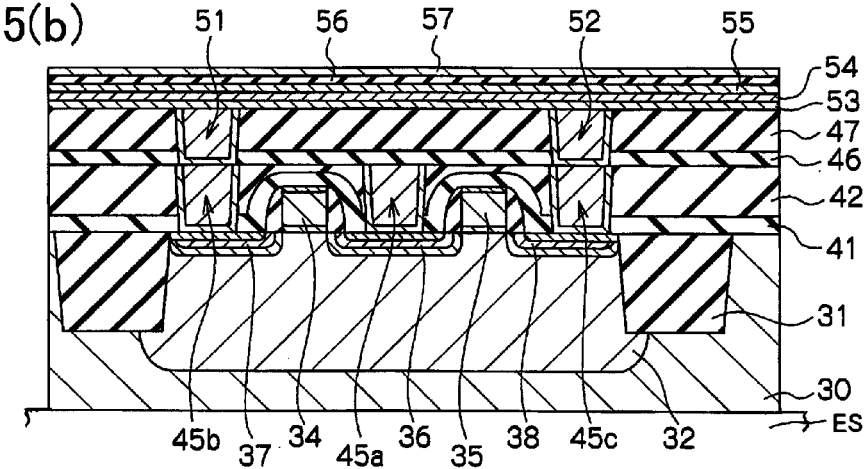

Then, as illustrated in FIG. 35(b), the second conductive oxide film 58 made of $IrO_y$ and having a thickness of 50 nm to 200 nm, preferably 100 nm to 180 nm, is formed on the first conductive oxide film 57 made of $IrO_x$ by the sputter method. At this time, a film forming temperature is set in a temperature range of 30° C. or more but 100° C. or less, preferably 50° C. or more but 75° C. or less, more preferably 60° C. It is desirable that, in the second conductive oxide film 58, the $IrO_y$ should be microcrystallized at a time point of film formation and a large number of microcrystals should be bonded like a stone wall or a column.

Here, in order to set a film forming temperature to 60° C., for example, the silicon substrate 30 is fixed by the electrostatic chuck ES.

The second conductive oxide film 58 made of $IrO_y$ and formed under the above conditions contains no abnormal oxidation and gives the fine crystal film. At this time, in order to suppress the process deterioration, like the first embodiment, the $IrO_y$ film has a composition that is close to a stoichiometric composition of $IrO_2$. Therefore, a catalyst function for the hydrogen is hard to occur, a reduction of the ferroelectric film 56 due to the hydrogen radical is suppressed, and a hydrogen resistance of the capacitor is improved.

In this case, the first and second conductive oxide films 57, 58 may be formed of the material illustrated in the second embodiment or the stacked structure. Also, in forming the ferroelectric film 56 and the first and second conductive oxide films 57, 58, the method containing the steps in the second to fifth example illustrated in the first embodiment may be employed.

Then, the silicon substrate 30 is annealed by the RTA method. As the conditions, for example, a substrate temperature is set to 700° C., $O_2$ and Ar are introduced into the atmosphere at a flow rate of 20 sccm and 2000 sccm respectively, and an annealing time of the substrate is set to 60 sec. According to this annealing, not only the adhesion of the ferroelectric film 56 and the first and second conductive oxide films 57, 58 is improved, but also the crystallinity of the first and second conductive oxide films 57, 58 is improved and the defects such as the oxygen defect, etc. are eliminated.

Figure 35C:
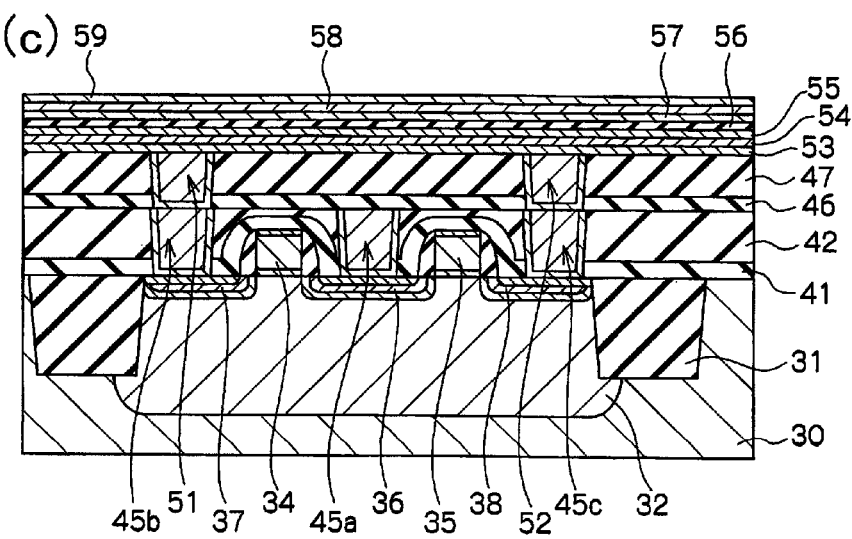

Then, as illustrated in FIG. 35(c), the metal film 59 having a thickness of 50 nm to 150 nm and made of a noble metal such as Ir, Ru, or the like or a noble metal containing material is formed on the second conductive oxide film 58 made of $IrO_y$. In the case of Ir, for example, the metal film is formed by the sputter method in which a substrate temperature is set to 400° C. and Ar is introduced into the film forming atmosphere at a flow rate of 199 sccm.

The metal film 59, the second conductive oxide film 58, and the first conductive oxide film 57 constitute at least a part of the capacitor upper electrode 61 of the ferroelectric capacitor.

As the subsequent steps, the same method as that in the second embodiment is employed.

Next, a film thickness of the second conductive oxide film 58 constituting the upper electrode will be explained in comparison with the prior art hereunder.

First, in order to compare the upper electrode constituting the ferroelectric capacitor in the present embodiment with that in the prior art, first to fourth upper electrodes, i.e., four types in total, are formed on a different wafer respectively.

The first upper electrode is formed under the conditions set forth in above Patent Literature 2. This method has the steps of forming the $IrO_x$ of 50 nm thickness as the first conductive oxide film under the similar conditions to those illustrated in the present embodiment, then annealing the oxide film, and then forming the $IrO_y$ as the second conductive oxide film. In this case, the substrate is put on the wafer stage in the film forming chamber not to operate the electrostatic chuck.

The $IrO_y$ forming step consists of two steps, i.e., first the film is formed to have a thickness of 75 nm while a flow rate of Ar is set to 100 sccm, a flow rate of $O_2$ is set to 100 sccm, and a film forming power is set to 1 kW, and then the film is formed to have a thickness of 25 nm by changing a film forming power to 2 kW. Accordingly, the second conductive oxide film having a thickness of 100 nm in total is formed.

The reason why a film forming power is increased in the middle of film formation is that, when the $IrO_y$ film is formed throughout a thickness of 100 nm at a film forming power of 1 kW, a degree of oxidation of the $IrO_y$ film is increased and an abnormal growth is caused on the surface.

In the prior art, while the $IrO_y$ film is formed, the substrate is put on the wafer stage not to operate the electrostatic chuck. Therefore, a substrate temperature is increased during the film formation. For example, after the $IrO_y$ film is grown up to a thickness of 100 nm under the two-step condition, a substrate temperature exceeds 100° C. under the influence of the film forming plasma.

Then, the annealing is applied by the same method as that in the second embodiment, and then the third conductive oxide film is formed on the second conductive oxide film to have a thickness of 100 nm.

The first upper electrode formed by such method is constructed by the $IrO_x$ film of 50 nm thickness, the $IrO_y$ film of 100 nm thickness, and the Ir film of 100 nm thickness. A total film thickness becomes 250 nm.

The second, third, and fourth upper electrodes constitute the ferroelectric capacitor in the semiconductor device according to the present embodiment respectively.

The second upper electrode is constructed by forming sequentially the $IrO_x$ film of 50 nm thickness, the $IrO_y$ film of 100 nm thickness, and the Ir film of 100 nm thickness.

The third upper electrode is constructed by forming sequentially the $IrO_x$ film of 25 nm thickness, the $IrO_y$ film of 125 nm thickness, and the Ir film of 100 nm thickness.

The fourth upper electrode is constructed by forming sequentially the $IrO_x$ film of 25 nm thickness, the $IrO_y$ film of 150 nm thickness, and the Ir film of 75 nm thickness.

Respective total film thicknesses of the above second to fourth upper electrodes become equal to a total film thickness of the first upper electrode. However, since a temperature of the substrate being held on the wafer stage by the electrostatic chuck is set to 60° C. illustrated in the second embodiment in forming the $IrO_y$ film, respective $IrO_y$ films of the second to fourth upper electrodes are different in film quality from the $IrO_y$ film of the first upper electrode. That is, an increase of a film forming temperature in forming the $IrO_y$ film is suppressed when the electrostatic chuck is used in its ON state.

After four types of upper electrodes were formed as above, steps required from the formation of the metal film 59 to the formation of the metal interconnection having the quintuple layer structure were executed on respective wafers, like the above illustrated in the second embodiment. Then, the monitor measurement was made after the process out.

The monitors as the measured objects are four types of ferroelectric capacitors, and these capacitors are formed in plural on different wafers respectively. The ferroelectric capacitor as the first monitor has the first upper electrode, the ferroelectric capacitor as the second monitor has the second upper electrode, the ferroelectric capacitor as the third monitor has the third upper electrode, and the ferroelectric capacitor as the fourth monitor has the fourth upper electrode. These monitors have a planar shape of 0.7 μm×0.7 μm respectively and correspond to a single bit monitor that causes readily the process deterioration respectively.

A distribution of the measured results of a quantity of inverted charges of a plurality of monitors, i.e., a plurality of ferroelectric capacitors, formed at plural locations of each wafer is given wafer by wafer in FIG. 36A, FIG. 36B, FIG. 36C, and FIG. 36D. Also, compared results of a center value and ±3σ (standard deviation) of the center value in each wafer in-plane distribution of a quantity of inverted charges are illustrated in FIG. 37.

As illustrated in FIG. 36A, and FIG. 37, a quantity of a single bit inverted charges $Q_{SW0}$ is very low in a plurality of first monitors having the first upper electrode formed by the conventional method respectively, and also a variation of the wafer in-plane distribution of $Q_{SW0}$ is wide. This is because a process-deterioration resistant capability of the first upper electrode is low.

When the process-deterioration resistant capability is low, the moisture or the hydrogen contained in the interlayer insulating film enters into the first upper electrode in the step of forming the multilayer interconnection structure after the capacitor is formed, and then destroys the ferroelectric property of the underlying ferroelectric film. As a result, in the first monitor, a quantity of inverted charges $Q_{SW0}$ in the wafer in-plane is totally small, and also the monitors whose quantity of single bit inverted charges $Q_{SW0}$ is below 15 μC/cm² exist by about half in the wafer.

In contrast, respective quantities of single bit inverted charges $Q_{SW0}$ of a plurality of second monitors according to the present embodiment have the characteristics illustrated in FIG. 36B, and FIG. 37, and are improved greatly in contrast to the characteristics of the first monitor having the conventional structure. However, when FIG. 36B illustrating the in-plane distribution of a quantity of single bit inverted charges is viewed, the monitors whose quantity of single bit inverted charges $Q_{SW0}$ is small like below 15 μC/cm² exist slightly yet.

Respective quantities of single bit inverted charges $Q_{SW0}$ of a plurality of third monitors according to the present embodiment have the characteristics illustrated in FIG. 36C, and FIG. 37, and both of an in-plane distribution and a center value of a quantity of single bit inverted charges are improved in contrast to the characteristics of the second monitor. Also, in FIG. 36C, a quantity of single bit inverted charges $Q_{SW0}$ is 20 μC/cm² or more in all areas, and there exists only one area whose quantity of single bit inverted charges is below 25 μC/cm².

The causes for this may be considered such that, because the $IrO_x$ film of the upper electrode of the third monitor is made thinner than that of the second monitor, a larger amount of oxygen may be supplied to the boundary between the $IrO_x$ film and the ferroelectric film during the annealing after the $IrO_x$ film is formed and also, because a film thickness of the $IrO_y$ film is set to 125 nm that is thicker than that of the second monitor, a catalyst effect may be reduced.

Therefore, it is preferable that the first conductive oxide film of $IrO_x$ should be formed as thin as possible and the second conductive oxide film of $IrO_y$ should be formed as thick as possible. However, when the second conductive oxide film is formed excessively thick, conversely the deterioration is ready to occur. With the employment of such configuration of the upper electrode, a quantity of inverted charges $Q_{SW0}$ of a single bit monitor is reduced like the ordinary cell array, and also the process deterioration is seldom found.

Respective quantities of single bit inverted charges $Q_{SW0}$ of a plurality of fourth monitors of according to the present embodiment have the characteristics illustrated in FIG. 36D and FIG. 37, a center value of respective quantities of single bit inverted charges $Q_{SW0}$ on the wafer becomes substantially equal to that of the third monitor. However, when FIG. 36D illustrating the in-plane distribution of a quantity of single bit inverted charges is viewed, the fourth monitor whose quantity of inverted charges $Q_{SW0}$ is small, e.g., below 25 μC/cm² to 30 μC/cm², exists only one, and remaining fourth monitors have a large quantity of inverted charges of 30 μC/cm² or more but 45 μC/cm² or less.

In addition, as illustrated in FIG. 37, ±3σ is reduced rather than the third monitor. The fact that ±3σ is small denotes that a variation of a wafer in-plane distribution of a quantity of single bit inverted charges in the fourth monitor is improved rather than the third monitor.

From the above, according to the fourth monitor, deterioration of the capacitor characteristic of the overall wafer surface is suppressed further, and thus the single bit failure problem of the device may be decreased considerably and a yield and the retention characteristic may be improved greatly. Therefore, it is possible to say that the employment of the forming conditions of the fourth monitor and the structure is very effective method and structure in manufacturing the ferroelectric capacitor.

Meanwhile, a thickness of the $IrO_y$ film constituting the second conductive oxide film is set to 150 nm in the fourth monitor. When a thickness is increased further more, the abnormal growth is easily caused on the surface of the $IrO_y$ film. When the abnormal growth is caused on the surface of the $IrO_y$ film, the process-deterioration resistant capability is lowered.

As the method of improving this, there is the method of lowering slightly a degree of oxidation by changing a film forming power to 2 kW after the $IrO_y$ film of 150 nm thickness is formed by the sputter at a film forming power of 1 kW. According to this method, an upper limit of the film thickness of the second conductive oxide film of $IrO_y$ having the process-deterioration resistant capability is made further thicker. However, the etching becomes difficult when the upper electrode is too thick, and therefore an upper limit of the film thickness should be set to about 200 nm, preferably 180 nm.

According to the above results, it is desirable that a thickness of the second conductive oxide film 58 formed over the silicon substrate 30 being held by the electrostatic chuck should be set to 50 nm to 200 nm, preferably 100 nm to 180 nm, and it may be considered that the more suitable condition is 125 nm to 150 nm.

The capacitor upper electrode 60 formed under the same conditions as those of the second to fourth upper electrodes, particularly the same conditions as those of the third and fourth upper electrodes, may suppress greatly the deterioration in respective steps after the formation rather than the prior art. Also, a yield of the device and the retention characteristic may be improved greatly.

Next, metallographs of the images in which surfaces of the $IrO_y$ films as the second conductive oxide films 58 whose film thickness is different respectively were observed by a metallographic microscope are illustrated in FIGS. 38(*a*) to 38(*d*). Respective film thicknesses are 125 nm, 150 nm, 160 nm, 210 nm.

FIGS. 38(*a*) and 38(*b*) illustrate the surface of the $IrO_y$ film whose thickness is 125 nm and 150 nm respectively, wherein the abnormality is not particularly observed. Also, FIG. 38(*c*) illustrates the surface of the $IrO_y$ film whose thickness is 160 nm, wherein the abnormality is slightly observed. FIG. 38(*d*) illustrates the surface of the $IrO_y$ film whose thickness is 210 nm, wherein the abnormal oxidation is caused.

From the above experimental results, it is understood that an approach of choosing 125 nm to 150 nm as a film thickness of the conductive noble metal oxide film is effective in obtaining the second conductive oxide film 58 that is satisfactorily crystallized.

The embodiments explained above are mentioned merely as typical examples. It is obvious for those skilled in the art that variations and modifications can be applied by combining the constituent elements of respective embodiments. It is obvious for those skilled in the art that various variations can be applied to the above embodiments without departing from the principle of the present invention and a scope of the invention set forth in claims.

What is claimed is:

1. A semiconductor device, comprising:
a semiconductor substrate; and
a ferroelectric capacitor including a lower electrode, a ferroelectric film formed on the lower electrode, and an upper electrode formed on the ferroelectric film, over the semiconductor substrate,
wherein the upper electrode includes
a first layer formed of a first oxide expressed by a chemical formula $AO_{x1}$ (A: metal element, O: oxygen) using a stoichiometric composition parameter x1 and expressed by a chemical formula $AO_{x2}$ using an actual composition parameter x2,
a second layer formed of a second oxide having a thickness of 125 nm to 150 nm, formed on the first layer, expressed by a chemical formula $BO_{y1}$ (B: metal element, O: oxygen) using a stoichiometric composition parameter y1 and expressed by a chemical formula $BO_{y2}$ using an actual composition parameter y2, in which a ratio of oxidation is set higher than the first layer, and
a third layer formed on the second layer and formed of one of noble metal, alloy including noble metal, and oxide of one of noble metal and alloy including noble metal,
wherein a relation y2/y1>x2/x1 is satisfied between the composition parameters x1, x2, y1, y2, and a thickness of the first layer is thinner than a thickness of the second layer.

2. The semiconductor device according to claim 1, wherein the metal element A of the first layer is formed of a same metal element as the metal element B of the second layer.

3. The semiconductor device according to claim 1, wherein the metal element A of the first layer is different from the metal element B of the second layer.

4. The semiconductor device according to claim 1, wherein a metal element of the first layer is identical to a metal element of the third layer.

5. The semiconductor device according to claim 1, wherein the ferroelectric capacitor is covered with a multilayer interconnection structure formed over the semiconductor substrate, and the second layer is connected via a contact hole with an interconnection pattern in the multilayer interconnection structure.

* * * * *